United States Patent
Chen et al.

(10) Patent No.: US 11,145,746 B2
(45) Date of Patent: Oct. 12, 2021

(54) SEMICONDUCTOR DEVICE AND METHOD

(71) Applicant: Taiwan Semiconductor Manufacturing Co., Ltd., Hsinchu (TW)

(72) Inventors: Wen-Ju Chen, Hsinchu (TW); Chung-Ting Ko, Kaohsiung (TW); Chi On Chui, Hsinchu (TW)

(73) Assignee: Taiwan Semiconductor Manufacturing Co.y, Ltd., Hsinchu (TW)

( * ) Notice: Subject to any disclaimer, the term of this patent is extended or adjusted under 35 U.S.C. 154(b) by 0 days.

(21) Appl. No.: 16/906,546

(22) Filed: Jun. 19, 2020

(65) Prior Publication Data

US 2021/0265489 A1     Aug. 26, 2021

Related U.S. Application Data

(60) Provisional application No. 62/981,770, filed on Feb. 26, 2020.

(51) Int. Cl.

| | |
|---|---|
| *H01L 21/02* | (2006.01) |
| *H01L 21/28* | (2006.01) |
| *H01L 21/764* | (2006.01) |
| *H01L 29/06* | (2006.01) |
| *H01L 29/423* | (2006.01) |
| *H01L 29/49* | (2006.01) |
| *H01L 29/66* | (2006.01) |
| *H01L 29/786* | (2006.01) |

(52) U.S. Cl.
CPC .. *H01L 29/66742* (2013.01); *H01L 21/02532* (2013.01); *H01L 21/02603* (2013.01); *H01L 21/28088* (2013.01); *H01L 21/764* (2013.01); *H01L 29/0649* (2013.01); *H01L 29/0673* (2013.01); *H01L 29/42392* (2013.01); *H01L 29/4908* (2013.01); *H01L 29/4966* (2013.01); *H01L 29/78696* (2013.01)

(58) Field of Classification Search
CPC .......... H01L 29/66742; H01L 29/0649; H01L 29/0673; H01L 29/42392; H01L 29/4908; H01L 29/4966; H01L 29/78696; H01L 21/02532; H01L 21/28088; H01L 21/764
USPC ....................................................... 438/151
See application file for complete search history.

(56) References Cited

U.S. PATENT DOCUMENTS

| | | | |
|---|---|---|---|
| 9,209,247 B2 | 12/2015 | Colinge et al. | |
| 9,224,833 B2 | 12/2015 | Chen et al. | |
| 9,251,888 B1 | 2/2016 | Liaw | |
| 2015/0048442 A1 | 2/2015 | Colinge et al. | |
| 2015/0303270 A1 | 10/2015 | Liaw | |
| 2019/0371903 A1* | 12/2019 | Bao | H01L 21/02603 |

\* cited by examiner

*Primary Examiner* — Tong-Ho Kim
(74) *Attorney, Agent, or Firm* — Slater Matsil LLP

(57) ABSTRACT

A method of manufacturing a semiconductor device includes forming a first semiconductor layer over a substrate, forming a second semiconductor layer over the first semiconductor layer, and forming a sacrificial film over the first semiconductor layer and the second semiconductor layer. The sacrificial film fills an area between the first semiconductor layer and the second semiconductor layer. The method further includes forming a space in the sacrificial film between the first semiconductor layer and the second semiconductor layer and removing the sacrificial film.

20 Claims, 50 Drawing Sheets

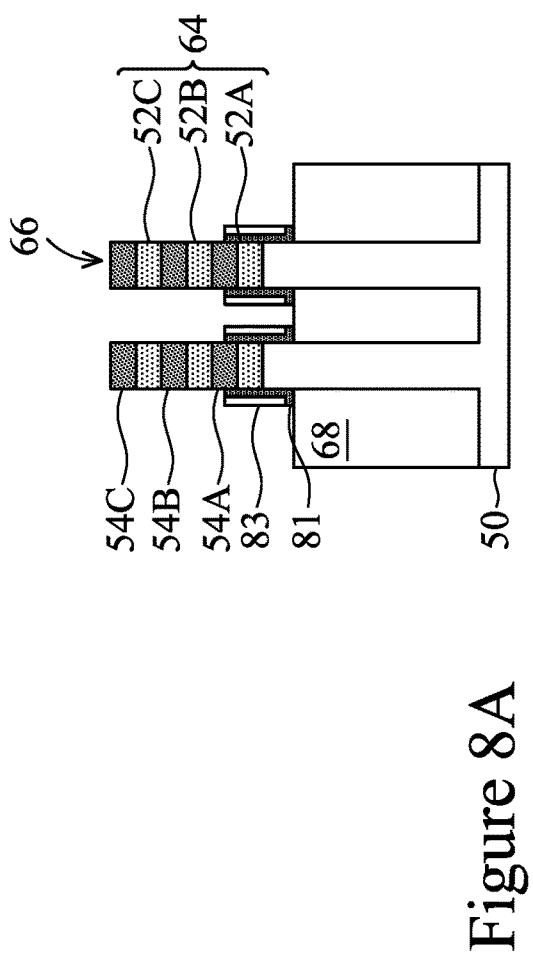
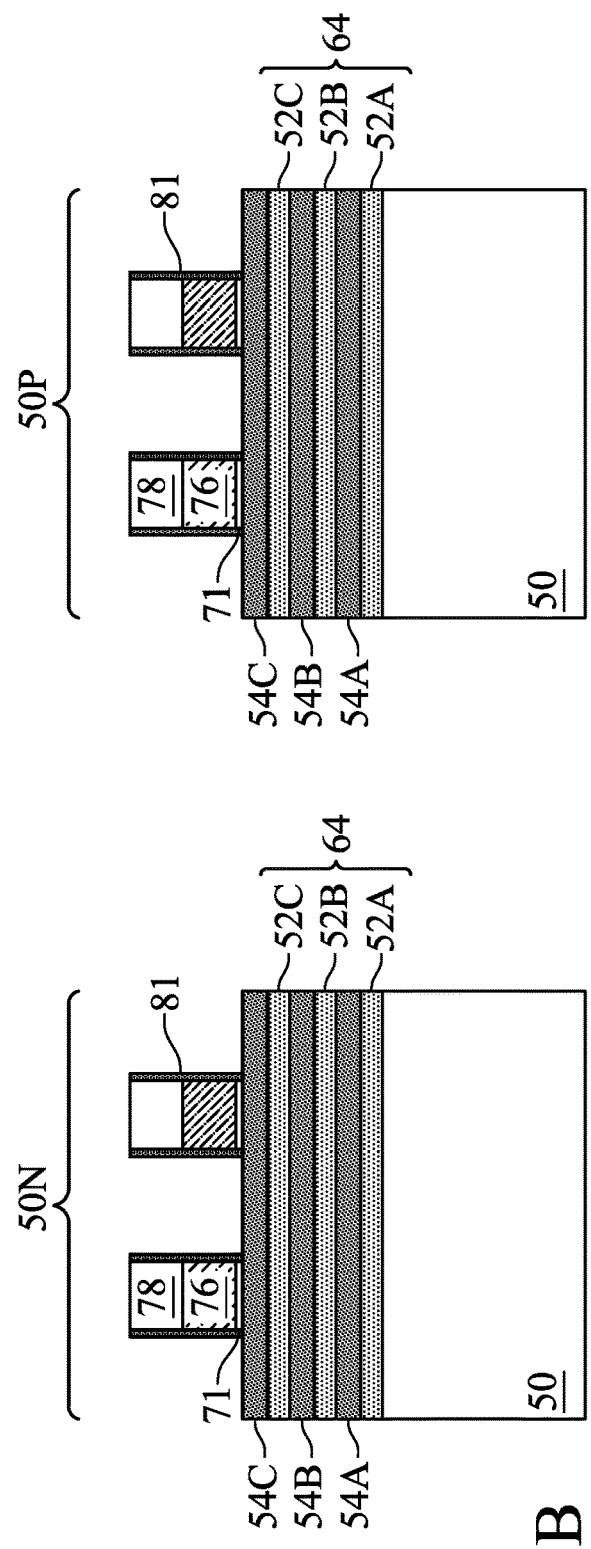
Figure 8A
Figure 8B

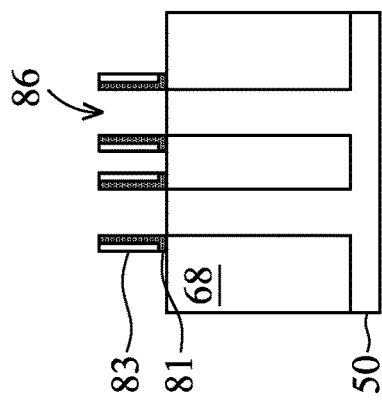
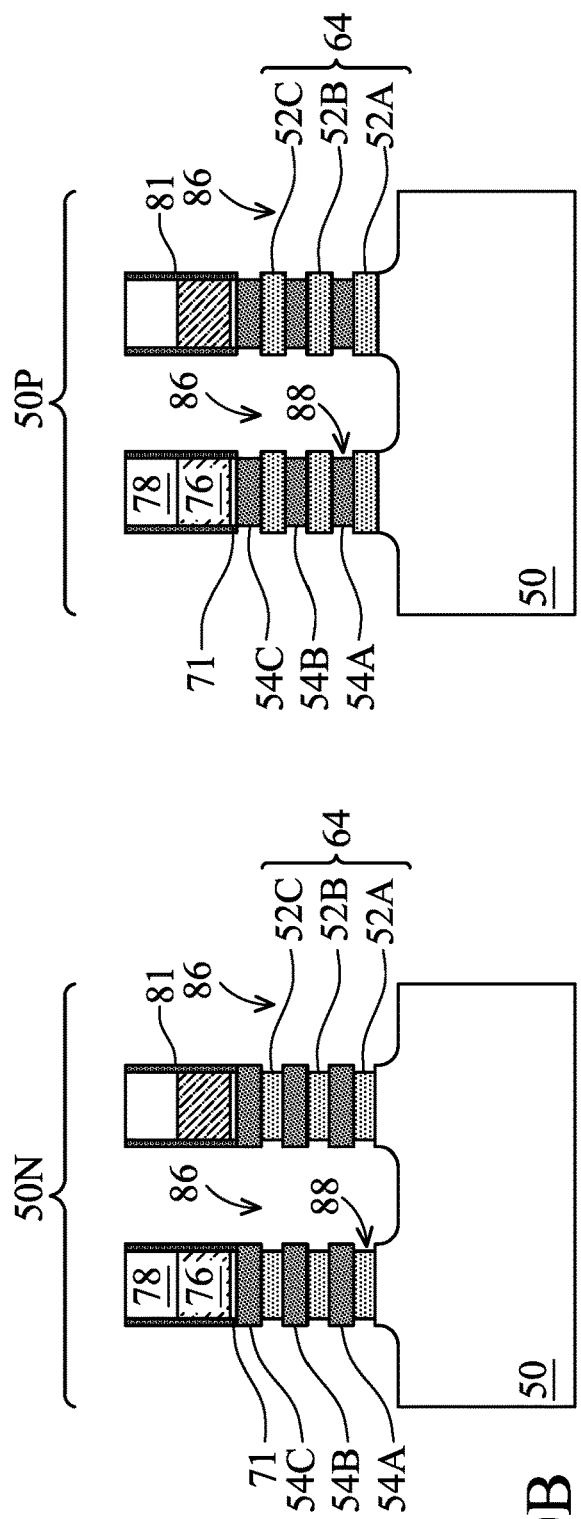
Figure 10A
Figure 10B

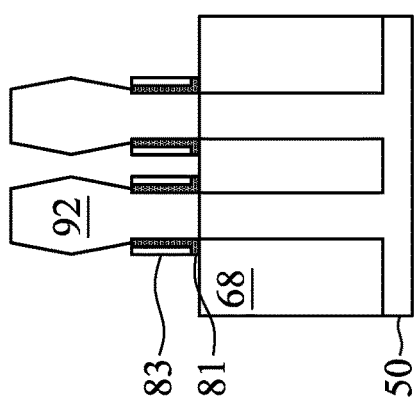
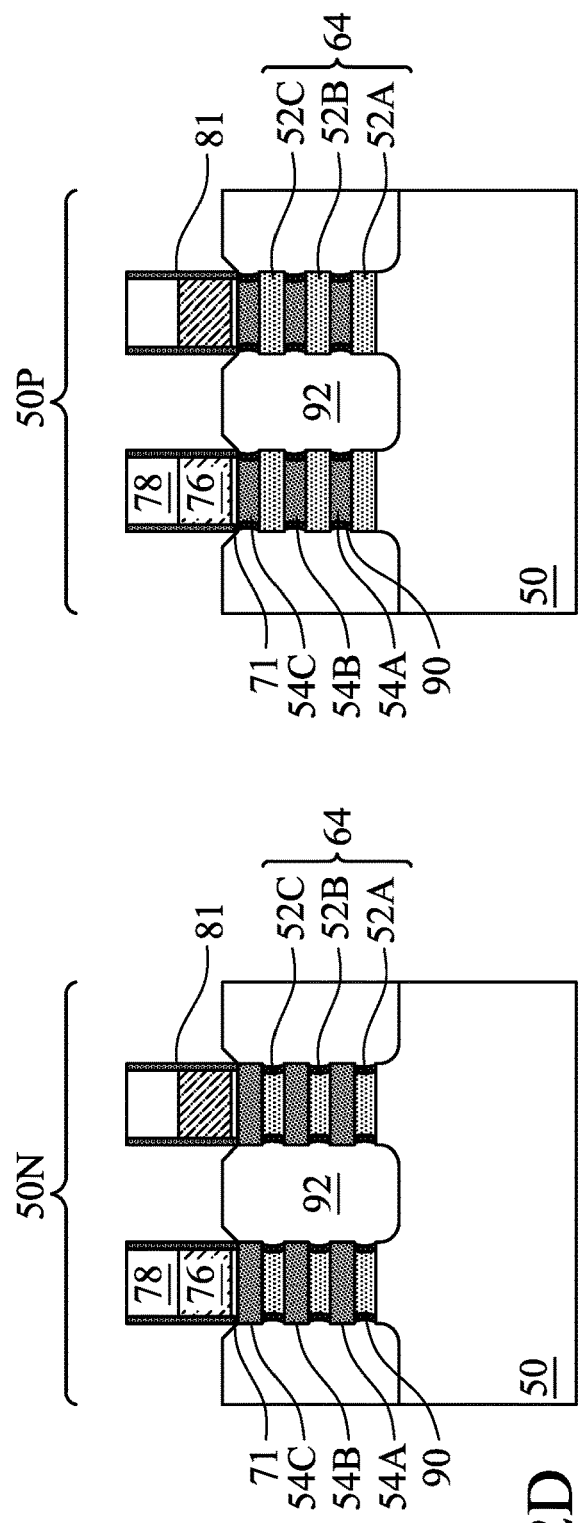
Figure 12C
Figure 12D

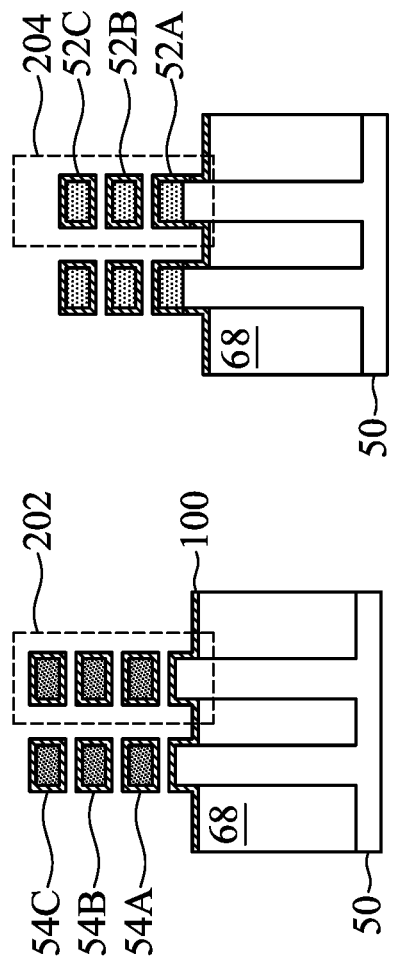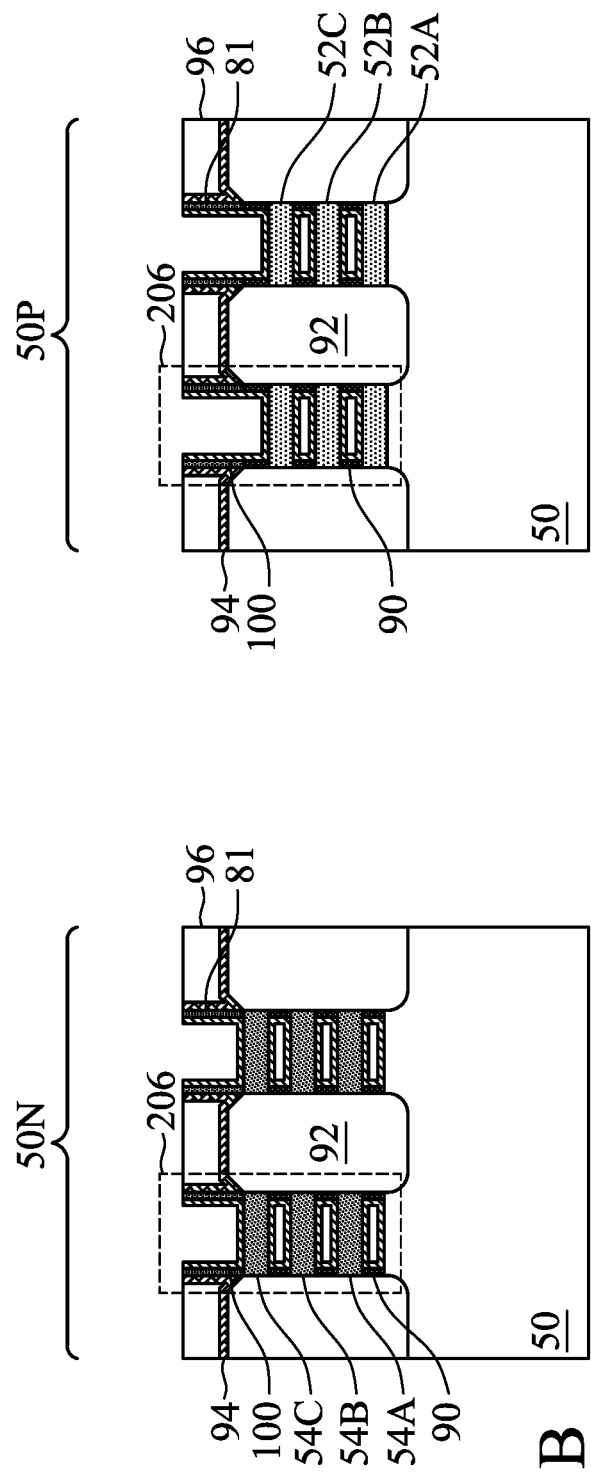
Figure 17A
Figure 17B

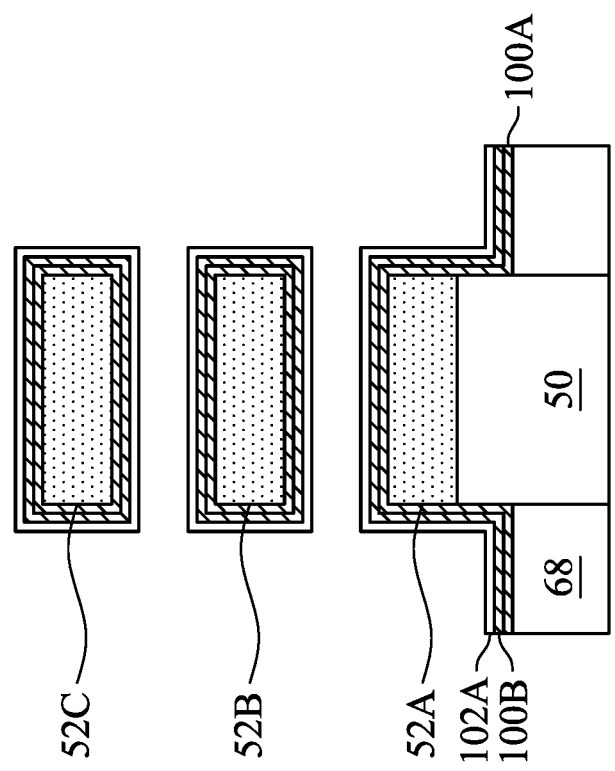
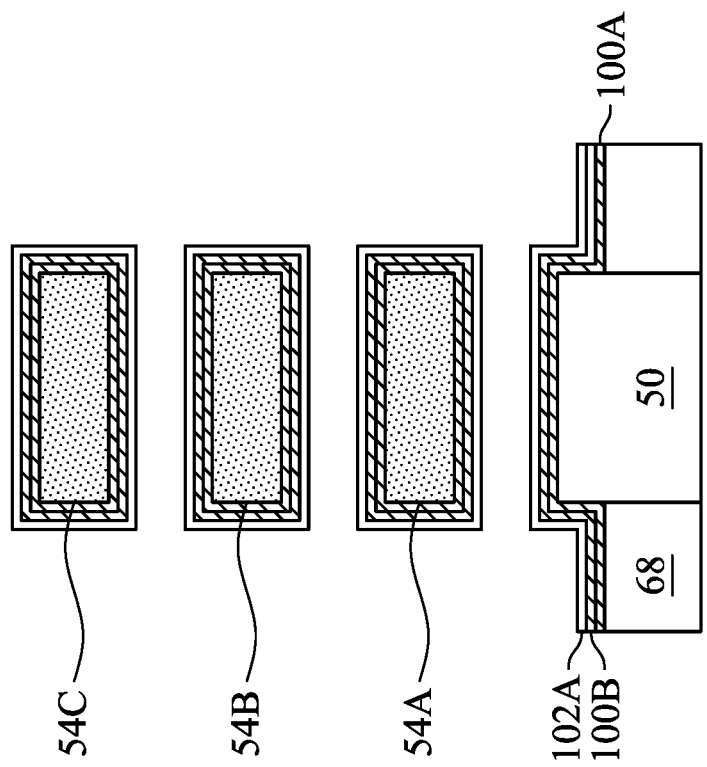
Figure 18A

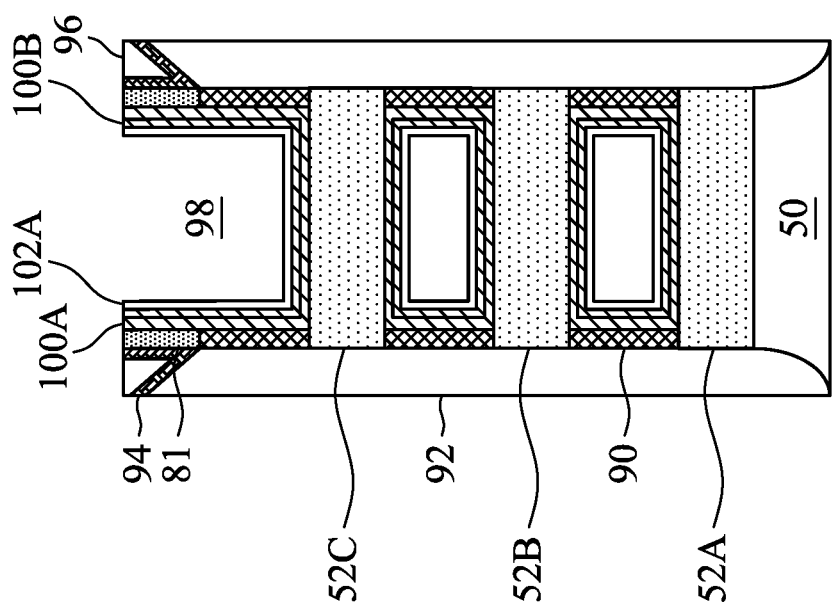
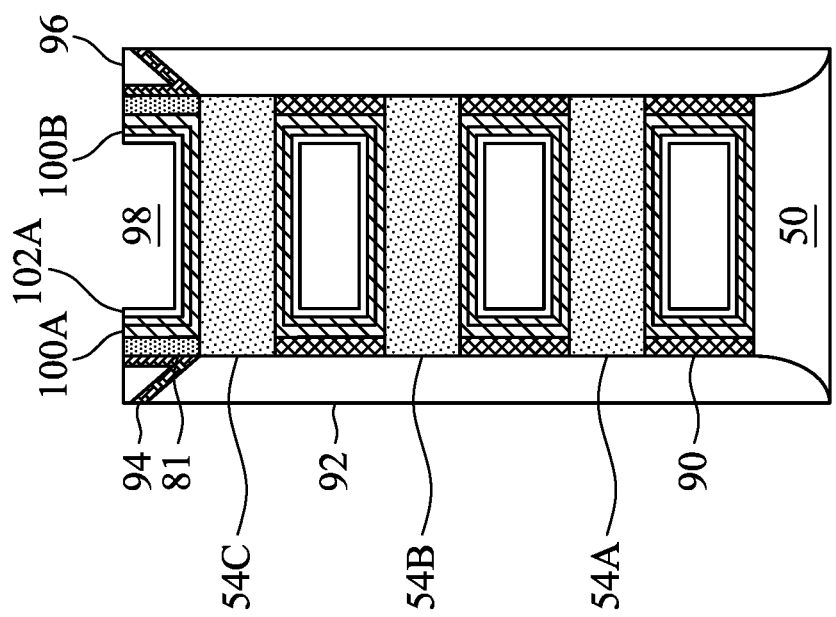
Figure 18B

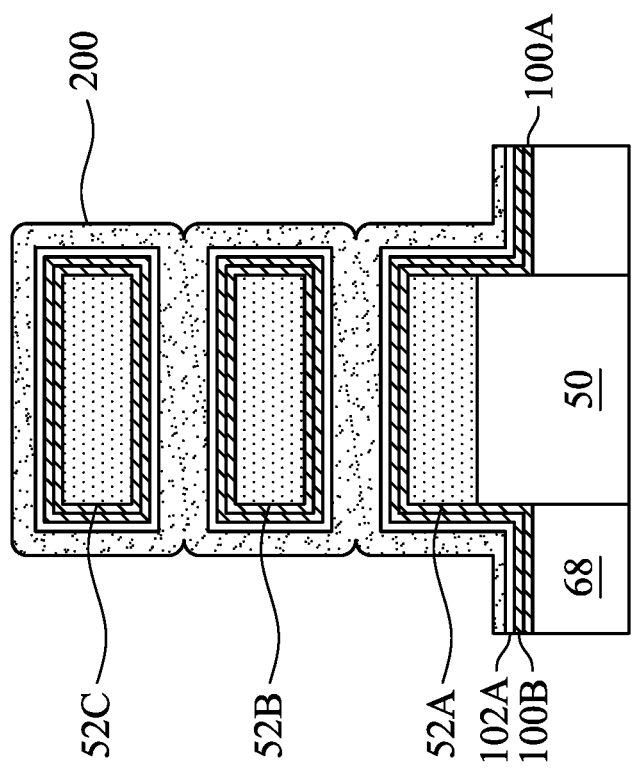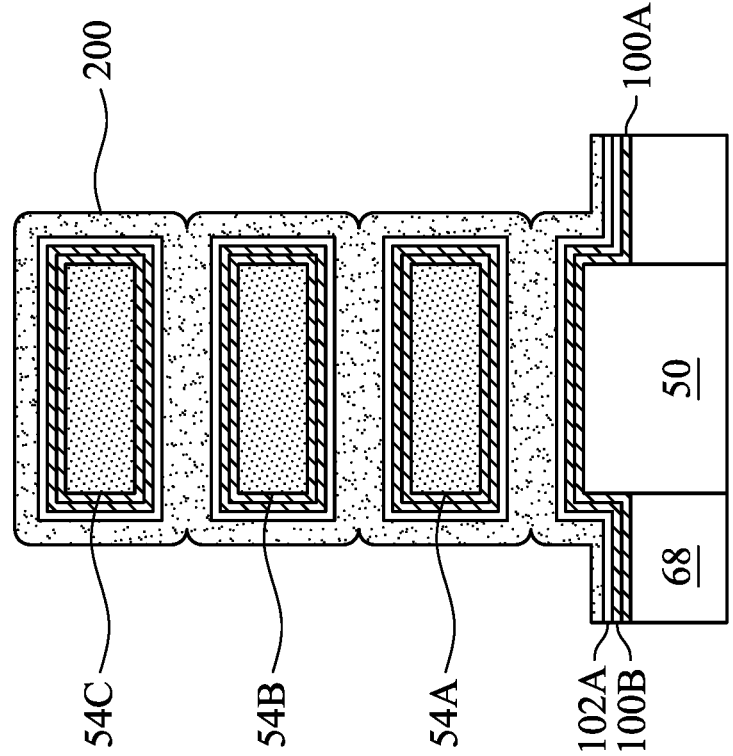
Figure 19A

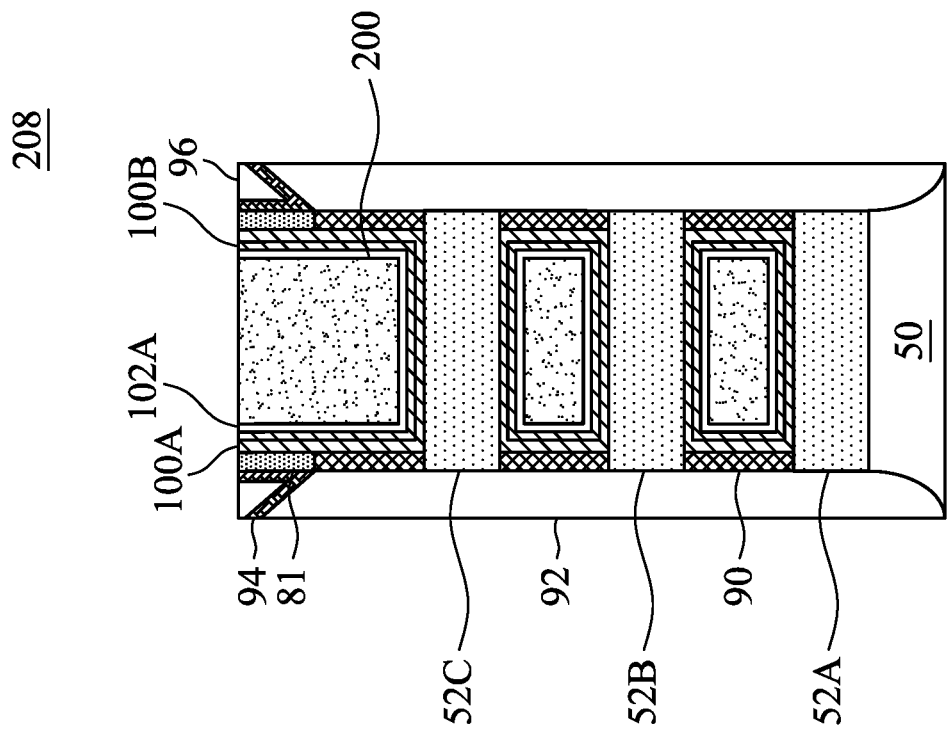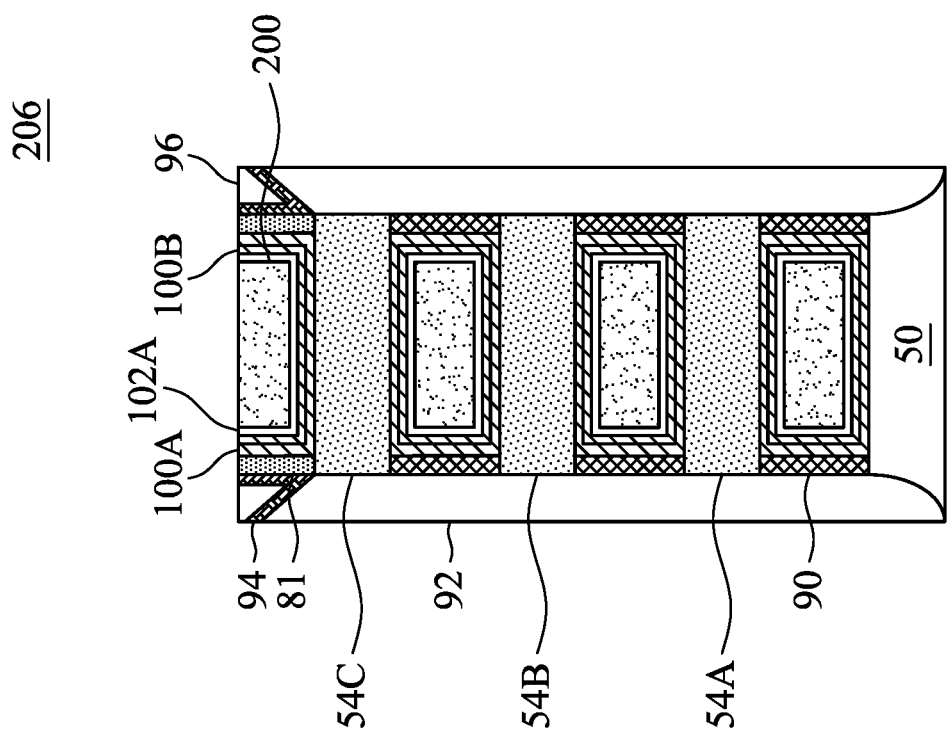
Figure 19B

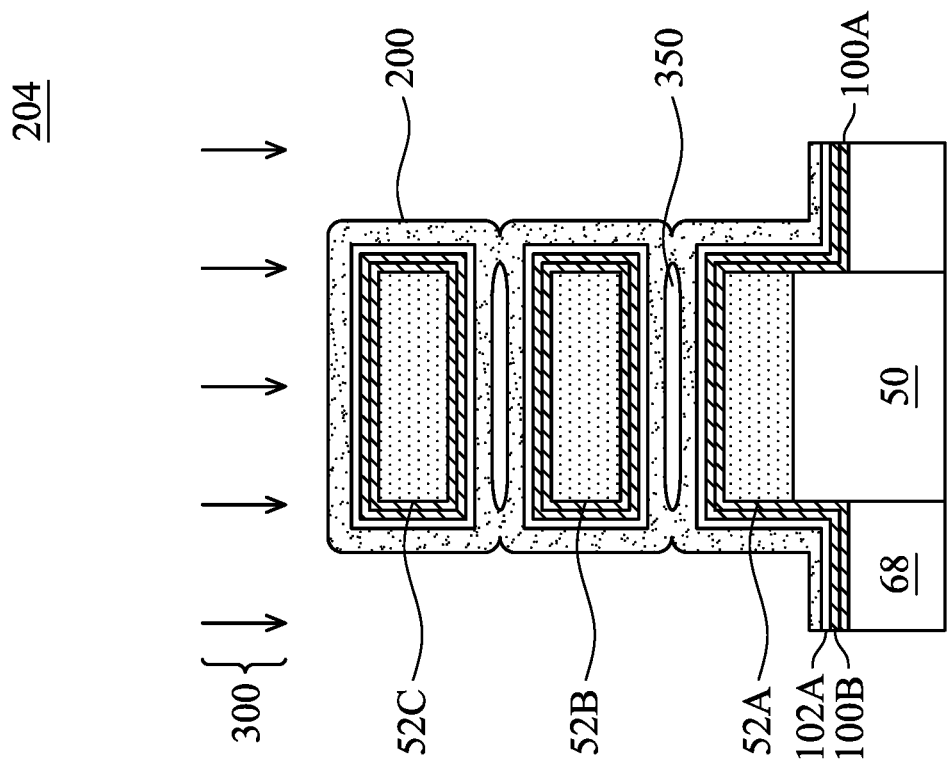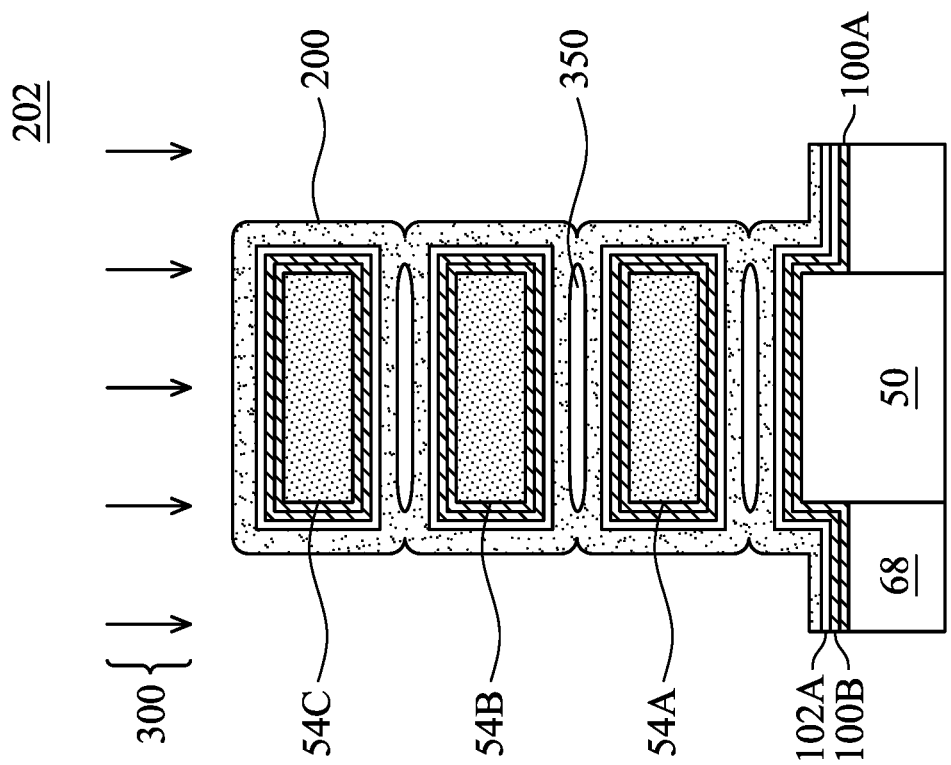
Figure 20A

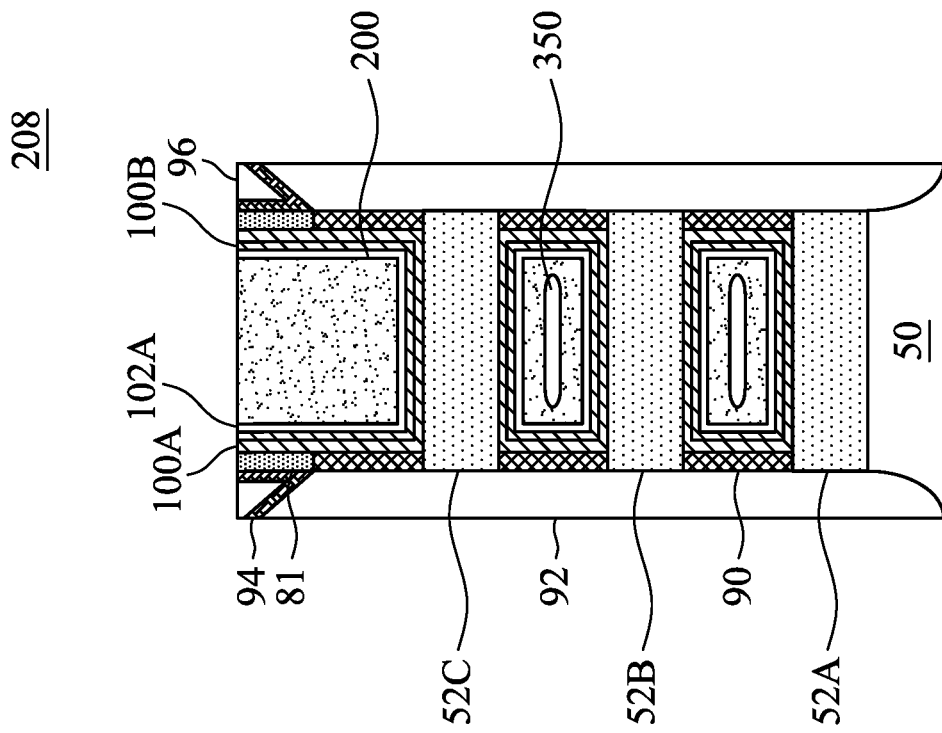
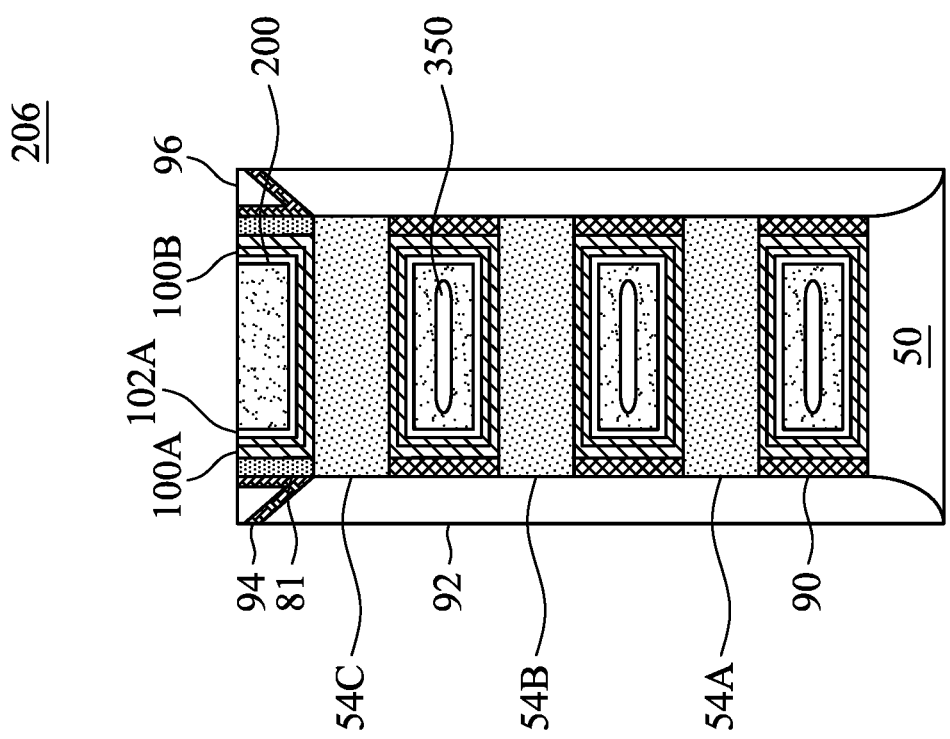
Figure 20B

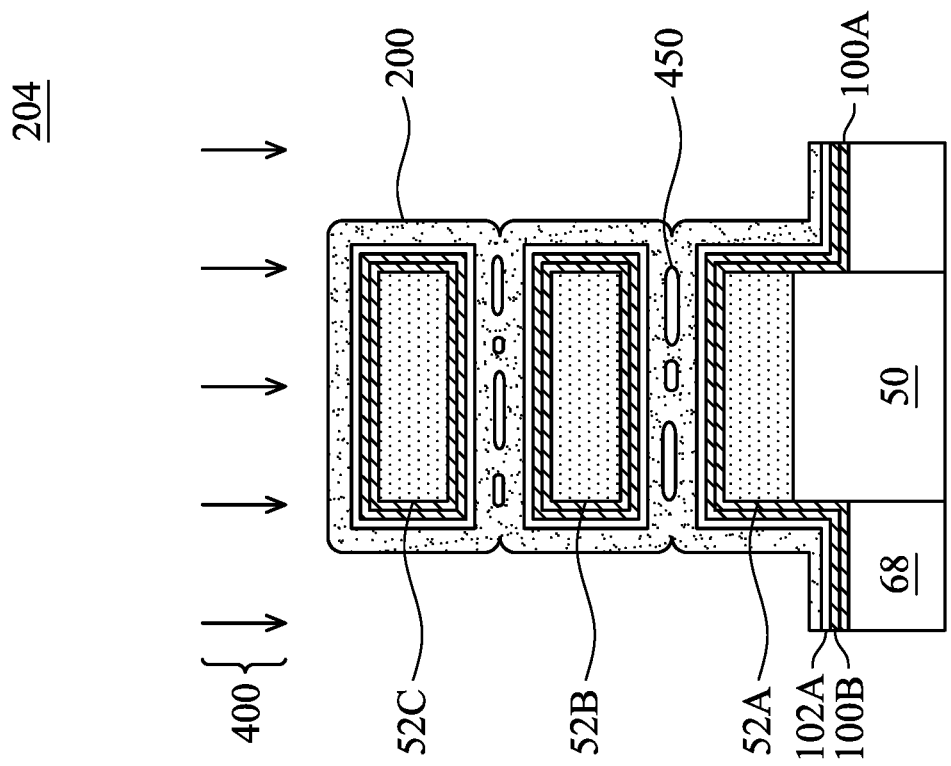
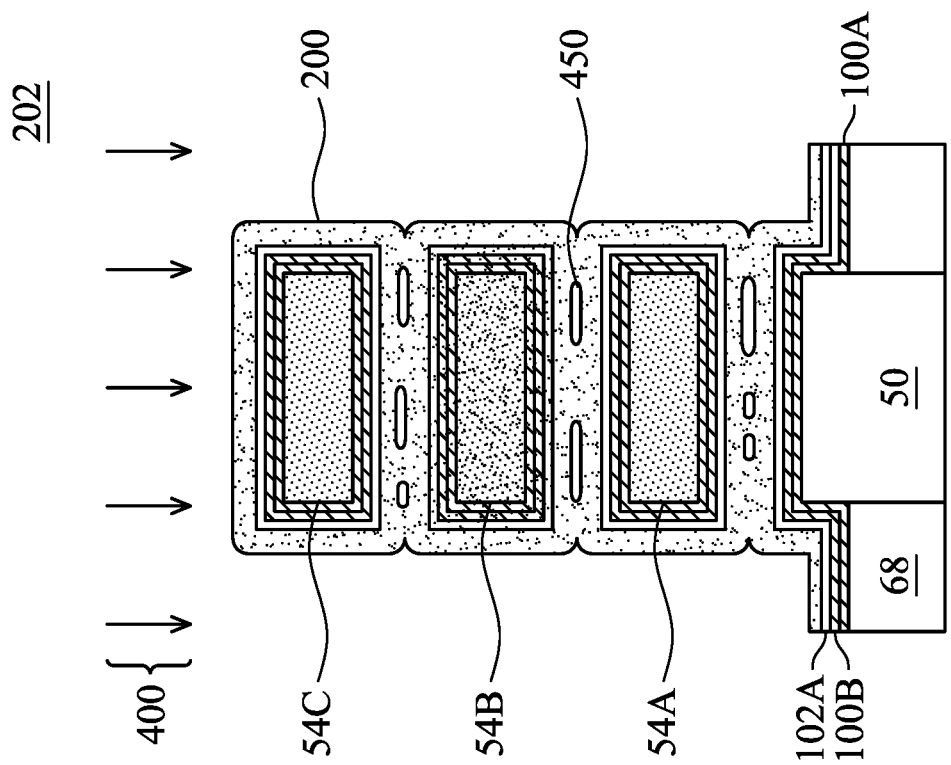
Figure 20C

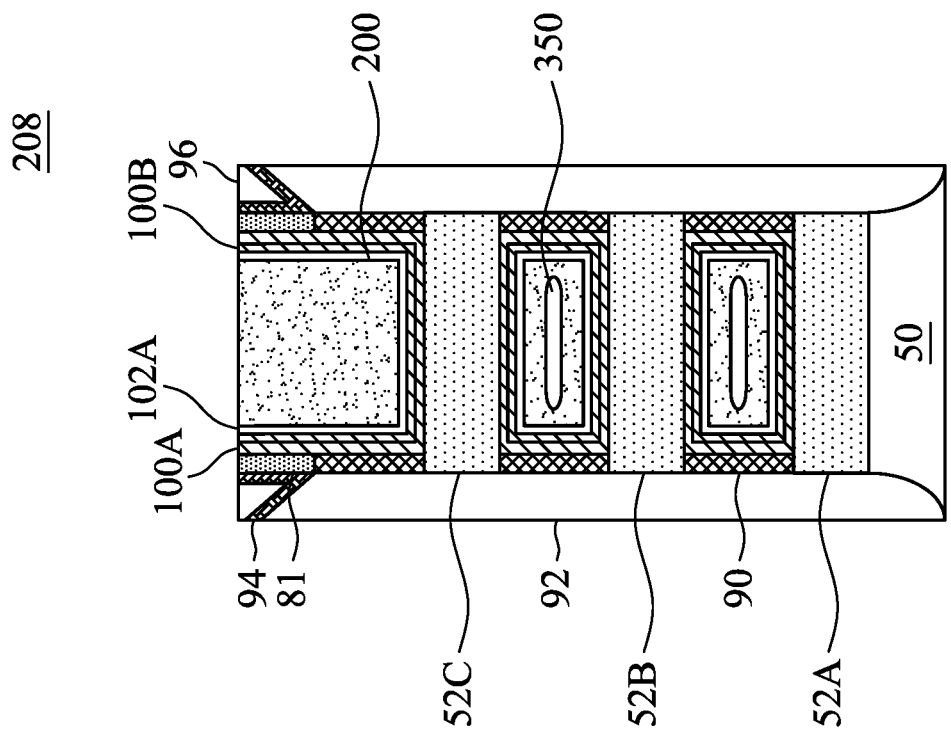
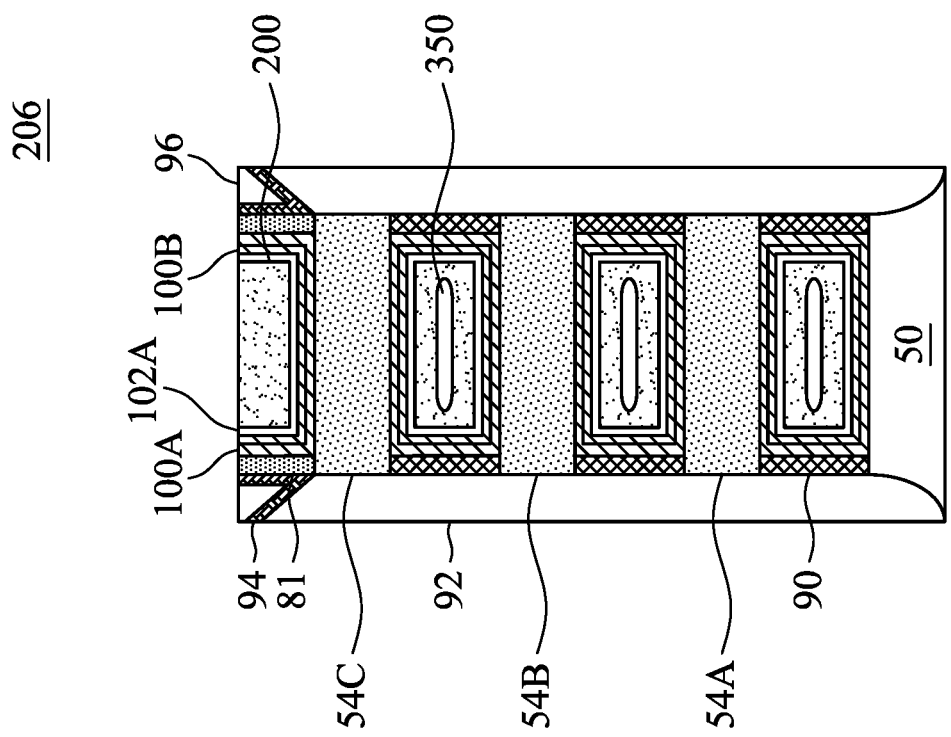
Figure 21B

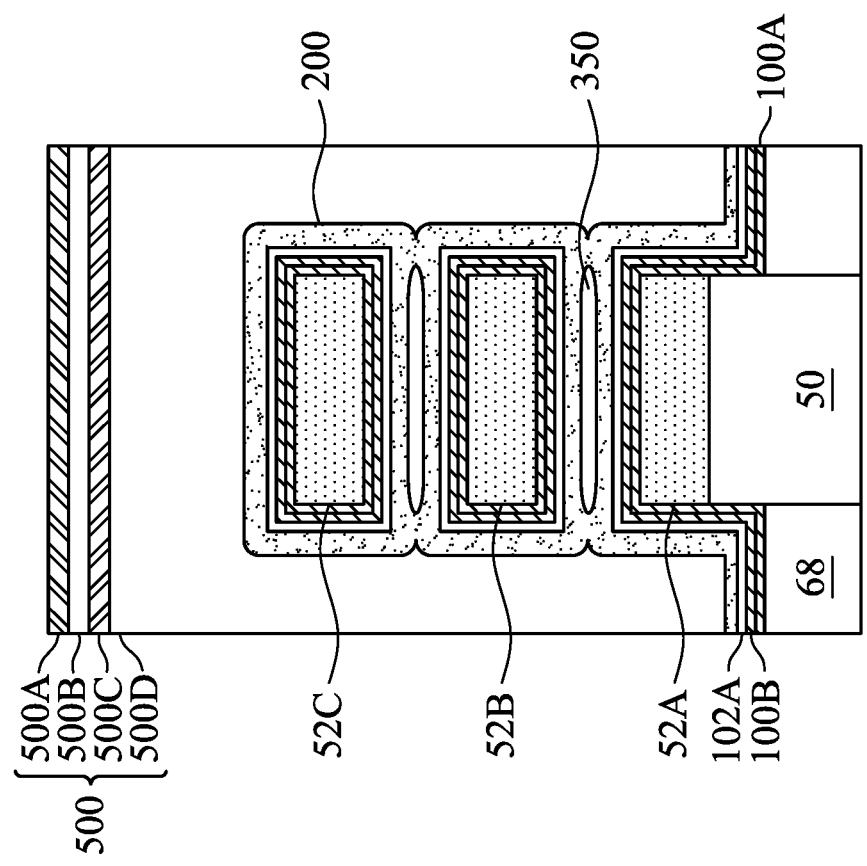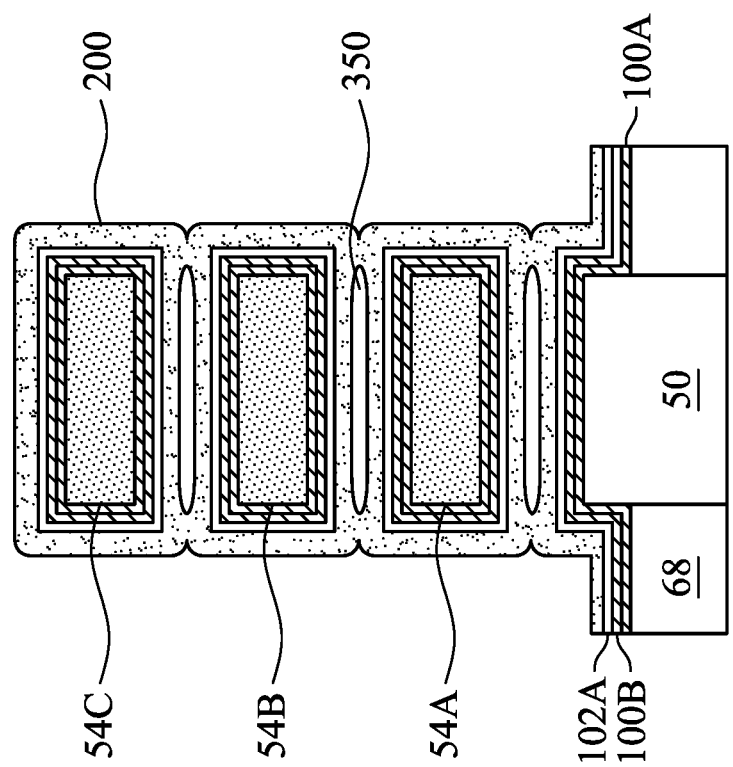
Figure 22A

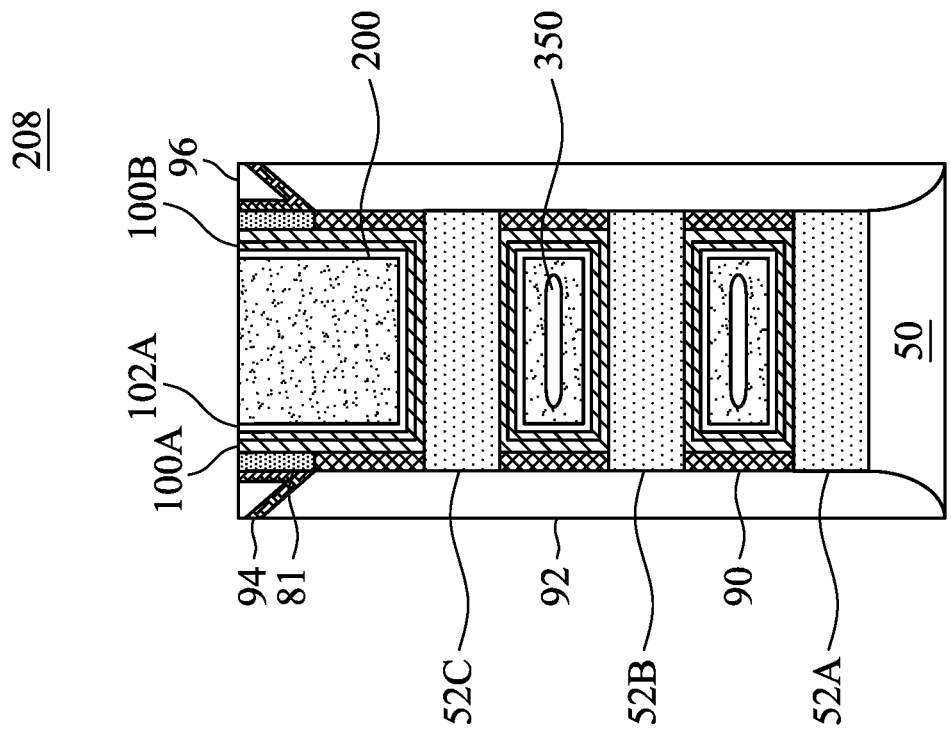
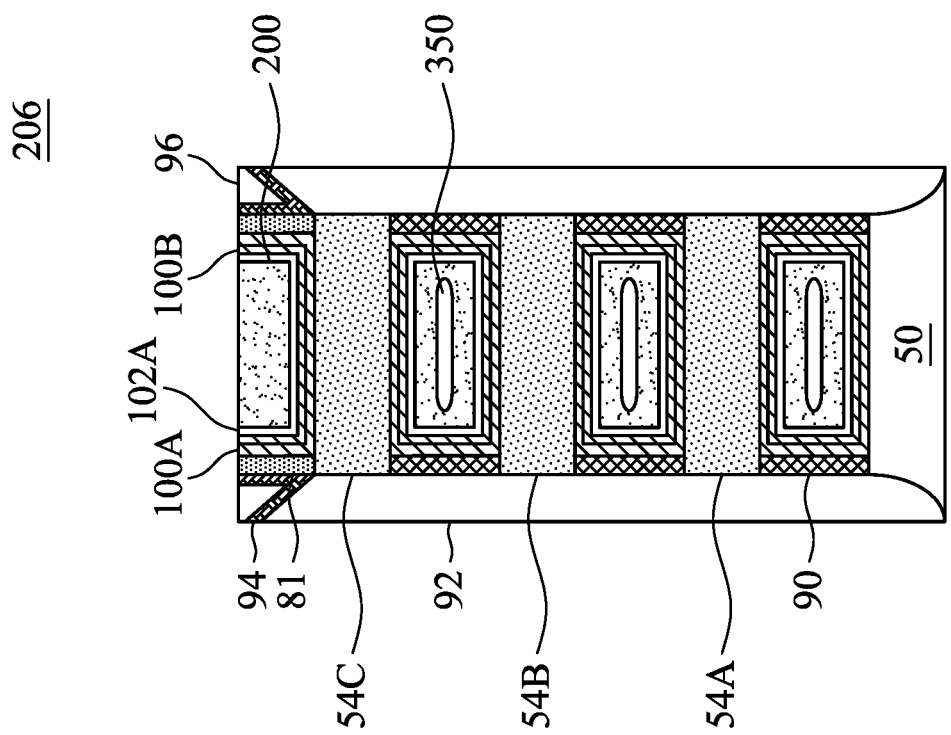
Figure 22B

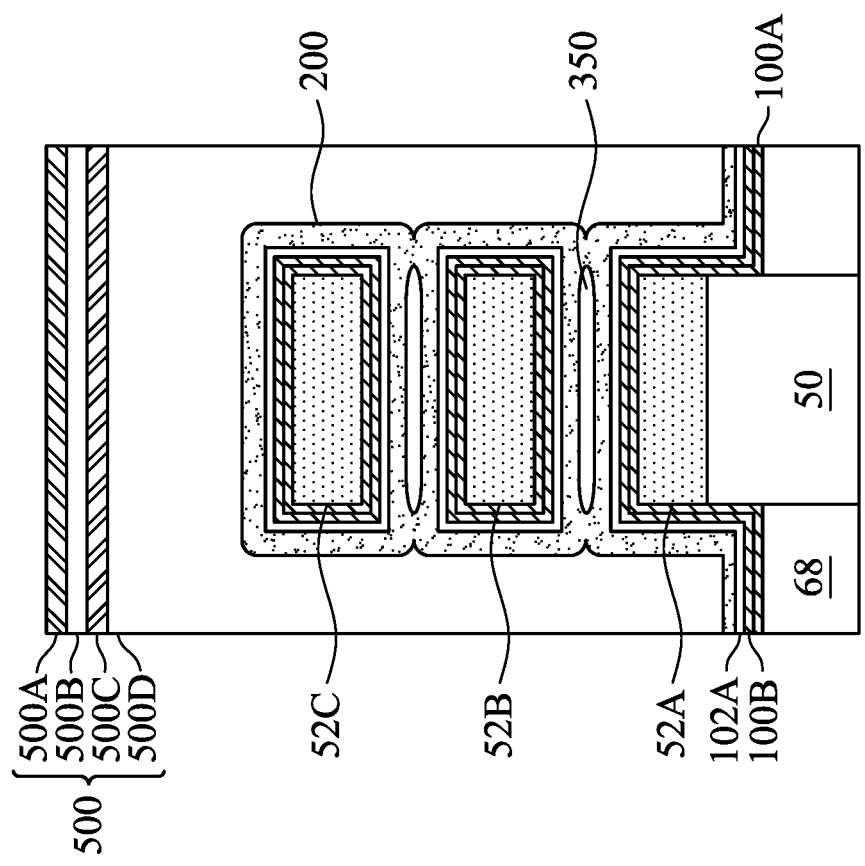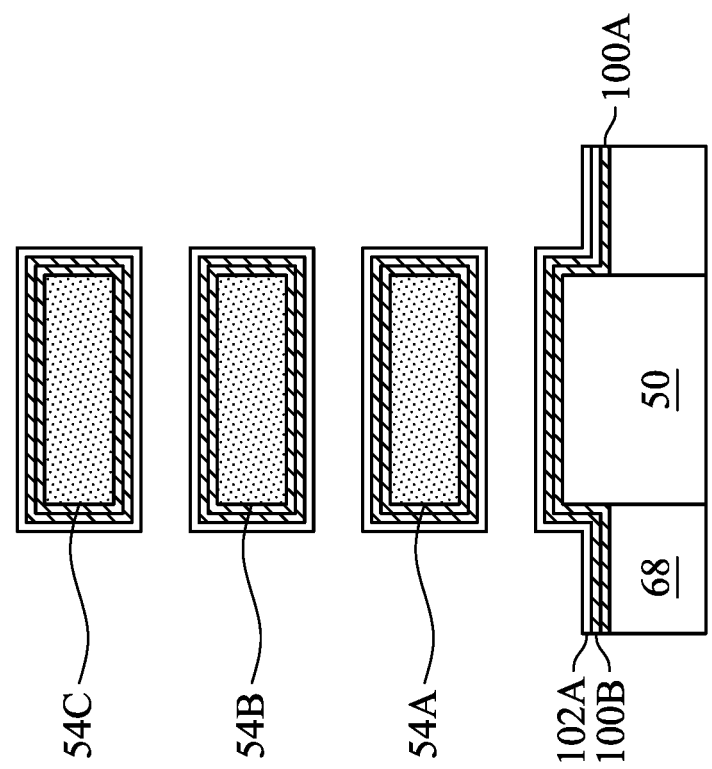
Figure 23A

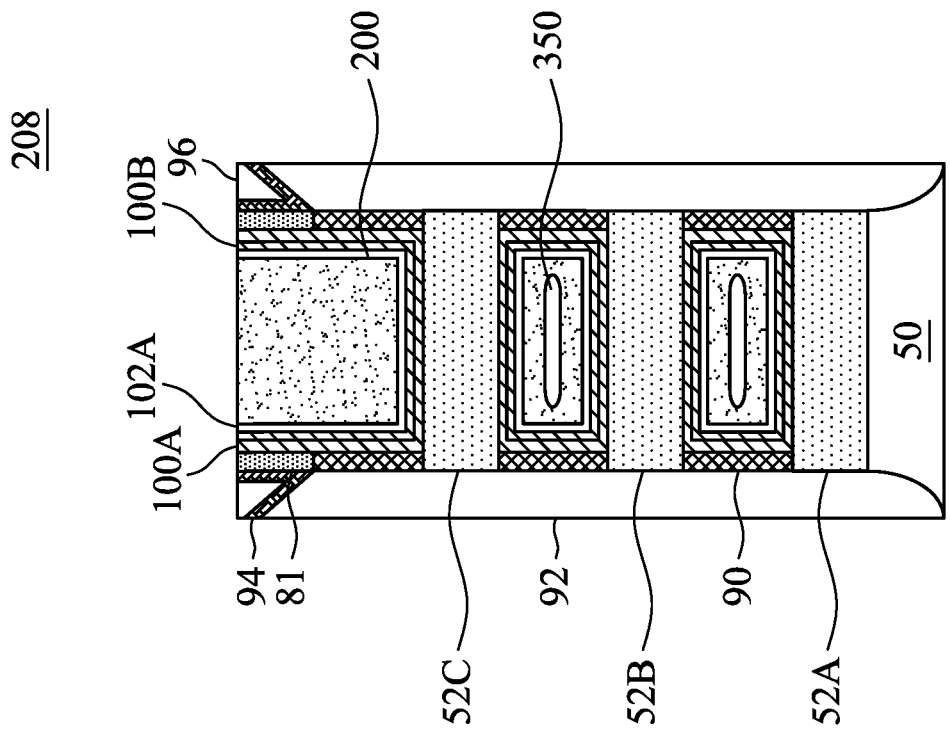
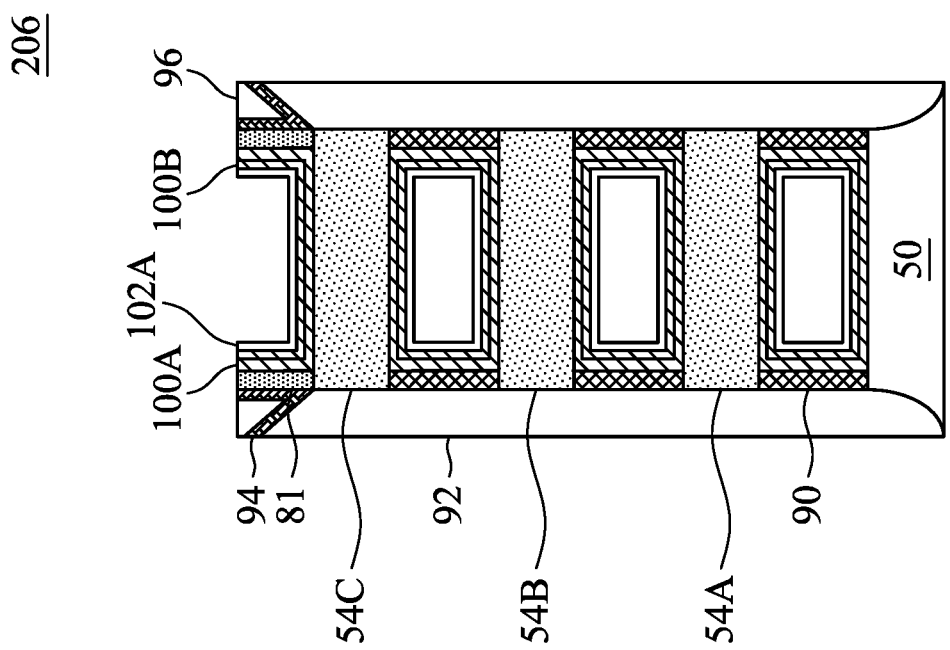
Figure 23B

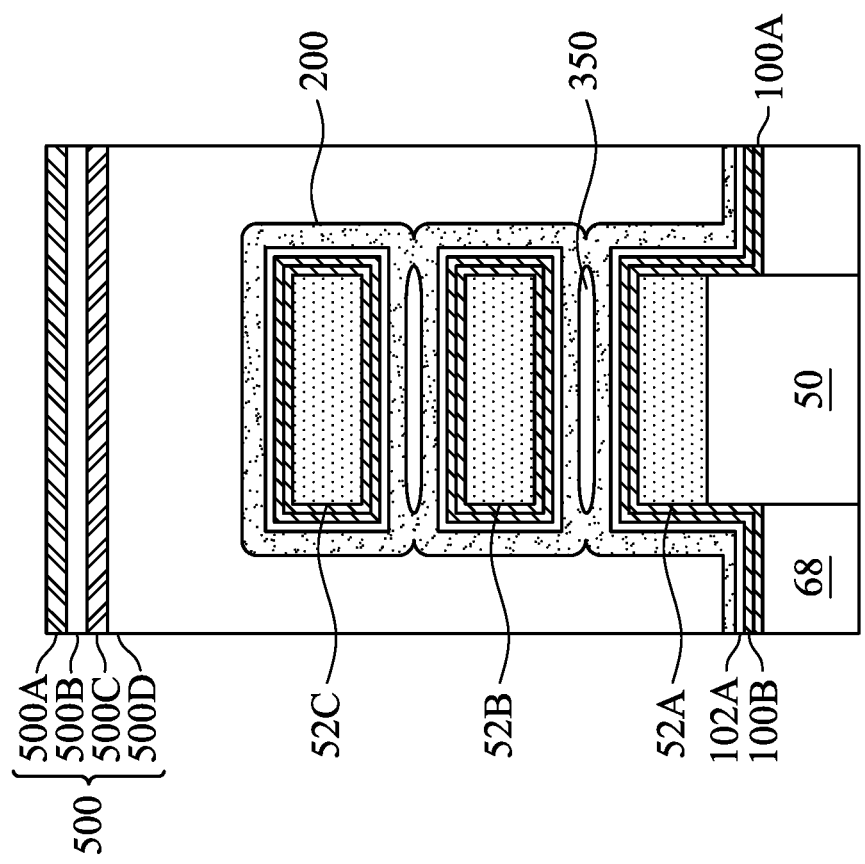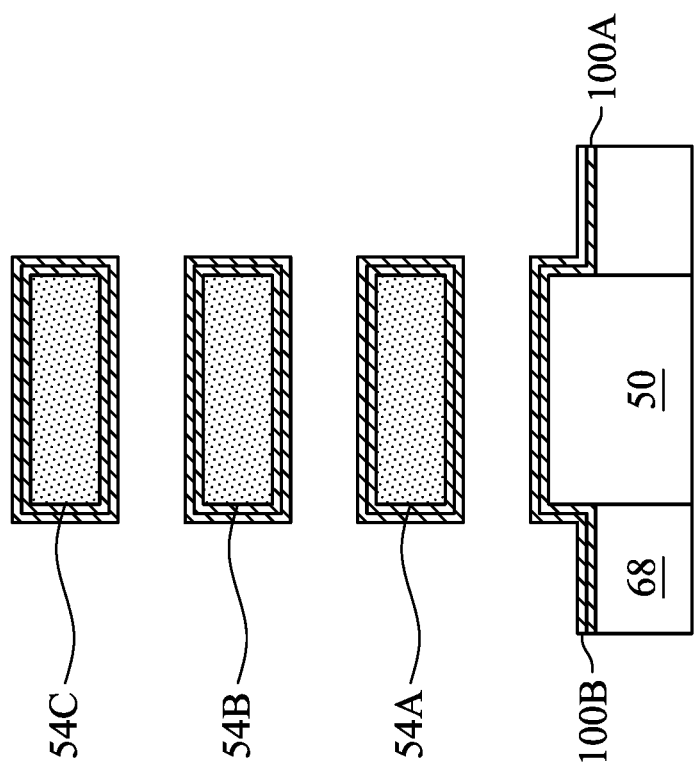
Figure 24A

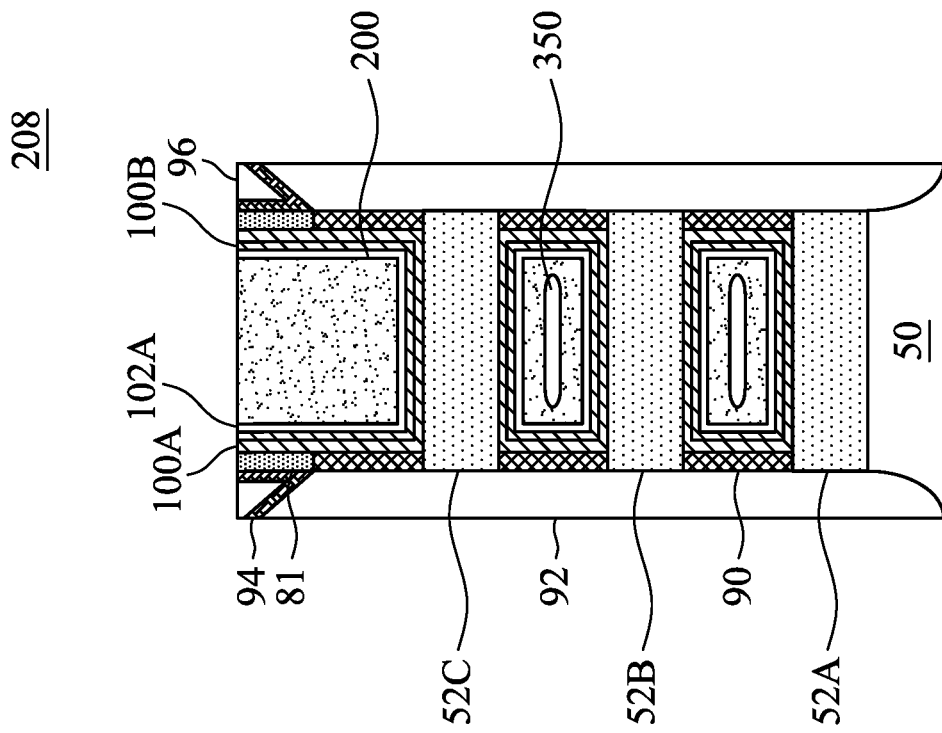
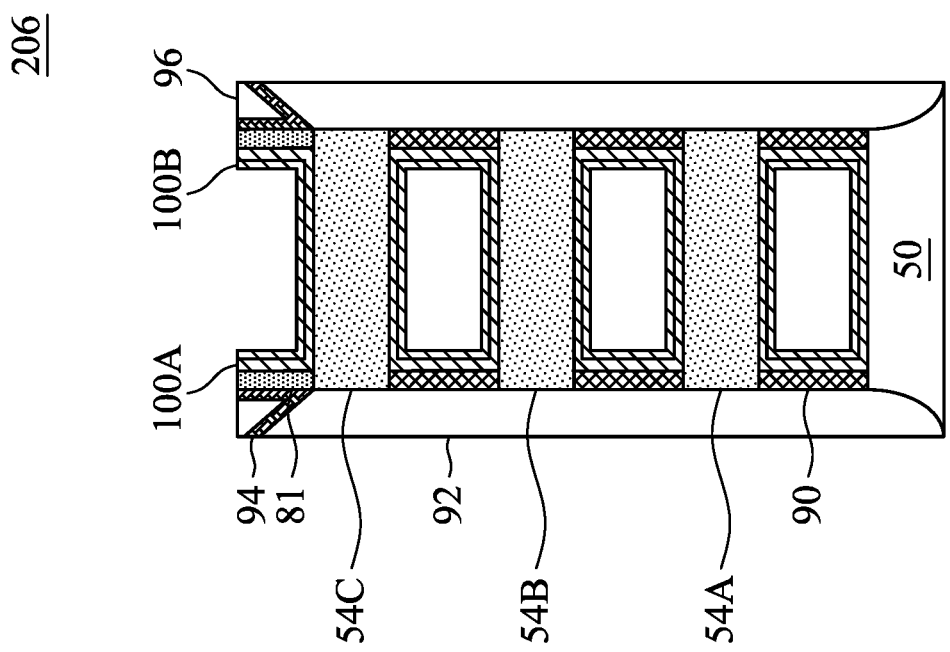
Figure 24B

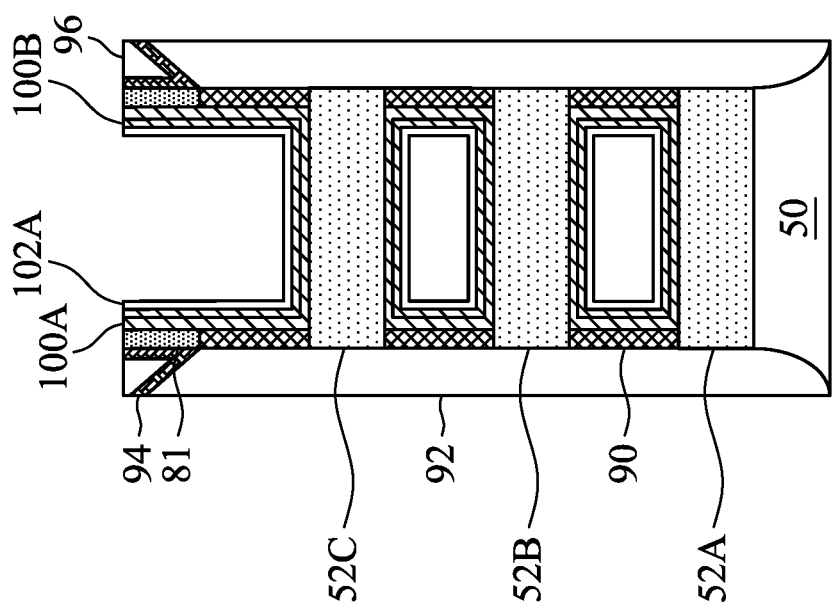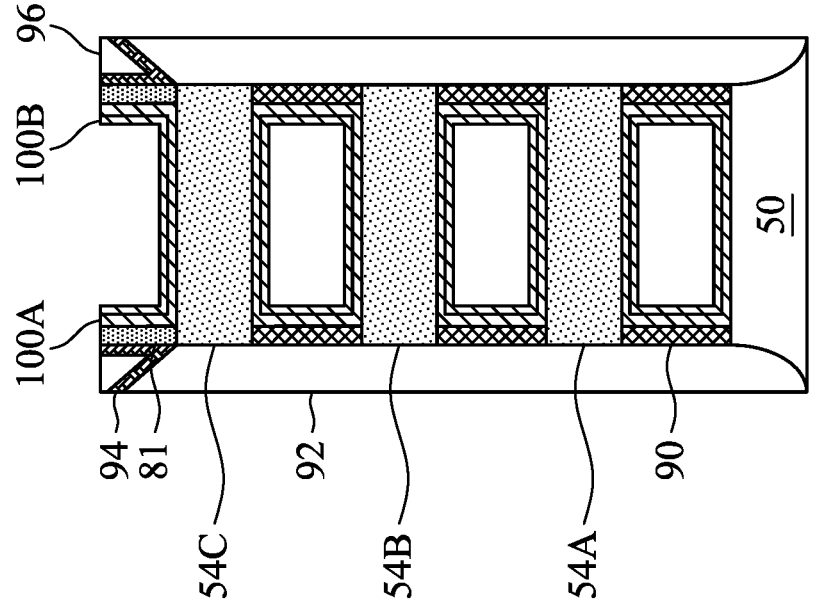
Figure 25B

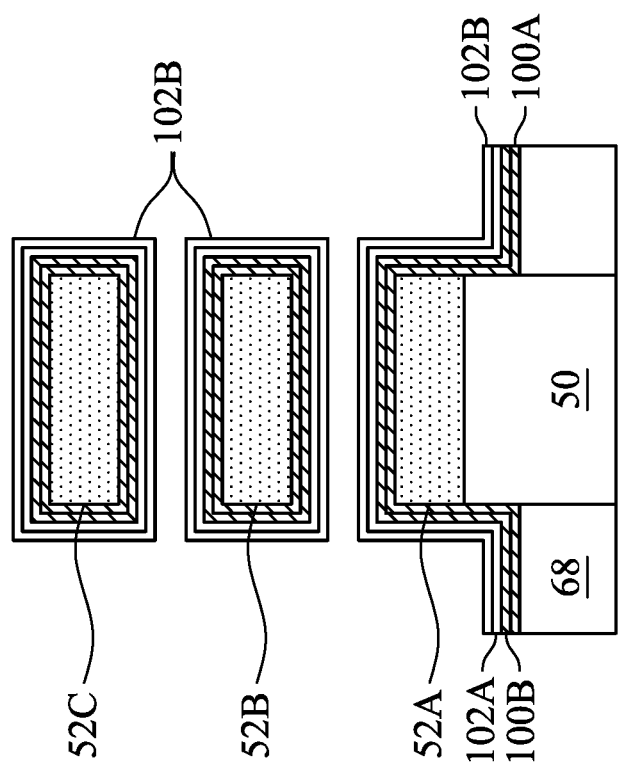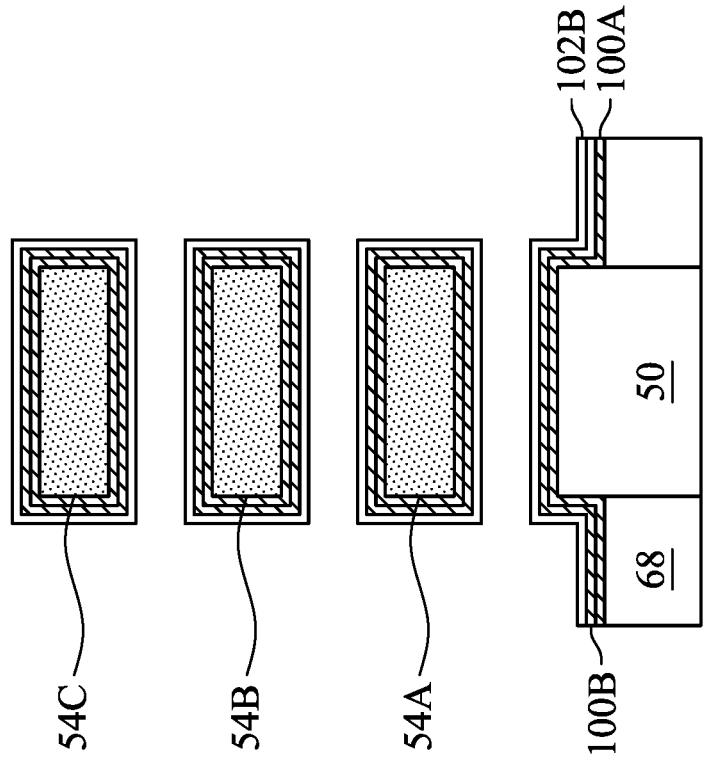
Figure 26A

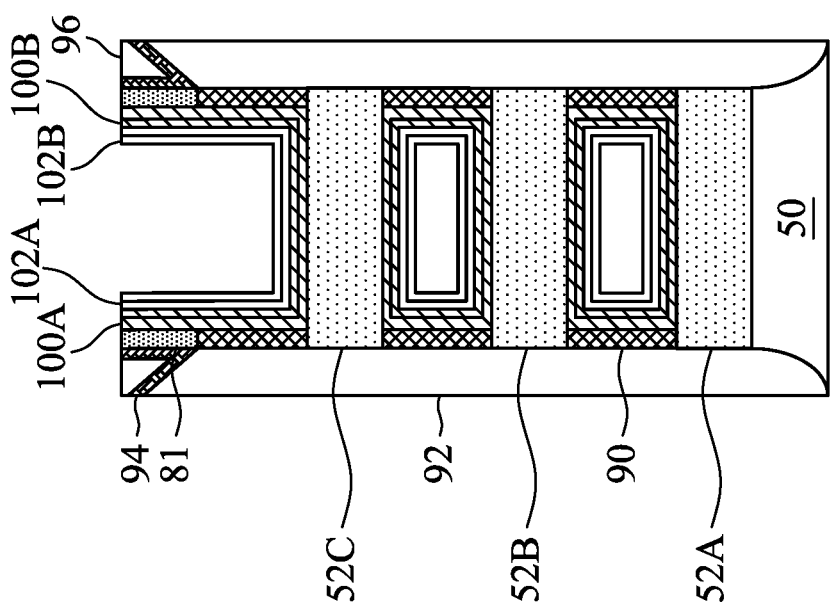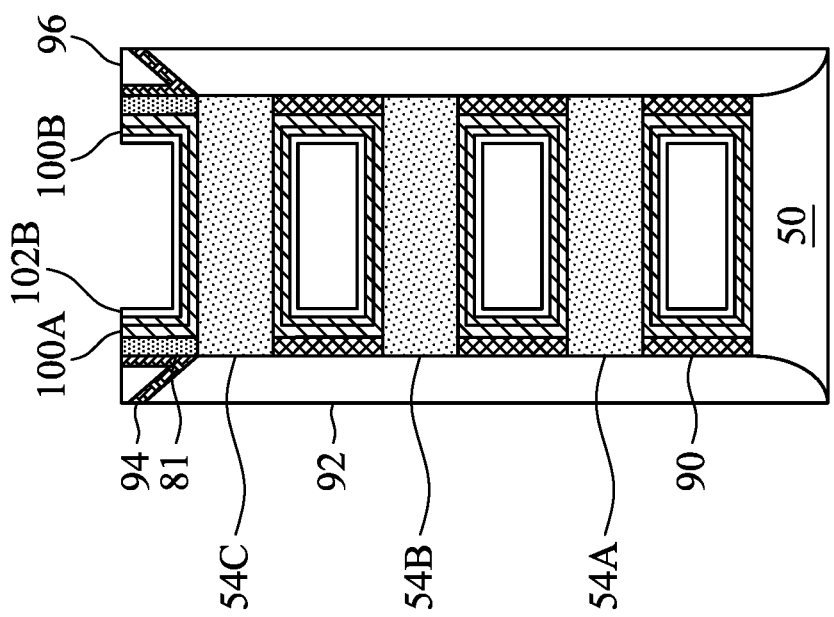
Figure 26B

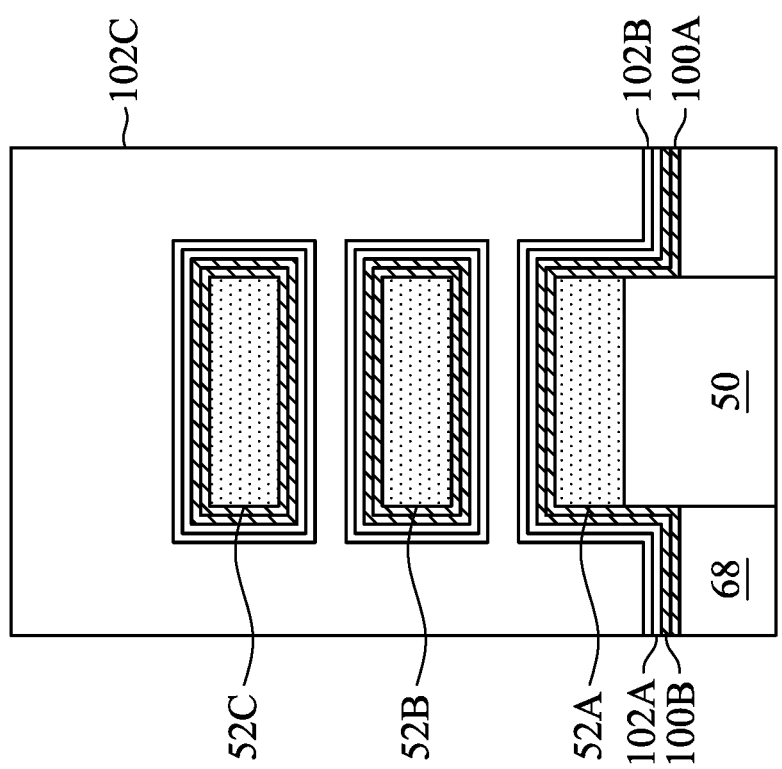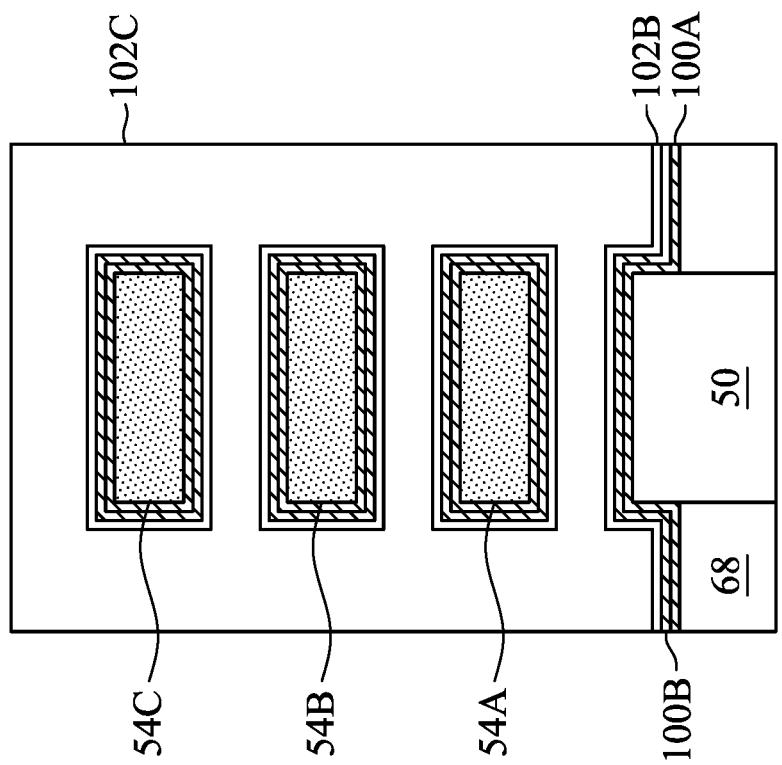
Figure 27C

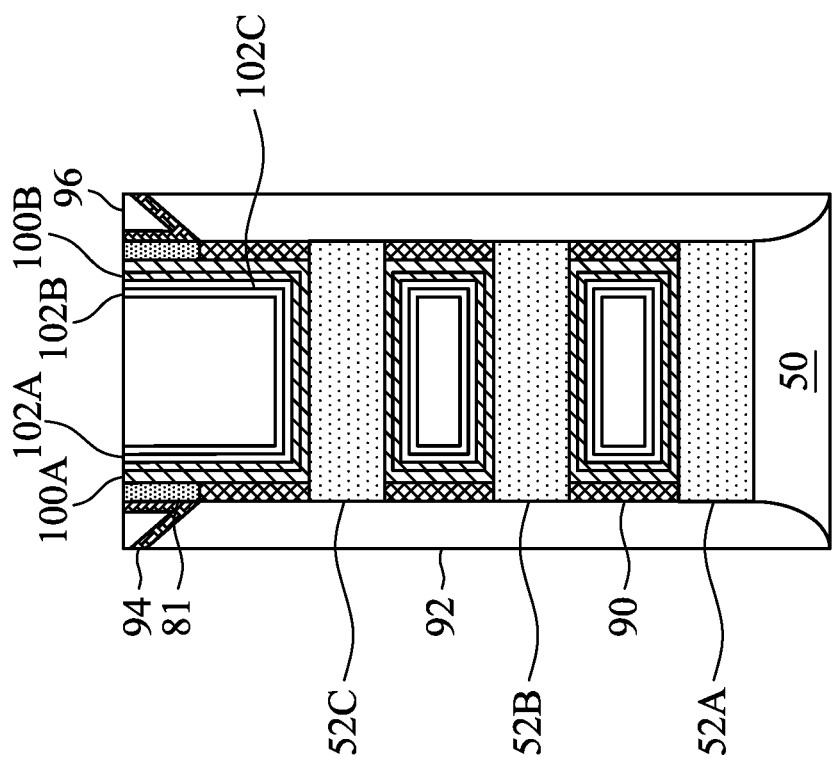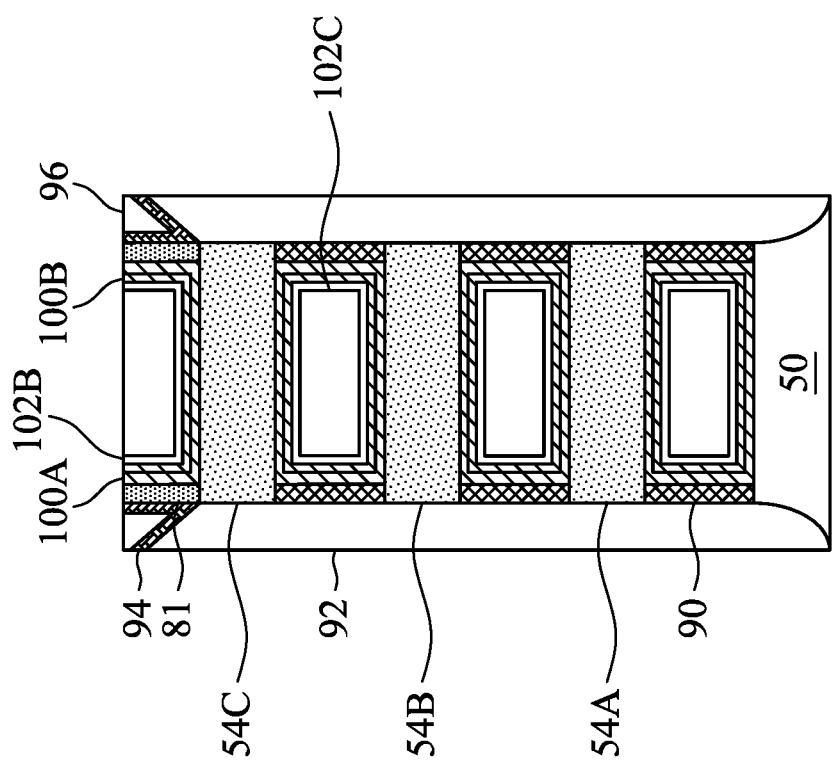
Figure 27D

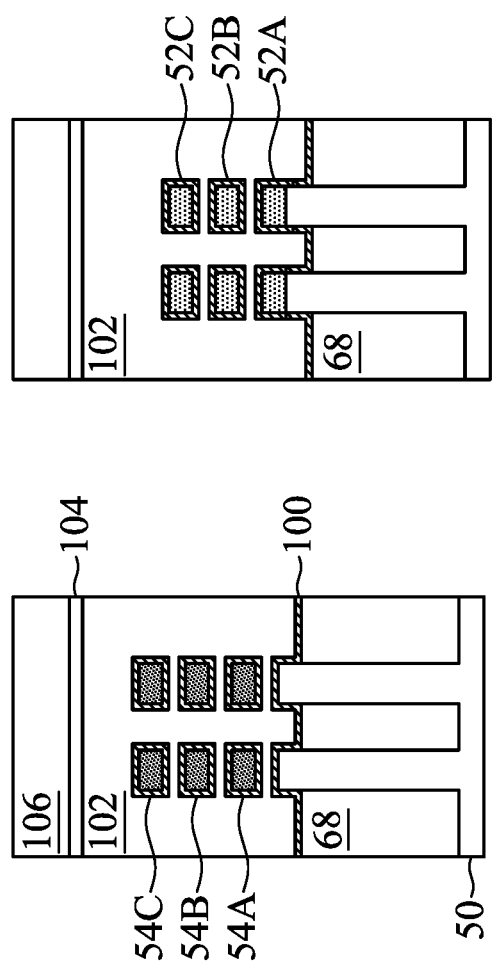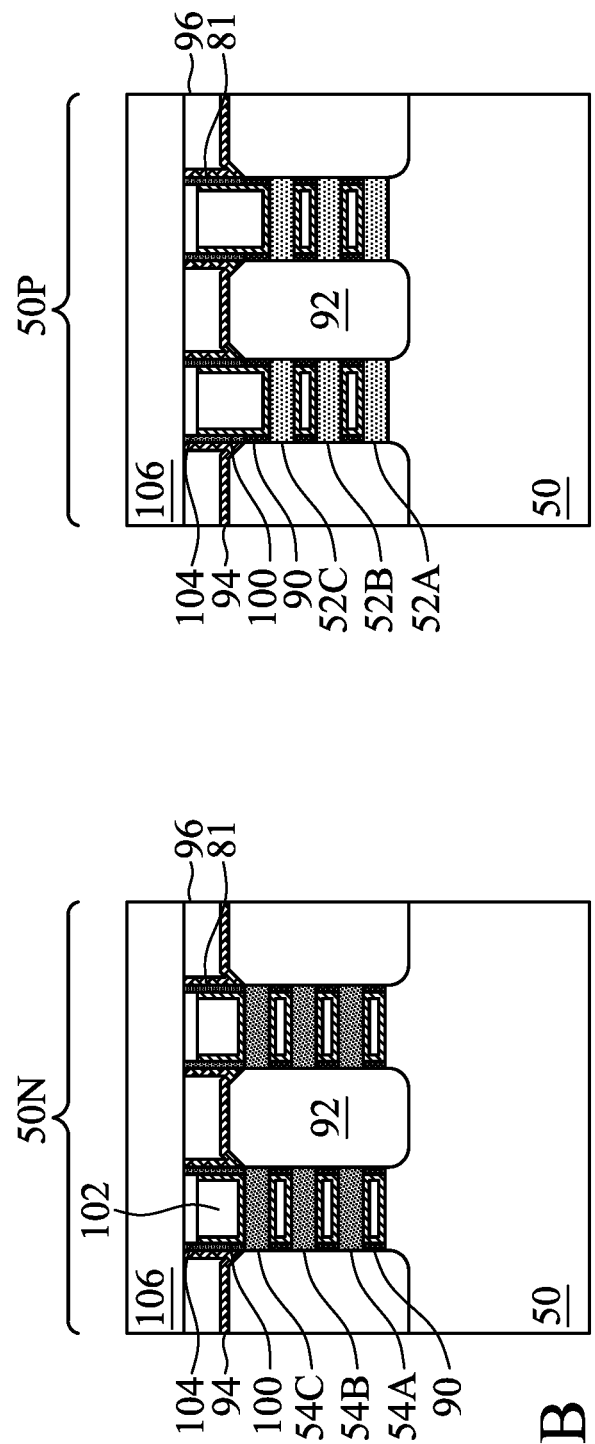
Figure 28A
Figure 28B

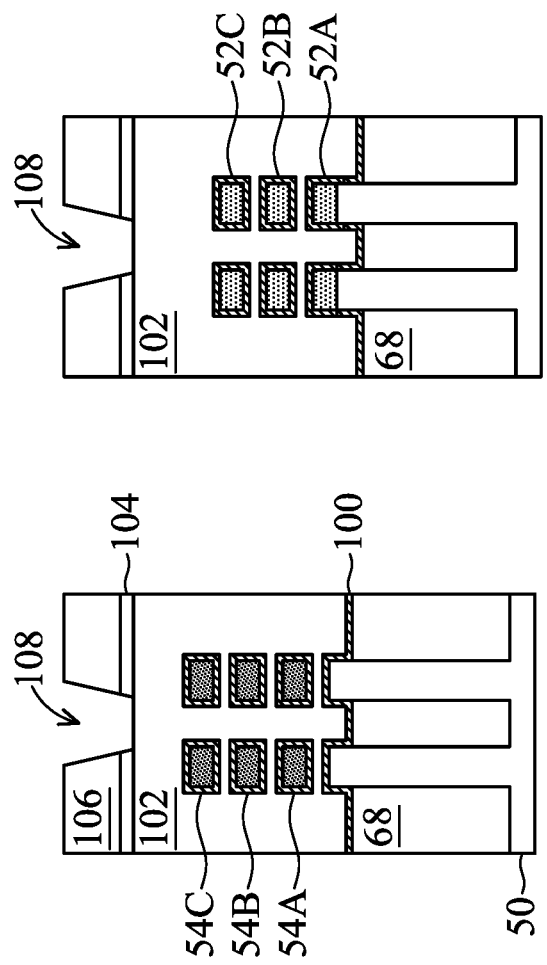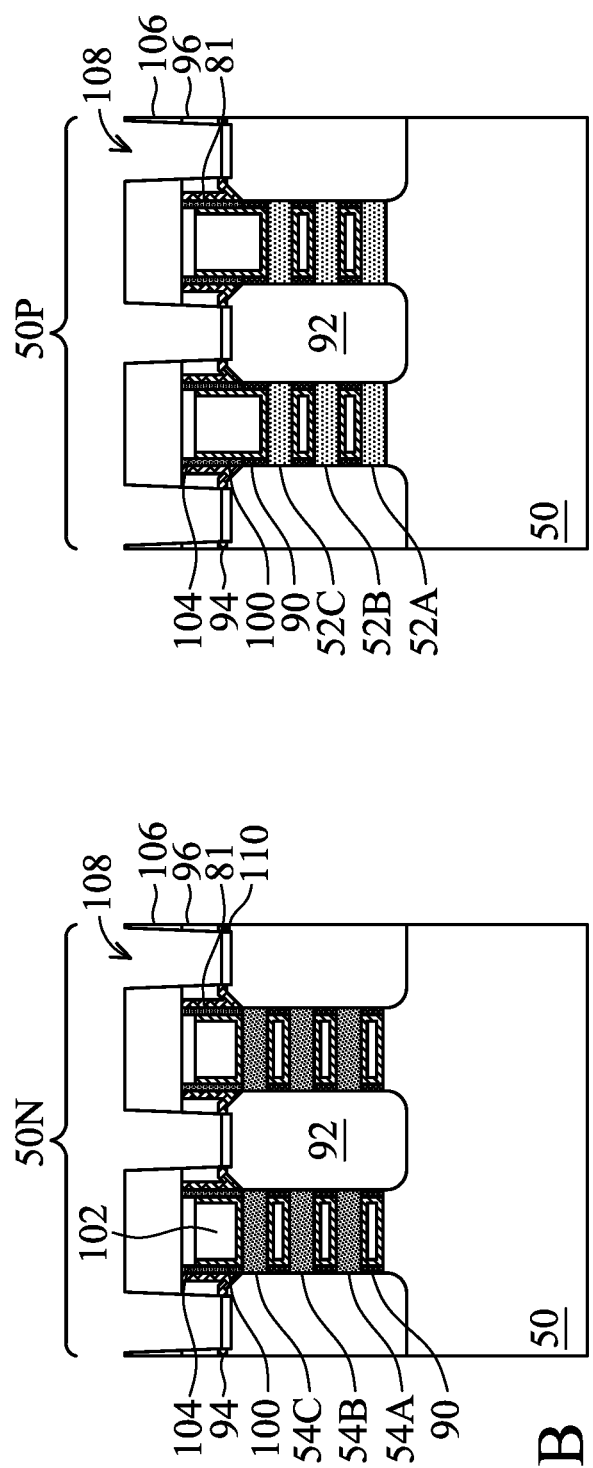
Figure 29A
Figure 29B

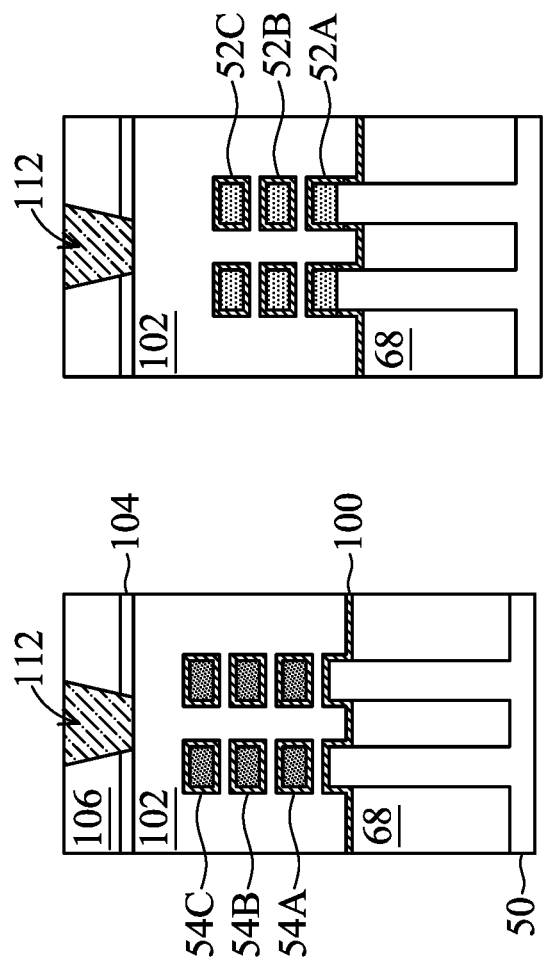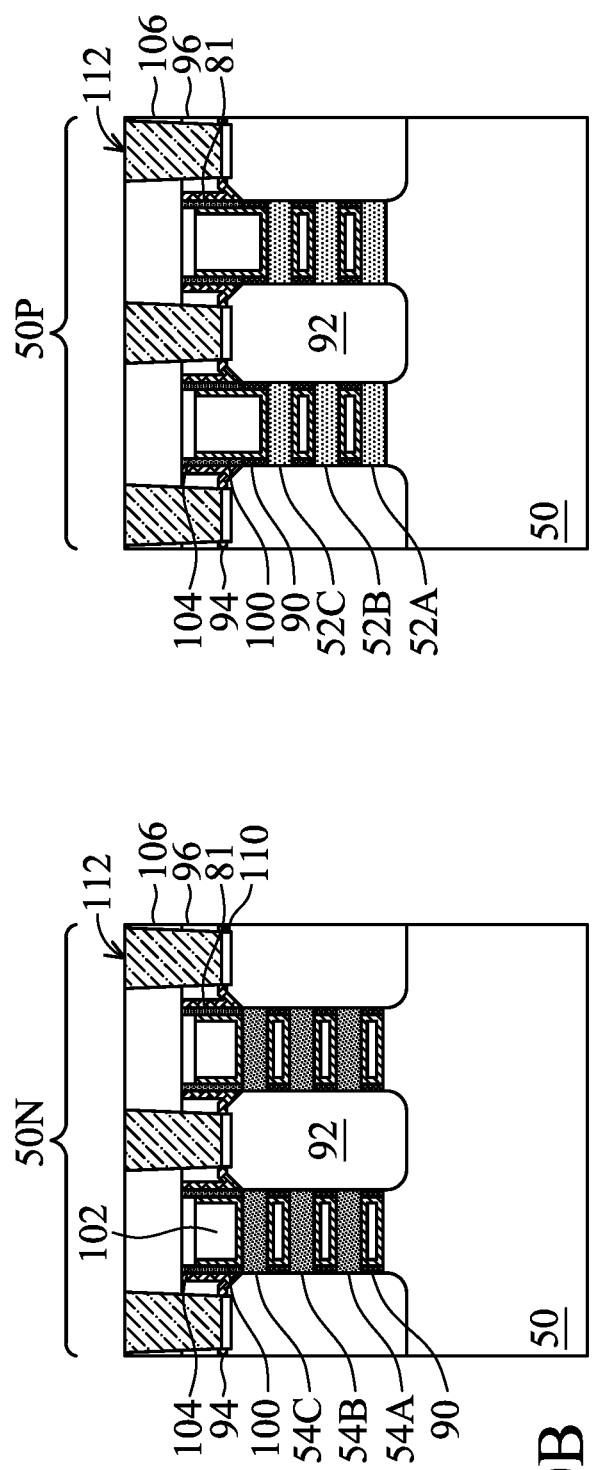
Figure 30A
Figure 30B

SEMICONDUCTOR DEVICE AND METHOD

PRIORITY CLAIM AND CROSS-REFERENCE

This application claims the benefit of U.S. Provisional Application No. 62/981,770, filed on Feb. 26, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 20C, 21A, 21B, 22A, 22B, 23A, 23B, 24A, 24B, 25A, 25B, 26A, 26B, 27A, 27B, 27C, 27D, 28A, 28B, 28C, 29A, 29B, 29C, 30A, 30B, and 30C are cross-sectional views of intermediate stages in the manufacturing of nano-FETs, in accordance with some embodiments.

DETAILED DESCRIPTION

Figure 1:
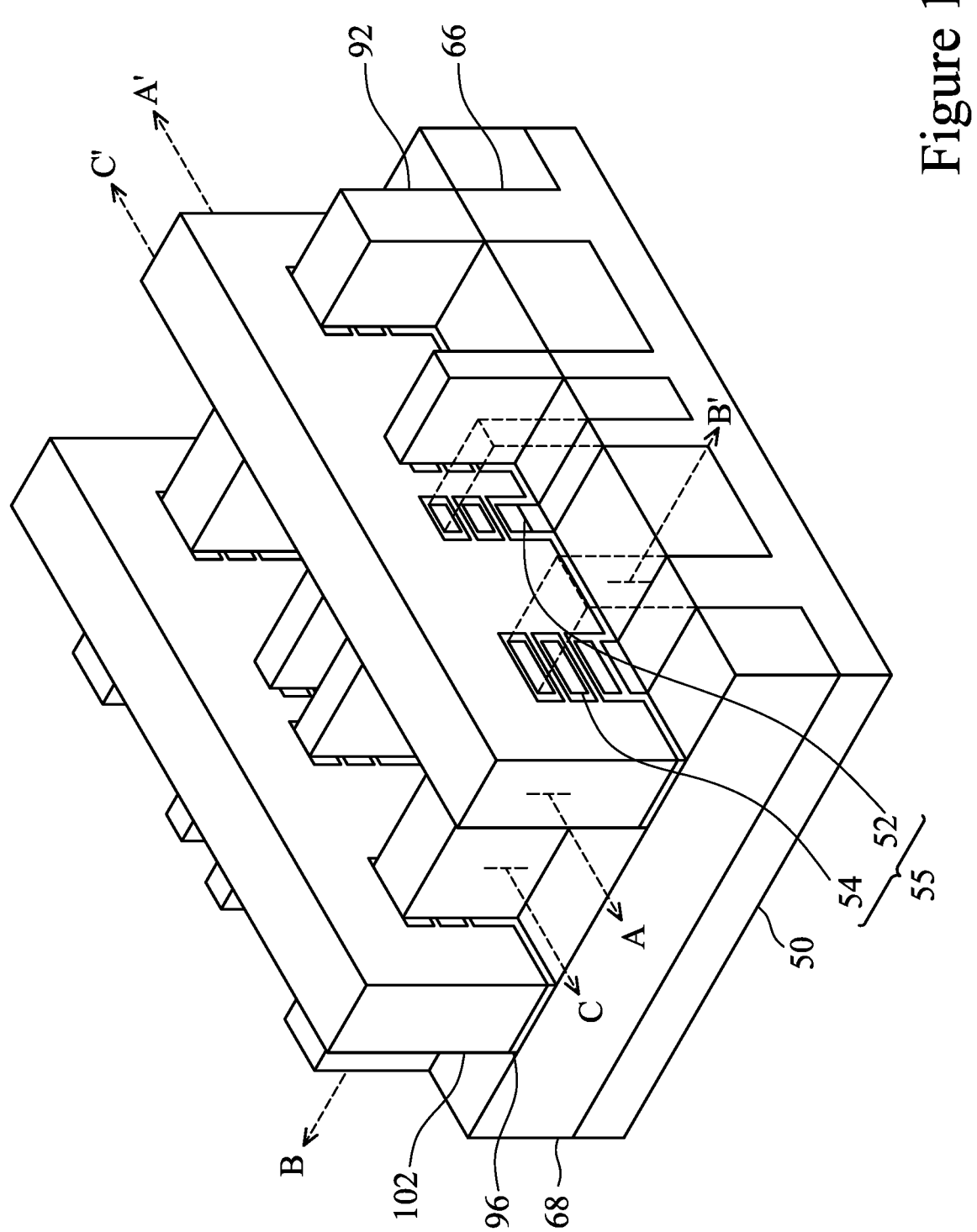
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments such as those discussed herein provide a gap filling technique, such as an atomic layer deposition (ALD) process to form a sacrificial film for filling gaps in a channel region from infiltration by a subsequently formed mask layer. Embodiments may reduce over-etching that may occur during removal processes for the sacrificial film that may cause unexpected and undesired damage of the main structure of devices. As described herein, a deposition process, such as an ALD process, provides a gap filling technique that is assisted by the formation of interior spaces, such as e.g. air gaps or voids, in a sacrificial film. As such, the etching process window may be increased. The interior air gap formation may help increase the etch chemical contact area, which may lead to an increase in the etching rate. Some embodiments provide interior air gap formation to facilitate the removal process of the sacrificial film, self-formation of air gaps by application of a thermal process, and/or self-formation of interior void by precursor purge control. The interior air gap formation may facilitate the removal process of the sacrificial film while retaining the gap filling properties of the sacrificial film. Embodiments may be incorporated into semiconductor process flows with little or no impact to integration flow.

FIG. 1 illustrates an example of nano-FETs (e.g., nanowire, nanosheet, gate-all-around (GAA), or the like) in a three-dimensional view, in accordance with some embodiments. The nano-FETs, or GAAFETs, comprise p-type nano-structures 52 and n-type nano-structures 54 (collectively referred to as nano-structures 55) over fins 66 on a substrate 50 (e.g., a semiconductor substrate), wherein the nano-structures 55 act as channel regions for the nano-FETs. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 96 are over top surfaces of the fins 66 and along top surfaces, sidewalls, and bottom surfaces of the p-type nano-structures 52 and n-type nano-structures 54. Gate electrodes 102 are over the gate dielectric layers 96. Epitaxial source/drain regions 92 are disposed on the fins 66 on opposing sides of the gate dielectric layers 96 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET.

Cross-section B-B' is perpendicular to cross-section A-A' and is along a longitudinal axis of a fin 66 in a PMOS region of the nano-FET and in a direction of, for example, a current flow between the epitaxial source/drain regions 90 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 30C are cross-sectional views of intermediate stages in the manufacturing of nano-FETs, in accordance with some embodiments. FIGS. 2 through 5, 6A, 14A, 15A, 16A, 17A, 18A, 19A, 20A, 21A, 22A, 23A, 24A, 25A, 26A, 27A, 27C, 28A, 29A, and 30A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, 27B, 27D, 28B, 29B, and 30B illustrate reference cross-section B-B' illustrated in FIG. 1. FIGS. 7A, 8A, 9A, 10A, 11A, 12A, 12C, 13C, 28C, 29C, and 30C illustrate reference cross-section C-C' illustrated in FIG. 1.

Figure 2:
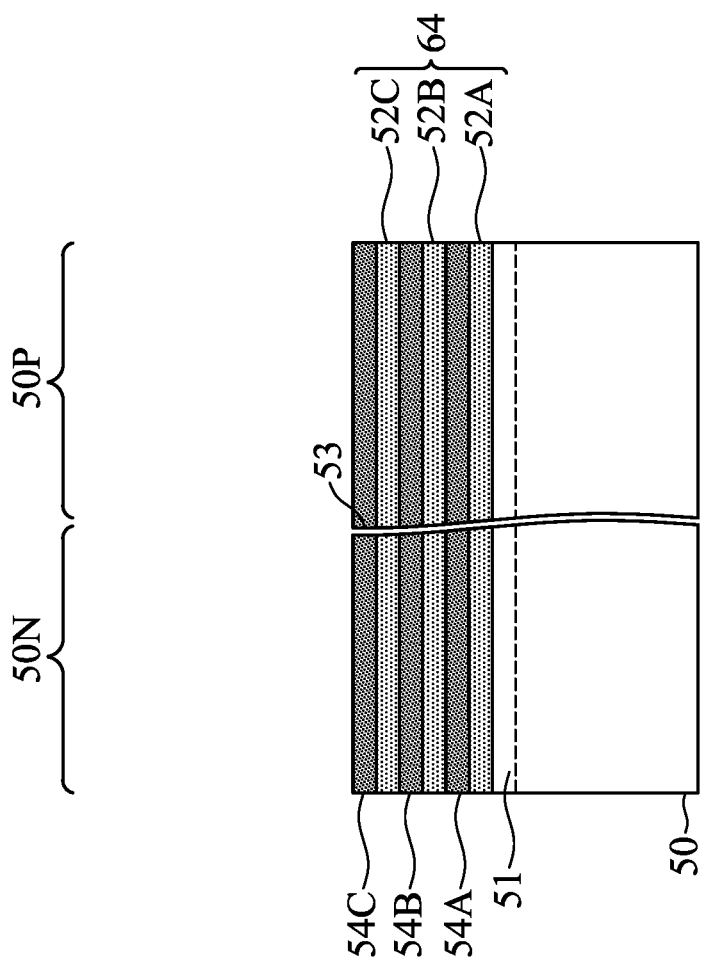

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 53), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region 51. During the APT implantation, dopants may be implanted in the n-type region 50N and the p-type region 50P. The dopants may have a conductivity type opposite a conductivity type of source/drain regions to be formed in each of the n-type region 50N and the p-type region 50P. The APT region 51 may extend under subsequently formed source/drain regions in the resulting nano-FETs, which will be formed in subsequent processes. The APT region 51 may be used to reduce the leakage from the source/drain regions to the substrate 50. In some embodiments, the doping concentration in APT region 51 may be from about $1\times10^{18}$ atoms/cm$^3$ to about $1\times10^{19}$ atoms/cm$^3$. For simplicity and legibility, the APT region 51 is not illustrated in subsequent drawings.

Further in FIG. 2, a multi-layer stack 64 is formed over the substrate 50. The multi-layer stack 64 includes alternating layers of first semiconductor layers 52A-C (collectively referred to as first semiconductor layers 52) and second semiconductor layers 54A-C (collectively referred to as second semiconductor layers 54). For purposes of illustration and as discussed in greater detail below, the second semiconductor layers 54 will be removed and the first semiconductor layers 52 will be patterned to form channel regions of nano-FETs in the p-type region 50P, and the first semiconductor layers 52 will be removed and the second semiconductor layers 54 will be patterned to form channel regions of nano-FETs in the n-type regions 50N. Nevertheless, in some embodiments the first semiconductor layers 52 may be removed and the second semiconductor layers 54 may be patterned to form channel regions of nano-FETs in the n-type region 50N, and the second semiconductor layers 54 will be removed and the first semiconductor layers 52 may be patterned to form channel regions of nano-FETs in the p-type regions 50P.

The multi-layer stack 64 is illustrated as including three layers of each of the first semiconductor layers 52 and the second semiconductor layers 54 for illustrative purposes. In some embodiments, the multi-layer stack 64 may include any number of the first semiconductor layers 52 and the second semiconductor layers 54. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like to a thickness in a range from about 2 nm to about 15 nm. In various embodiments, the first semiconductor layers 52 may be formed of a first semiconductor material suitable for p-type nano-FETs, such as silicon germanium, or the like, and the second semiconductor layers 54 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 52 of the first semiconductor material may be removed without significantly removing the second semiconductor layers 54 of the second semiconductor material in the n-type region 50N, thereby allowing the second semiconductor layers 54 to be patterned to form channel regions of n-type nano-FETS. Similarly, the second semiconductor layers 54 of the second semiconductor material may be removed without significantly removing the first semiconductor layers 52 of the first semiconductor material in the p-type region 50P, thereby allowing the first semiconductor layers 52 to be patterned to form channel regions of p-type nano-FETS.

Figure 3:
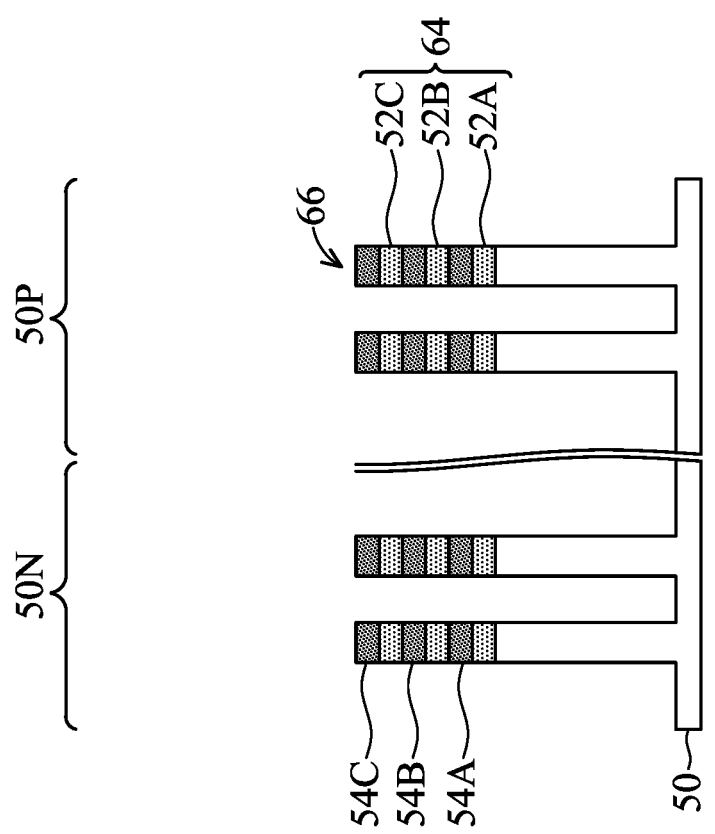

Referring now to FIG. 3, fins 66 are formed in the multi-layer stack 64 and the substrate 50, in accordance with some embodiments. In some embodiments, the fins 66 may be formed in the multi-layer stack 64 and the substrate 50 by etching trenches in the multi-layer stack 64 and the substrate 50. The etching may be any acceptable etch process, such as a reactive ion etch (RIE), neutral beam etch (NBE), the like, or a combination thereof. The etching may be anisotropic.

The fins 66 may be patterned by any suitable method. For example, the fins 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial film is formed over a substrate and patterned using a photolithography process. Spacers are formed alongside the patterned sacrificial film using a self-aligned process. The sacrificial film is then removed, and the remaining spacers may then be used to pattern the fins 66.

The fins 66 may have widths in a range from about 20 nm to about 100 nm. FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P.

Figure 4:
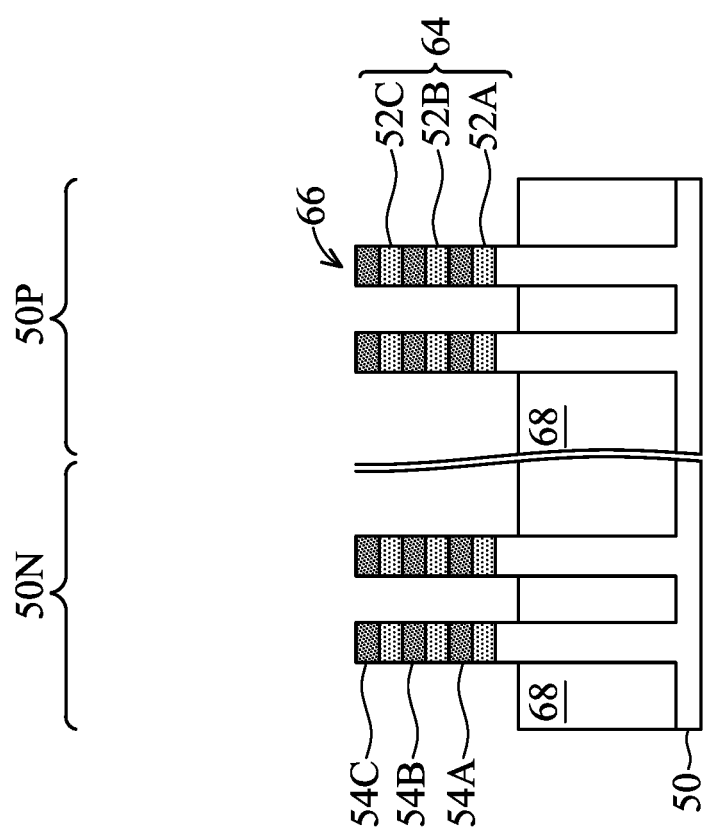

In FIG. 4, shallow trench isolation (STI) regions 68 are formed adjacent the fins 66. The STI regions 68 may be formed by depositing an insulation material over the substrate 50 and the fins 66 and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the fins 66. Although the insulation material is illustrated as a single layer, some embodiments may utilize multiple layers. For example, in some embodiments a liner (not separately illustrated) may first be formed along a surface of the substrate 50 and the fins 66. Thereafter, a fill material, such as those discussed above may be formed over the liner.

A removal process is then applied to the insulation material to remove excess insulation material over the fins 66. In some embodiments, a planarization process such as a chemical mechanical polish (CMP), an etch-back process, combinations thereof, or the like may be utilized. The planarization process exposes the fins 66 such that top surfaces of the fins 66 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. For example, in some embodiments, the insulation material is recessed such that a portion of the substrate underlying a bottommost layer of the first semiconductor layer 52A is exposed. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66). For example, an oxide removal using, for example, dilute hydrofluoric (dHF) acid may be used.

The process described above with respect to FIGS. 2 through 4 is just one example of how the fins 66 may be formed. In some embodiments, the fins 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 52 and the second semiconductor layers 54 are illustrated and discussed herein as comprising the same materials in the p-type region 50P and the n-type region 50N for illustrative purposes only. As such, in some embodiments one or both of the first semiconductor layers 52 and the second semiconductor layers 54 may be different materials or formed in a different order in the p-type region 50P and the n-type region 50N.

Further in FIG. 4, appropriate wells (not separately illustrated) may be formed in the fins 66 and/or the substrate 50. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following the implanting of the p-type region 50P, a photoresist or other masks (not separately illustrated) is formed over the fins 66 and the STI regions 68 in the p-type region 50P and the n-type region 50N. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
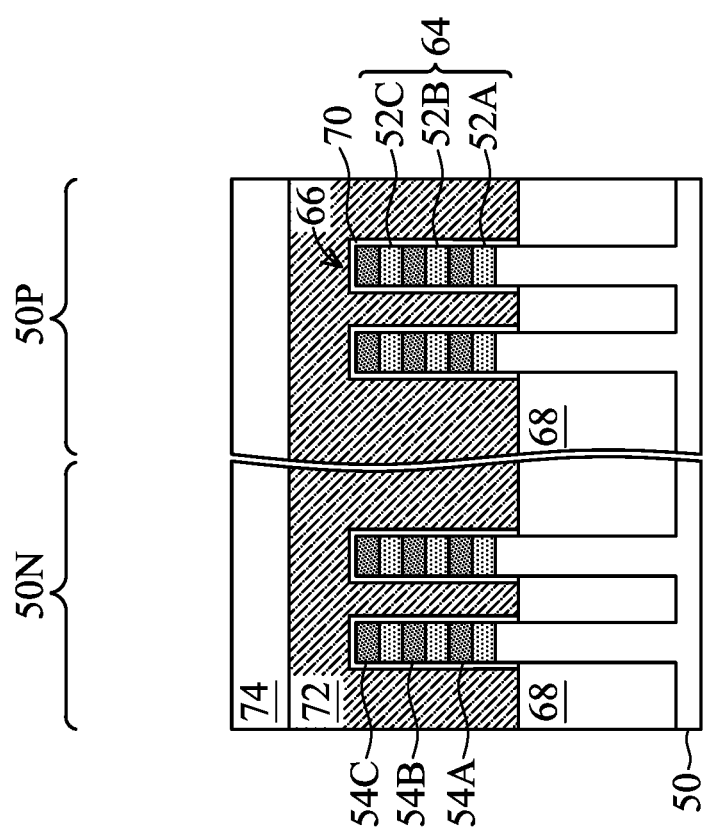

In FIG. 5, a dummy dielectric layer 70 is formed on the fins 66. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 for illustrative purposes only. In some embodiments, the dummy dielectric layer 70 may be deposited such that the dummy dielectric layer 70 covers the STI regions 68, extending between the dummy gate layer 72 and the STI regions 68.

Figure 6A:
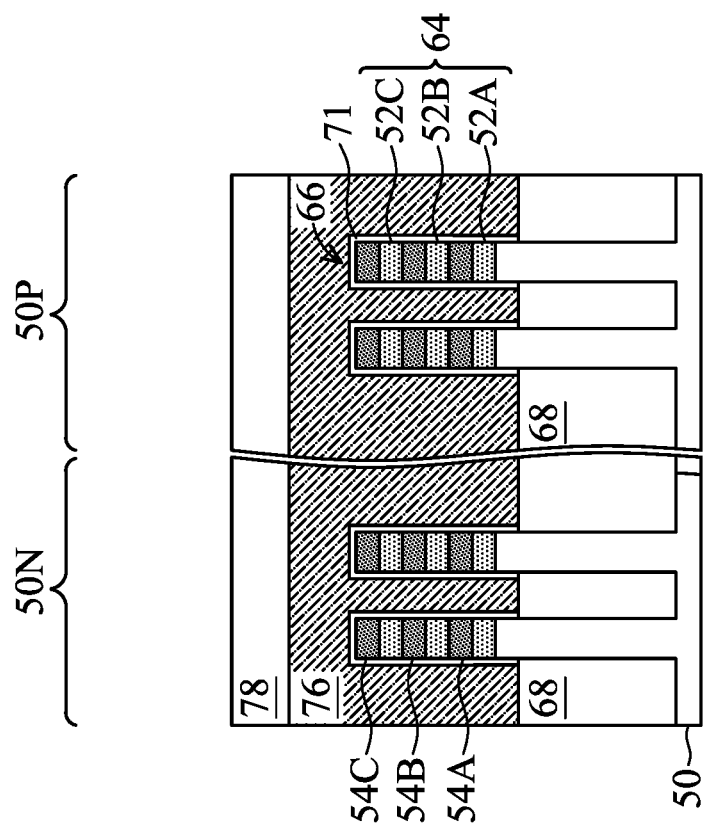
Figure 6B:
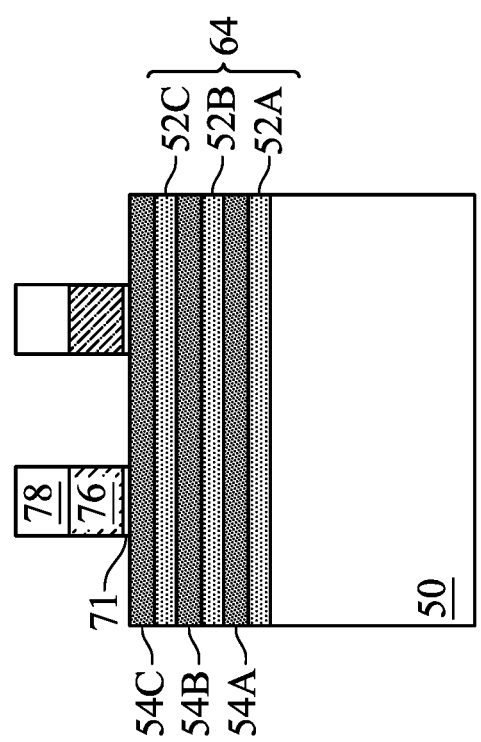

In FIGS. 6A and 6B, the mask layer 74 (see FIG. 5) may be patterned using acceptable photolithography and etching techniques to form masks 78. The pattern of the masks 78 then may be transferred to the dummy gate layer 72 to form dummy gates 76 and to the dummy dielectric layer 70 to form dummy gate dielectrics 71. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
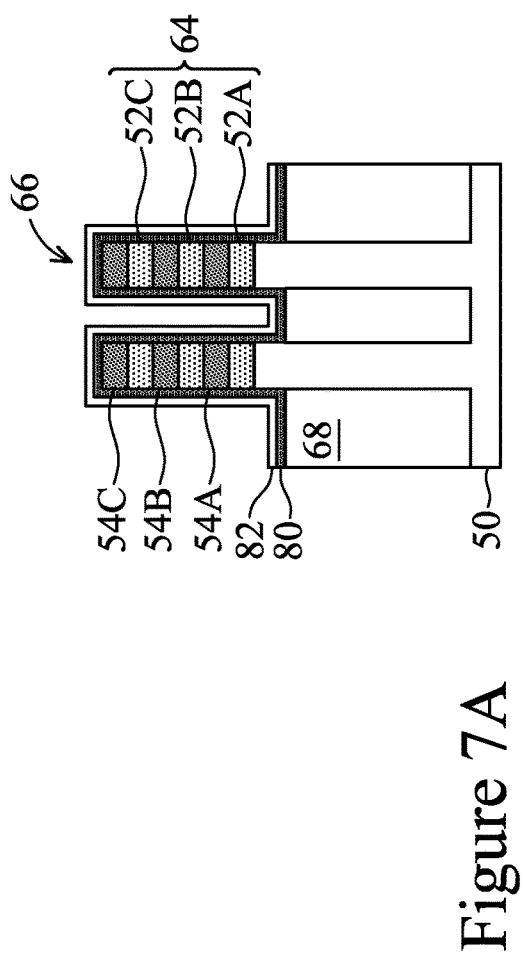
Figure 7B:
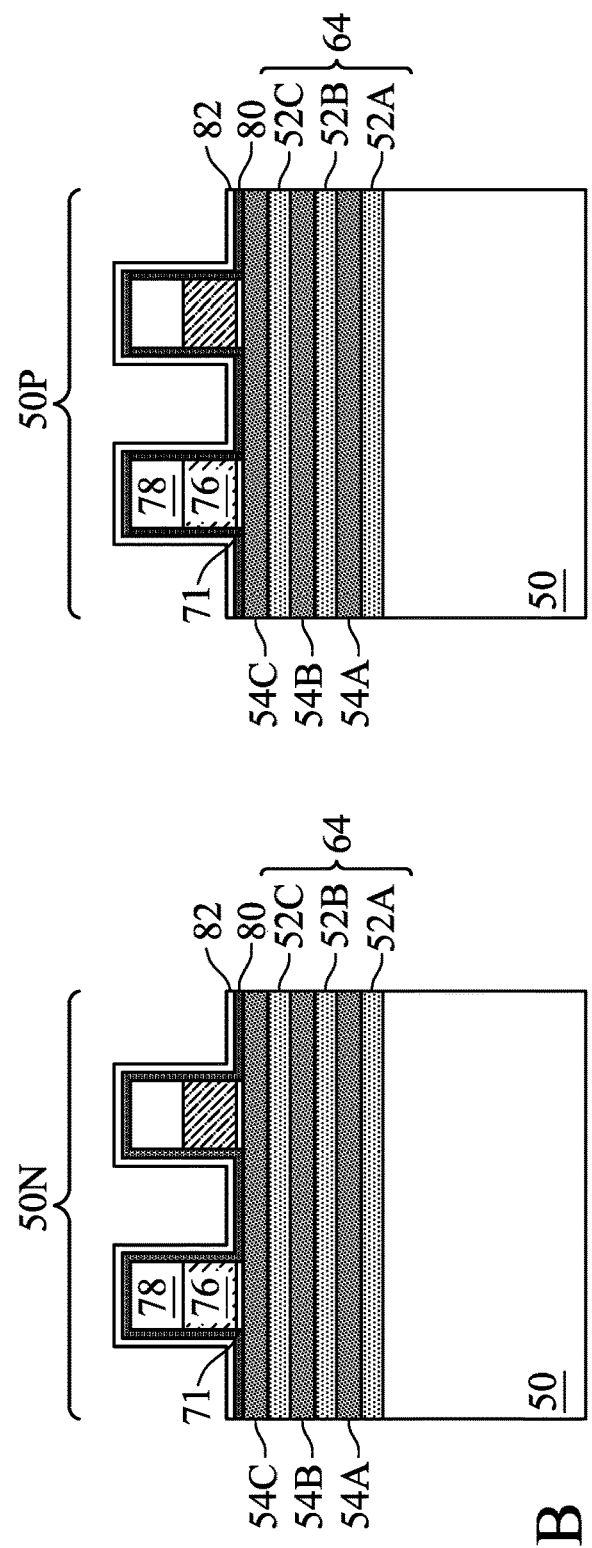

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68, top surfaces and sidewalls of the fins 66 and the masks 78, and sidewalls of the substrate 50, the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed nanostructures 55 and the substrate 50 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed nanostructures 55 and the substrate 50 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 have different etch rates than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and the substrate 50. As illustrated in FIG. 8B, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be formed prior to forming the second spacers 83), additional spacers may be formed and removed, and/or the like. Furthermore, the n-type and p-type devices may be formed using different structures and steps.

Figure 9A:
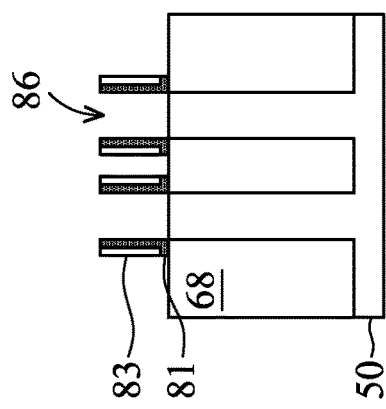
Figure 9B:
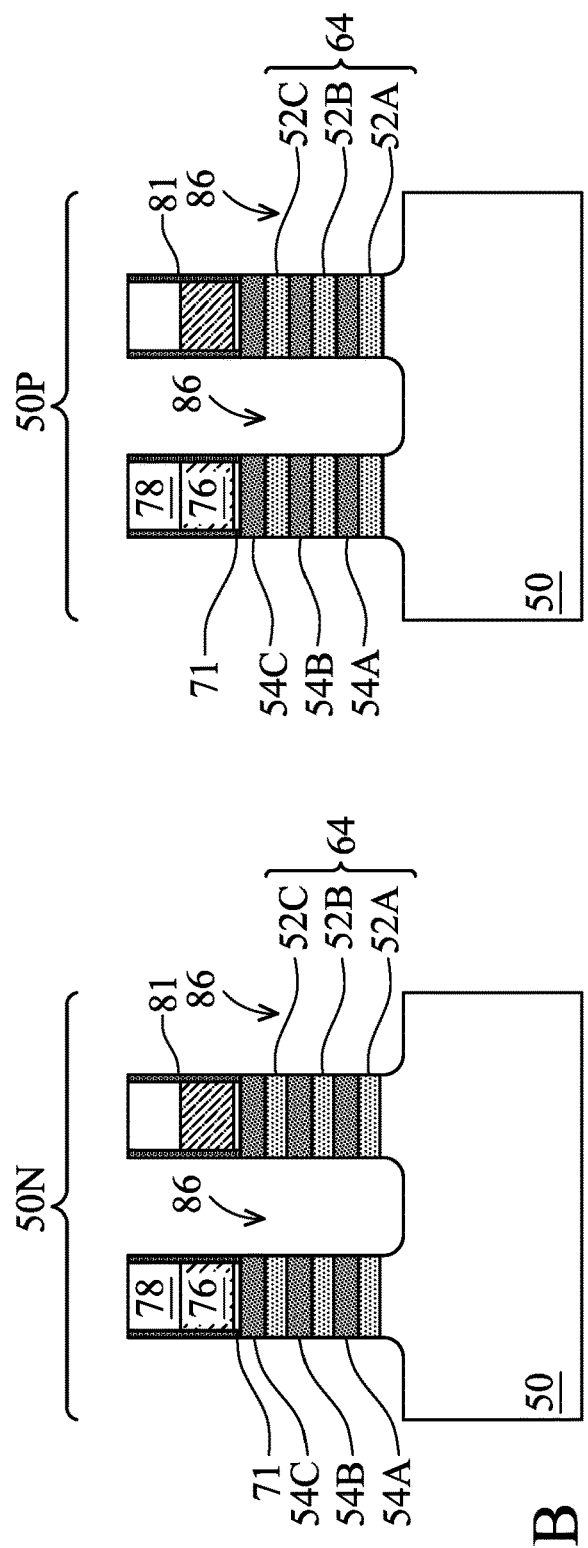

In FIGS. 9A and 9B, first recesses 86 are formed in the fins 66 and the substrate 50, in accordance with some embodiments. Epitaxial source/drain regions will be subsequently formed in the first recesses 86. The first recesses 86 may extend through the first semiconductor layers 52 and the second semiconductor layers 54, and into the substrate 50. As illustrated in FIG. 9A, top surfaces of the STI regions 68 may be level with top surfaces of the substrate 50. In various embodiments, the first recesses 86 may extend to a top surface of the substrate 50 without etching the substrate 50; the substrate 50 may be etched such that bottom surfaces of the first recesses 86 are disposed below the top surfaces of the STI regions 68; or the like. The first recesses 86 may be formed by etching the fins 66 and the substrate 50 using anisotropic etching processes, such as RIE, NBE, or the like. The first spacers 81, the second spacers 83, and the masks 78 mask portions of the fins 66 and the substrate 50 during the etching processes used to form the first recesses 86. A single etch process or multiple etch processes may be used to etch each layer of the fin 66. Timed etch processes may be used to stop the etching of the first recesses 86 after the first recesses 86 reach a desired depth.

In FIGS. 10A and 10B, portions of sidewalls of the layers of the multi-layer stack 64 formed of the first semiconductor materials (e.g., the first semiconductor layers 52) exposed by the first recesses 86 are etched to form sidewall recesses 88 in the n-type region 50N, and portions of sidewalls of the layers of the multi-layer stack 64 formed of the second semiconductor materials (e.g., the second semiconductor layers 54) exposed by the first recesses 86 are etched to form sidewall recesses 88 in the p-type region 50P. Although sidewalls of the first semiconductor layers 52 and the second semiconductor layers 54 in recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first semiconductor layers 52 such that the second semiconductor layers 54 and the substrate 50 remain relatively unetched as compared to the first semiconductor layers 52 in the n-type region 50N. Similarly, the n-type region 50N may be protected using a mask (not shown) while etchants selective to the second semiconductor materials are used to etch the second semiconductor layers 54 such that the first semiconductor layers 52 and the substrate 50 remain relatively unetched as compared to the second semiconductor layers 54 in the p-type region 50P. In an embodiment in which the first semiconductor layers 52 include, e.g., SiGe, and the second semiconductor layers 54 include, e.g., Si or SiC, a dry etch process with tetramethylammonium hydroxide (TMAH), ammonium hydroxide ($NH_4OH$), or the like may be used to etch sidewalls of the first semiconductor layers 52 in the n-type region 50N, and a dry etch process with hydrogen fluoride, another fluorine-based gas, high-temperature $H_2SO_4$, $H_2PO_3$, the like, or a combination thereof may be used to etch sidewalls of the second semiconductor layers 54 in the p-type region 50P.

Figure 11A:
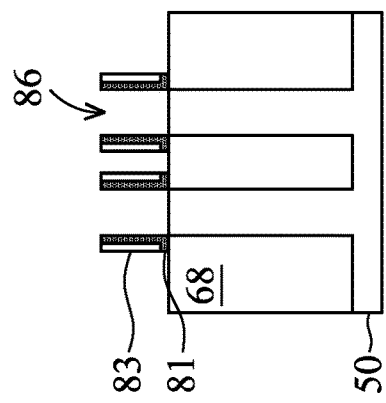
Figure 11B:
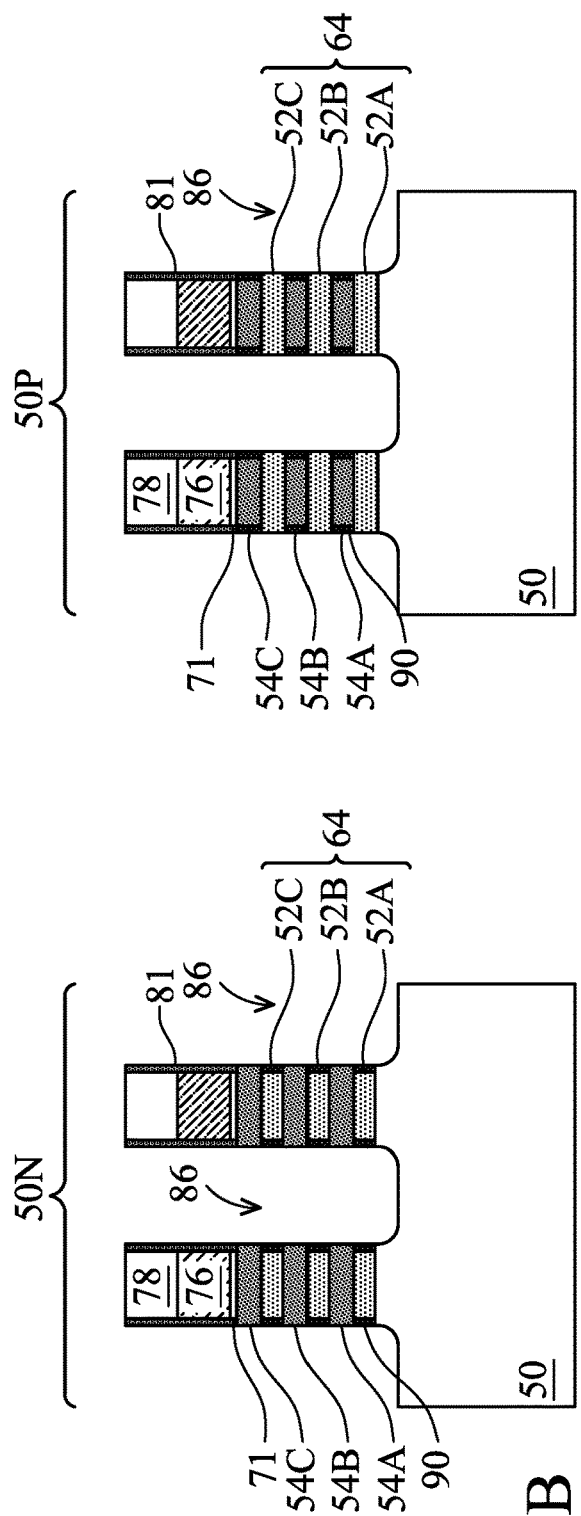
Figure 11C:
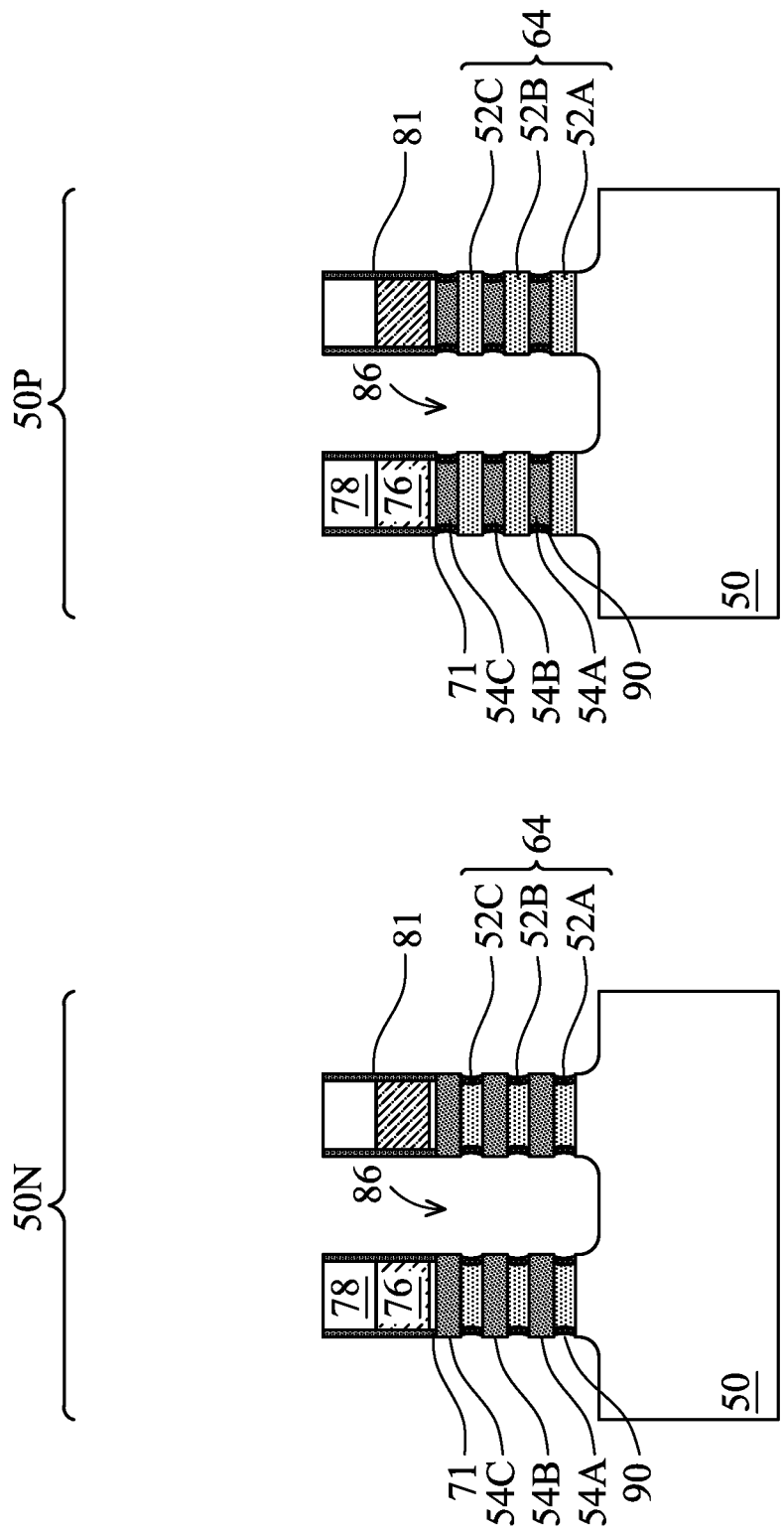

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first semiconductor layers 52 in the n-type region 50N and the second semiconductor layers 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second semiconductor layers 54 in the n-type region 50N and flush with the sidewalls of the first semiconductor layers 52 in the p-type region 50P, the outer sidewalls of the first inner spacers 90 may extend beyond or be recessed from sidewalls of the second semiconductor layers 54 and/or the first semiconductor layers 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first semiconductor layers 52 are concave, outer sidewalls of the first inner spacers 90 are concave, and the first inner spacers are recessed from sidewalls of the second semiconductor layers 54 in the n-type region 50N. Also illustrated are embodiments in which sidewalls of the second semiconductor layers 54 are concave, outer sidewalls of the first inner spacers 90 are concave, and the first inner spacers are recessed from sidewalls of the first semiconductor layers 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
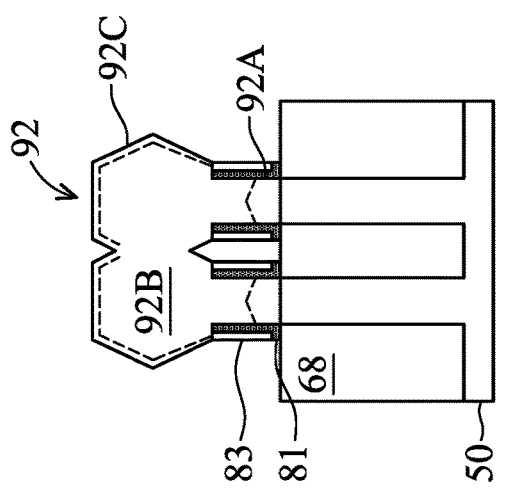
Figure 12B:
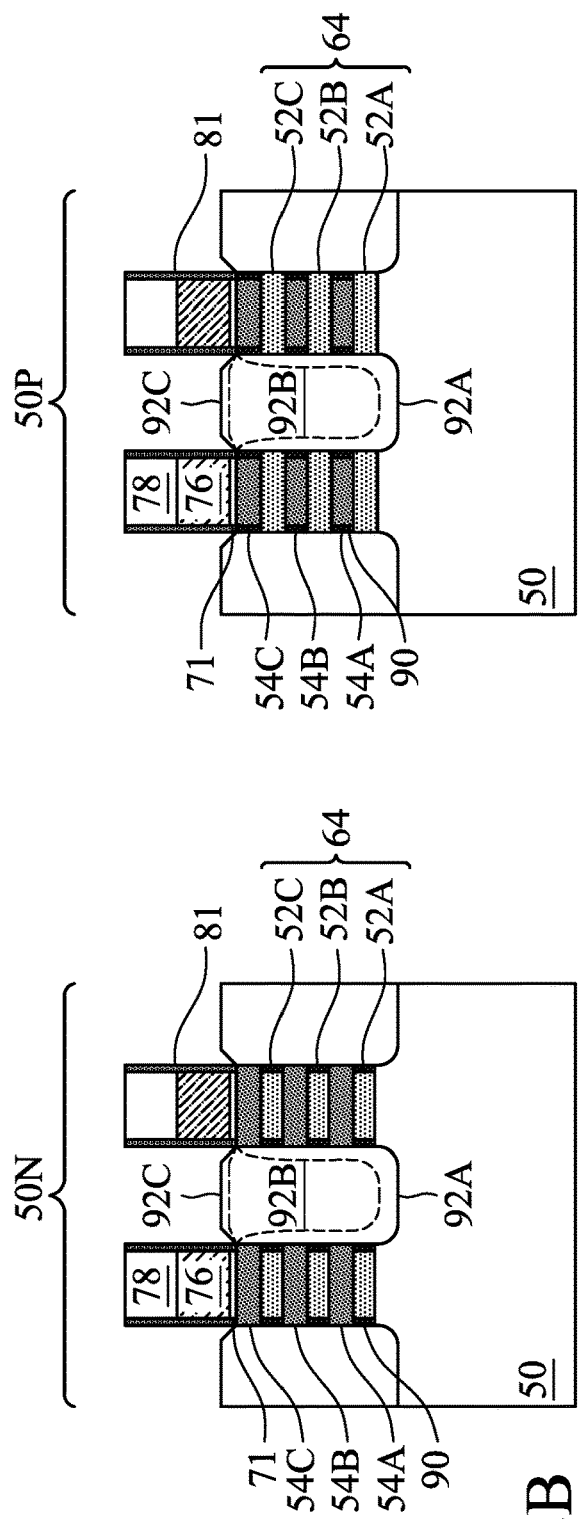

In FIGS. 12A-12C, epitaxial source/drain regions 92 are formed in the first recesses 86 to exert stress on the second semiconductor layers 54 in the n-type region 50N and on the first semiconductor layers 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 72 by an appropriate lateral distance so that the epitaxial source/drain regions 92 do not short out with subsequently formed gates of the resulting nano-FETs. The first inner spacers 90 may be used to separate the epitaxial source/drain regions 92 from the first semiconductor layers 52A-52C by appropriate lateral distances to prevent shorts between the epitaxial source/drain regions 92 and the subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second semiconductor layers 54 are silicon, the epitaxial source/drain regions 92 may include materials exerting a tensile strain on the second semiconductor layers 54, such as silicon, silicon carbide, phosphorous doped silicon carbide, silicon phosphide, or the like. The epitaxial source/drain regions 92 may have surfaces raised from respective surfaces of the multi-layer stack 64 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first semiconductor layers 52 are silicon germanium, the epitaxial source/drain regions 92 may comprise materials exerting a compressive strain on the first semiconductor layers 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first semiconductor layers 52, the second semiconductor layers 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the first semiconductor layers 52 and the second semiconductor layers 54. In some embodiments, these facets cause adjacent epitaxial source/drain regions 92 of a same nano-FET to merge as illustrated by FIG. 12A. In other embodiments, adjacent epitaxial source/drain regions 92 remain separated after the epitaxy process is completed as illustrated by FIG. 12C. Subsequent figures illustrate the embodiment of FIG. 12A, but the processes and structures illustrated therein are also applicable to the embodiment of FIG. 12C. In the embodiments illustrated in FIGS. 12A and 12C, the first spacers 81 may be formed covering portions of the sidewalls of the first semiconductor layers 52, the second semiconductor layers 54, and the substrate 50 that extend above the STI regions 68 thereby blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 12D illustrates an embodiment in which sidewalls of the first semiconductor layers 52 in the n-type region 50N and sidewalls of the second semiconductor layers 54 in the p-type region 50P are concave, outer sidewalls of the first inner spacers 90 are concave, and the first inner spacers 90 are recessed from sidewalls of the second semiconductor layers 54 and the first semiconductor layers 52, respectively. As illustrated in FIG. 12D, the epitaxial source/drain regions 92 may be formed in contact with the first inner spacers 90 and may extend past sidewalls of the second semiconductor layers 54 in the n-type region 50N and past sidewalls of the first semiconductor layers 52 in the p-type region 50P.

Figure 13A:
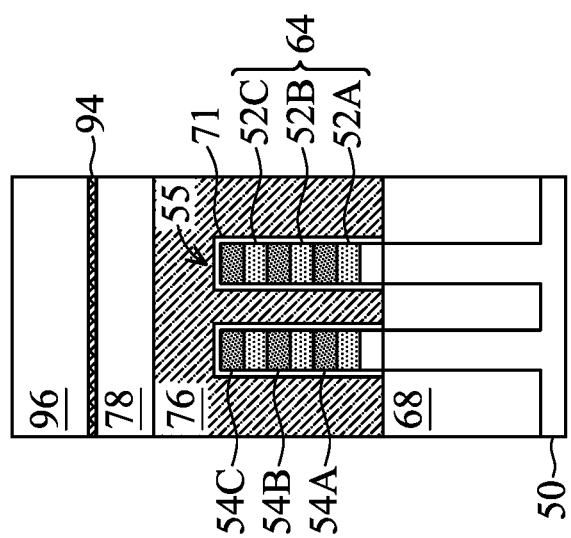
Figure 13B:
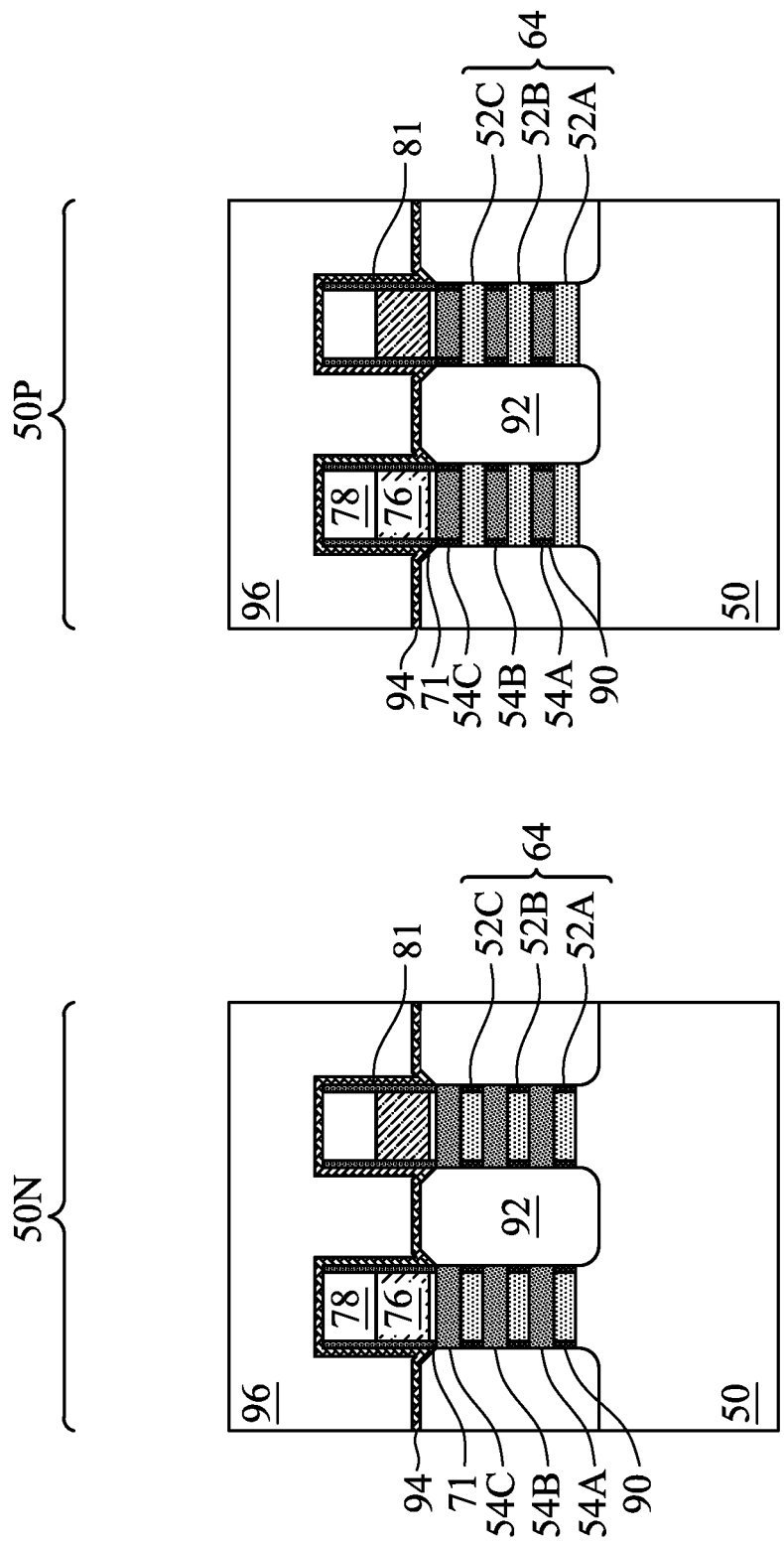
Figure 13C:
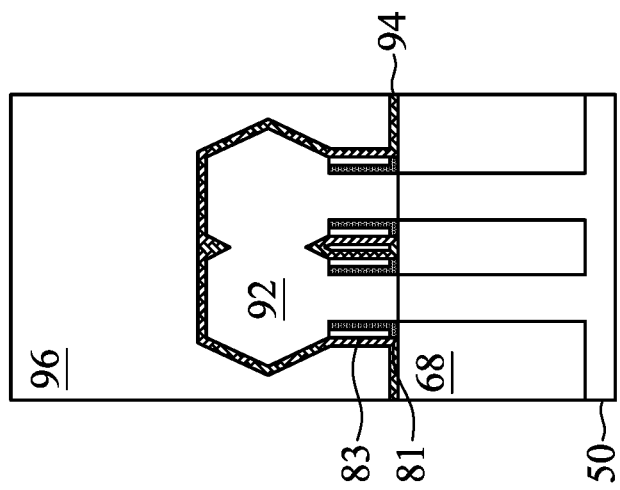

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as silicon nitride, silicon oxide, silicon oxynitride, or the like, having a different etch rate than the material of the overlying first ILD 96.

Figure 14A:
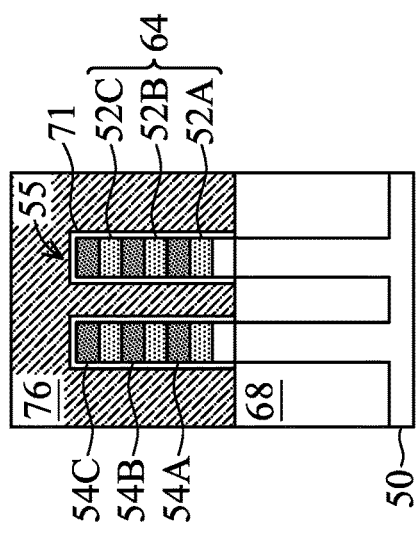
Figure 14B:
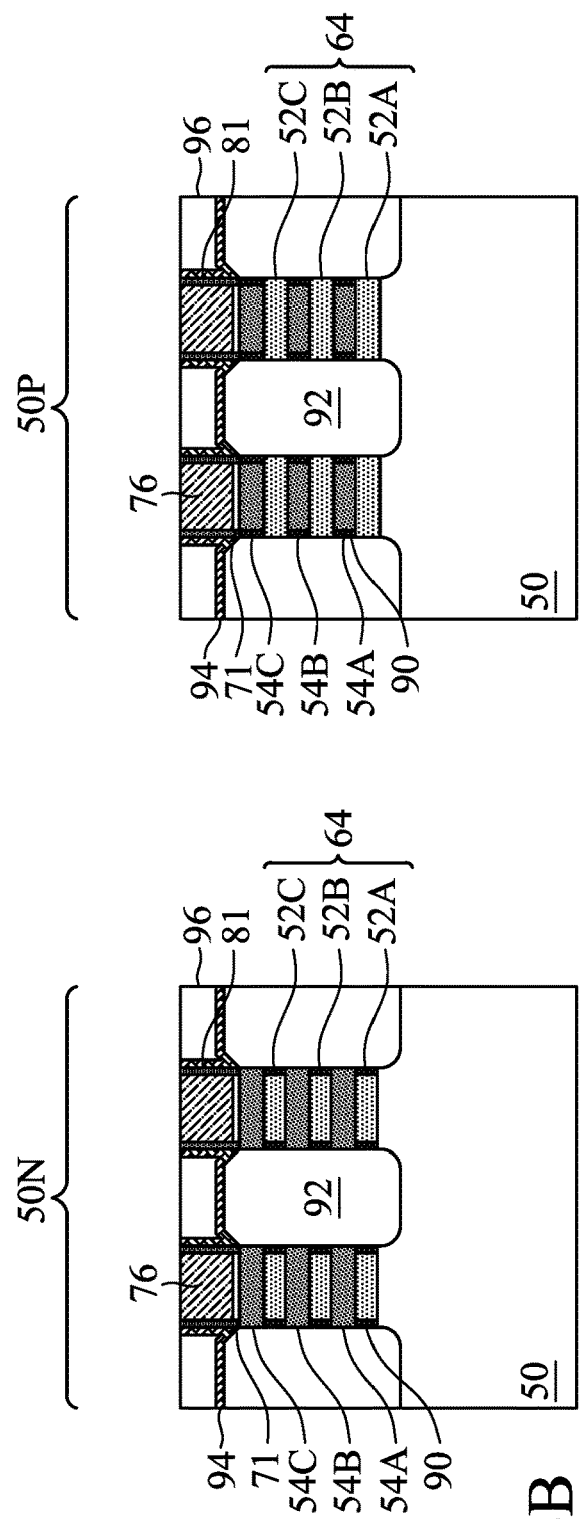

In FIGS. 14A and 14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15A:
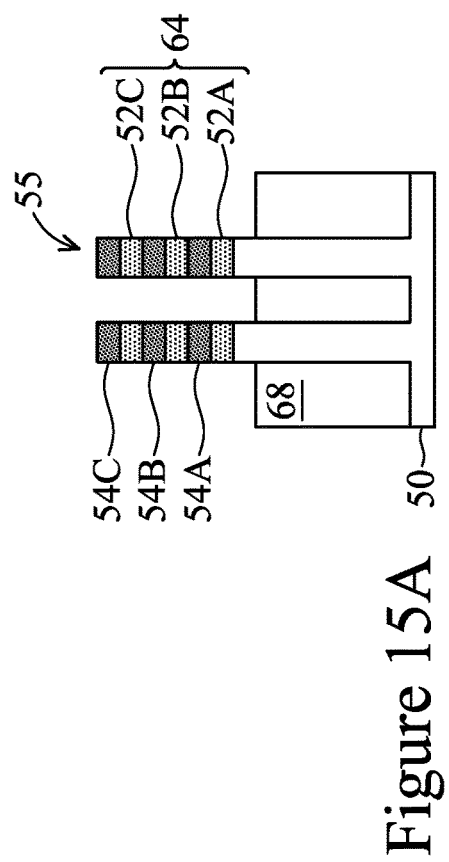
Figure 15B:
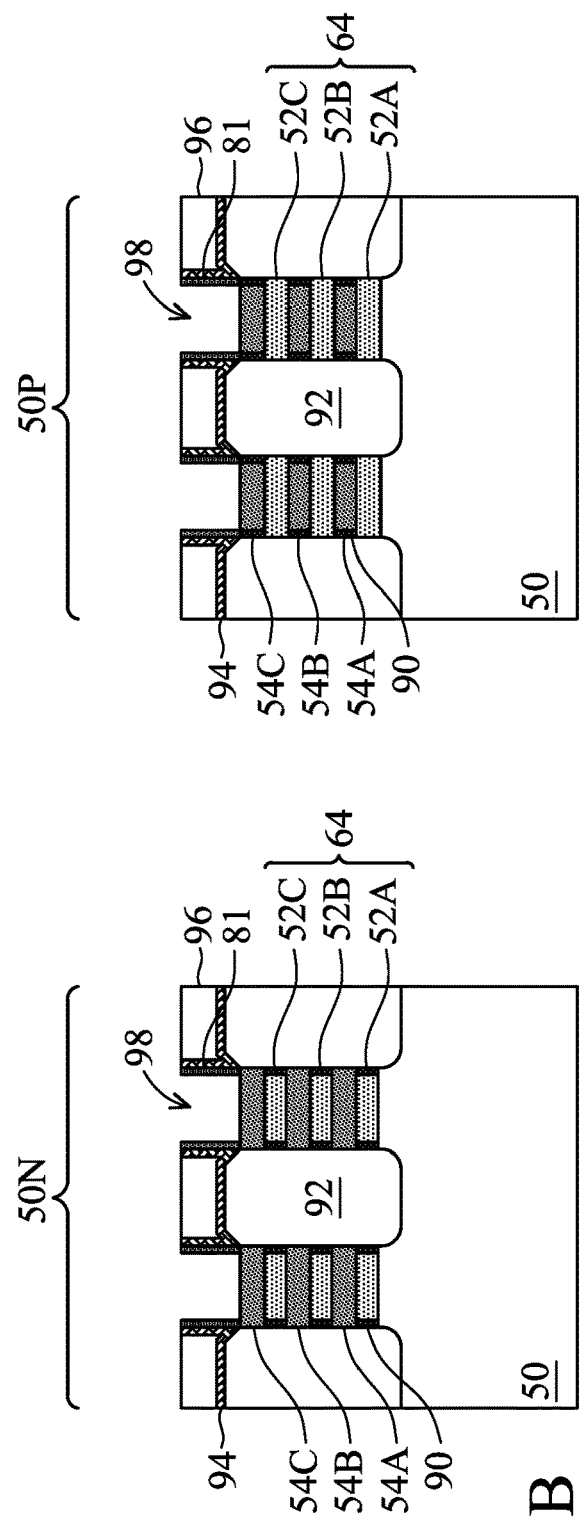

In FIGS. 15A and 15B, the dummy gates 76, and the masks 78 if present, are removed in one or more etching steps, so that second recesses 98 are formed. Portions of the dummy gate dielectrics 60 in the second recesses 98 are also be removed. In some embodiments, the dummy gates 72 and the dummy gate dielectrics 71 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of the multi-layer stack 64, which act as channel regions in subsequently completed nano-FETs. Portions of the multi-layer stack 64 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72 using, for example, dilute HF.

Figure 16A:
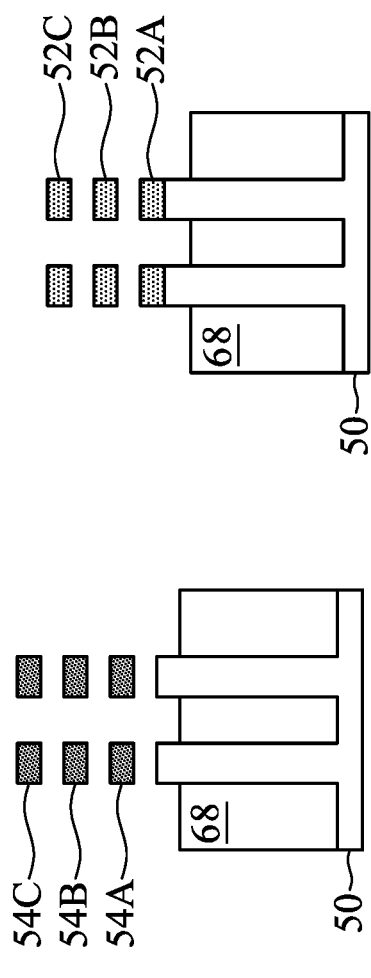
Figure 16B:
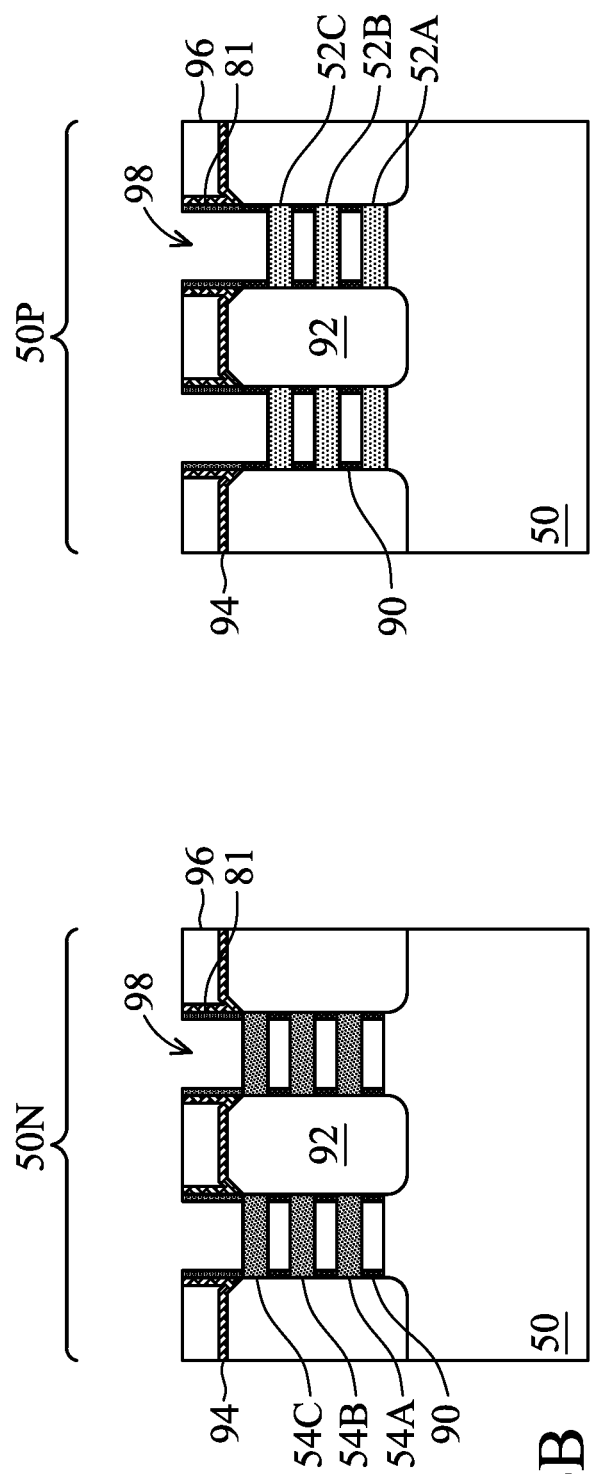

In FIGS. 16A and 16B, the first semiconductor layers 52 in the n-type region 50N and the second semiconductor layers 54 in the p-type region 50P are removed extending the second recesses 98. The first semiconductor layers 52 may be removed by forming a mask (not shown) over the p-type region 50P and performing an isotropic etching process such as wet etching or the like using etchants which are selective to the materials of the first semiconductor layers 52, while the second semiconductor layers 54, the substrate 50, the STI regions 68 remain relatively unetched as compared to the first semiconductor layers 52. In embodiments in which the first semiconductor layers 52 include, e.g., SiGe, and the second semiconductor layers 54A-54C include, e.g., Si or SiC, tetramethylammonium hydroxide (TMAH), ammonium hydroxide ($NH_4OH$), or the like may be used to remove the first semiconductor layers 52 in the n-type region 50N.

The second semiconductor layers 54 in the p-type region 50P may be removed by forming a mask (not shown) over the n-type region 50N and performing an isotropic etching process such as wet etching or the like using etchants which are selective to the materials of the second semiconductor layers 54, while the first semiconductor layers 52, the substrate 50, the STI regions 68 remain relatively unetched as compared to the second semiconductor layers 54. In embodiments in which the second semiconductor layers 54 include, e.g., silicon, silicon carbon, or the like, and the first semiconductor layers 52 include, e.g., silicon or the like, dilute HF or the like may be used to remove the second semiconductor layers 54 in the p-type region 50P.

In FIGS. 17A and 17B, gate dielectric layers 100 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second semiconductor layers 54, and in the p-type region 50P, the gate dielectric layers 100 may be formed on top surfaces and sidewalls of the substrate 50 and on top surfaces, sidewalls, and bottom surfaces of the first semiconductor layers 52. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer 100A (see below, FIG. 18A) and a metal oxide or silicate layer 100B (see below, FIG. 18A) over the silicon oxide layer. In some embodiments, the gate dielectric layers 100 include a high-k dielectric material, and in these embodiments, the gate dielectric layers 100 may have a k value greater than about 7.0, and may include a metal oxide or silicate layer 100B comprising of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The formation of the gate dielectric layers 100 in the n-type region 50N and the p-type region 50P may occur simultaneously such that the gate dielectric layers 100 in each region are formed from the same materials. In some embodiments, the gate dielectric layers 100 in each region may be formed by distinct processes, such that the gate dielectric layers 100 may be different materials and/or have a different number of layers. Various masking steps may be used to mask and expose appropriate regions when using distinct processes.

FIGS. 18A through 27D illustrate the formation of gate electrodes 102 over the gate dielectric layers 100. FIGS. 18A, 19A, 20A, 21A, 22A, 23A, 24A, 25A, 26A, and 27C illustrate detailed views of intermediate stages of processing of regions 202 and 204 of FIG. 17A, and FIGS. 18B, 19B, 20B, 21B, 22B, 23B, 24B, 25B, 26B, and 27D illustrate detailed views of intermediate stages of processing of regions 206 and 208 of FIG. 17B.

The formation of the gate electrodes 102 may occur simultaneously such that the gate electrodes 102 in each region are formed from the same materials. In some embodiments, the gate electrodes 102 in each region may be formed by distinct processes, such that the gate electrodes 102 may be different materials and/or have a different number of layers. Various masking steps may be used to mask and expose appropriate regions when using distinct processes.

As illustrated in FIGS. 18A and 18B, a first gate electrode layer 102A, such as a liner layer or work function tuning layer, is formed over the gate dielectric layers 100 and surrounds the first semiconductor layers 52 and/or the second semiconductor layers 54. The first gate electrode layer 102A may be over the gate dielectric layers 100 on top surfaces, sidewalls, and bottom surfaces of the second semiconductor layers 54 and/or on top surfaces, sidewalls, and bottom surfaces of the first semiconductor layers 52. In some embodiments, any number of other layers, e.g. liner layers or work function tuning layers, are formed over the gate dielectric layers 100 prior to forming the first gate electrode layer 102A. The work function of the gate electrode may be adjusted to the band-edge of silicon, SiGe, or other underlying semiconductor material. For an NMOS device, the work function may be adjusted to close to the conduction band of silicon or SiGe, and for a PMOS device, the work function may be adjusted to close to the valence band of silicon or SiGe, to increase the performance of the transistors.

In some embodiments, the first gate electrode layer 102A comprises TiN, GaN, La, the like, and/or a combination thereof. The first gate electrode layer 102A may be formed through deposition, such as a conformal deposition method such as ALD, CVD, PVD, or the like. The thickness of the first gate electrode layer 102A may be in a range of about 100 nm to about 500 nm.

In FIGS. 19A and 19B, a sacrificial film 200 is formed over the first gate electrode layer 102A. The sacrificial film 200 may be formed by a suitable deposition process such as, e.g., ALD. The sacrificial film 200 may be used to fill the gaps between the semiconductor layers 52 and/or 54 in order to inhibit a subsequently formed photoresist (see below, FIG. 21A) from filling the gaps, as the photoresist may be more difficult to remove from the gaps between the semiconductor layers 52 and/or 54. The sacrificial film 200 also fills the recesses 98. In some embodiments, the sacrificial film 200 comprises a metal oxide such as $Al_2O_3$, $ZrO2$, the like, or a combination thereof. In some embodiments, trimethylaluminium (TMA) is used as a precursor for the formation of the sacrificial film 200.

In some embodiments, the sacrificial film 200 is formed at a low temperature, such as in a range of about 30° C. to about 350° C. The sacrificial film 200 may be formed to a thickness in a range from about 2 nm to about 15 nm, which may be advantageous for filling of the gaps between the semiconductor layers 52 and/or 54. A thickness of the sacrificial film 200 of less than about 2 nm may not be sufficient to fill the gaps between the semiconductor layers 52 and/or 54 and may allow other materials such as photoresist to infiltrate the gaps in subsequent processes. A thickness of the sacrificial film 200 of greater than about 15 nm may interfere with subsequent processes, such as e.g. the formation of a photoresist (see below, FIG. 21A). In some embodiments, the sacrificial film 200 is formed without any seams or voids present between the semiconductor layers 52 and/or 54.

FIGS. 20A, 20B, and 20C illustrate the formation of spaces, such as air gaps and/or voids, in the sacrificial film 200 between the semiconductor layers 52 and/or 54. The interior space formation may be useful in facilitating a subsequent removal process of the sacrificial film 200 (see below, FIGS. 23A-B and 25A-B) by, e.g., increasing the etch chemical contact area. In some embodiments, the spaces do not open through the outer surface of the sacrificial film 200, which allow the sacrificial film 200 to retain its gap-filling properties and inhibit subsequently formed materials such as photoresist (see below, FIG. 21A) from entering gaps between the semiconductor layers 52 and 54.

FIGS. 20A and 20B show the formation of air gaps 350 in the sacrificial film 200 between the semiconductor layers 52 and 54 by the application of a thermal treatment 300, in accordance with some embodiments. The thermal treatment 300 may be performed using an annealing tool with a temperature in a range of about 180° C. to about 900° C., such as about 200° C. to about 800° C., or about 400° C. to about 800° C., which may be advantageous by causing the volume of the sacrificial film 200 to shrink in a range of about 5% to about 50%, resulting in the formation of the air gaps 350 in the sacrificial film 200 between the semiconductor layers 52 and 54. Performing the thermal treatment 300 at a temperature of less than about 180° C. may not cause sufficient shrinkage of the sacrificial film 200 to produce air gaps 350. Performing the thermal treatment 300 at a temperature of greater than about 900° C. may produce air gaps that break through the outer surface of the sacrificial film 200, which may allow subsequently formed materials such as photoresist (see below, FIG. 21A) to enter gaps between the semiconductor layers 52 and 54. The air gaps 350 may have lengths measured in a horizontal direction in a range of about 1 nm to about 7 nm and thicknesses measured in a vertical direction in a range of about 0.1 nm to about 1 nm.

In some embodiments, a controlled precursor purge 400 is performed to form voids 450 in the sacrificial film 200 between the semiconductor layers 52 and 54, as illustrated in FIG. 20C. The voids 450 may have volumes in a range of about 10 nm³ to about 100 nm³. In some embodiments, 0 to 10 voids are formed between each pair of the semiconductor layers 52 and 54. The controlled purge 400 may result in self-formation of the voids 450 because a reduced $H_2O$ purge flow may cause early merging of the sacrificial film 200 at the entrances of the lateral gaps between the semiconductor layers 52 and/or 54. This early merging may cause the volume of the sacrificial film 200 to shrink in a range of less than about 15%.

The controlled purge 400 comprises an $H_2O$ purge, an $N_2$ purge, a He purge, an Ar purge, the like, or a combination thereof. In some embodiments, the controlled purge comprises an $H_2O$ purge that is performed with a flow rate of about 100 sccm to about 1000 sccm and for a duration in a range of about 0.1 seconds to about 100 seconds, which may be advantageous by causing shrinkage of the sacrificial film 200 to form voids 450. Performing the $H_2O$ purge with a flow rate of less than about 80 sccm may not produce enough shrinkage in the sacrificial film 200 to form voids 450. Performing the $H_2O$ purge with a flow rate of greater than about 2000 sccm may cause the voids 450 break through the outer surface of the sacrificial film 200, which may allow subsequently formed materials such as photoresist (see below, FIG. 21A) to enter gaps between the semiconductor layers 52 and 54.

In some embodiments, the controlled purge 400 comprises an $N_2$ purge that is performed with a flow rate of about 100 sccm to about 1000 sccm for a duration in a range of about 0.1 seconds to about 100 seconds, which may be advantageous by causing shrinkage of the sacrificial film 200 to form voids 450. Performing the $N_2$ purge with a flow rate of less than about 80 sccm may not produce enough shrinkage in the sacrificial film 200 to form voids 450. Performing the $N_2$ purge with a flow rate of greater than about 2000 sccm may cause the voids 450 break through the outer surface of the sacrificial film 200, which may allow subsequently formed materials such as photoresist (see below, FIG. 21A) to enter gaps between the semiconductor layers 52 and 54.

In some embodiments, the thermal treatment 300 is performed to form air gaps 350 in the sacrificial film 200 and the controlled purge 400 is not performed. In some embodiments, the controlled purge 400 is performed to form voids 450 in the sacrificial film 200 and the thermal treatment 300 is not performed. In some embodiments, the thermal treatment 300 and the controlled purge 400 are both performed, which may result in the formation of spaces including both air gaps 350 and voids 450 in the sacrificial film 200. Any suitable number and/or order of performances of the thermal treatment 300 and/or the controlled purge 400 is within the scope of the embodiments disclosed herein. In some embodiments, multiple cycles of the deposition of the sacrificial film 200 (see above, FIGS. 19A and 19B) and a following thermal treatment 300 and/or controlled purge 400 are performed.

Figure 21A:
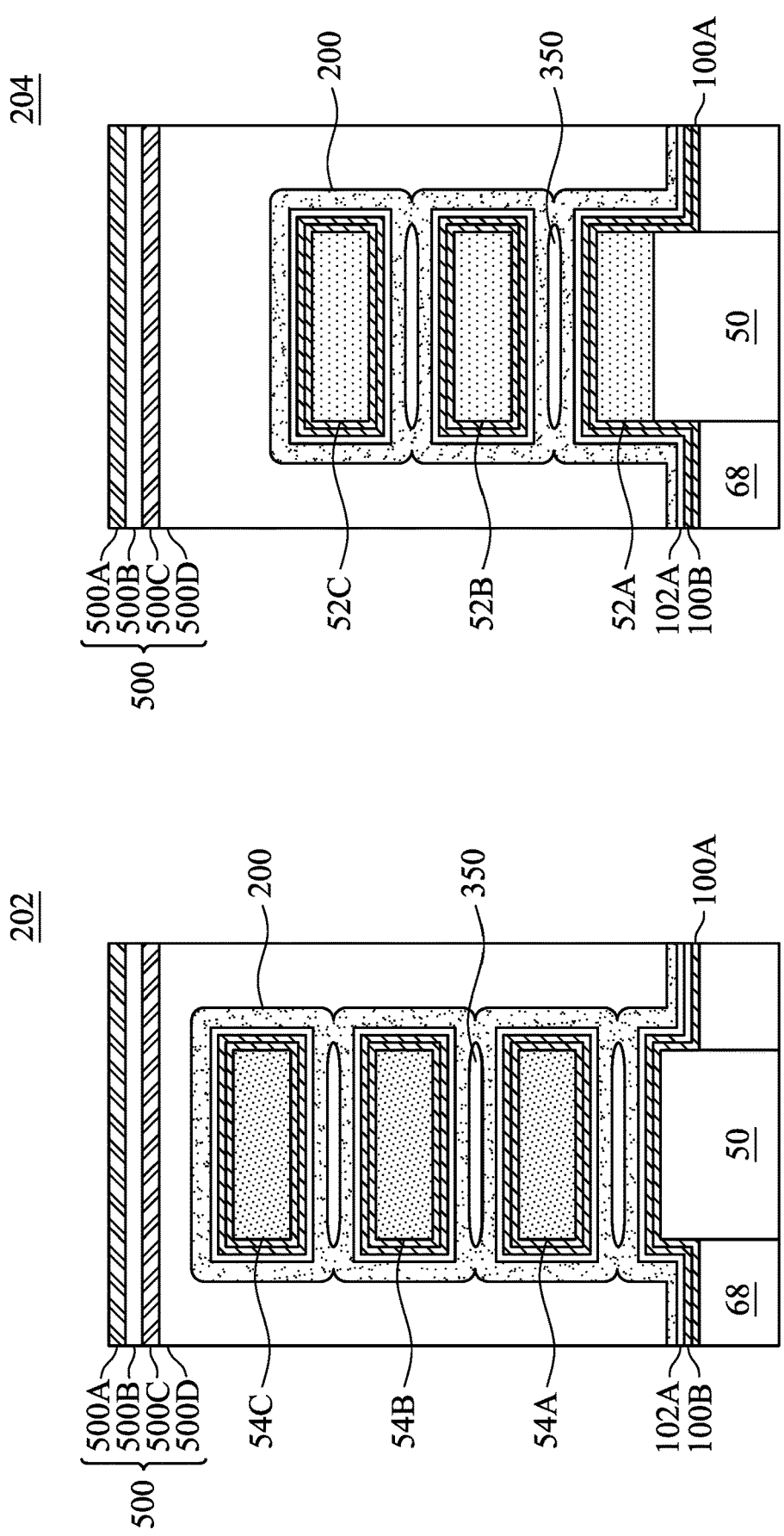

FIGS. 21A and 21B follow from FIGS. 20A, 20B, and 20C and illustrate the formation of a photoresist 500 over the first semiconductor layers 52 in the p-type region 50P and over the second semiconductor layers 54 in the n-type region 50N. Although FIG. 21A illustrates air gaps 350 in accordance with the embodiments illustrated by FIG. 20A, it should be understood that embodiments with voids 450 present instead of or in addition to the air gaps 350 are within the scope of the disclosed embodiments in accordance with FIGS. 21A and 21B. The photoresist 500 is formed to mask the semiconductor layers 52 while a subsequent process, such as e.g. the etching of the first gate electrode layer 102A (see below, FIG. 24A) is performed on the semiconductor layers 54.

FIG. 21A illustrates a tetra-layer mask layer or photoresist 500 that is formed over the sacrificial film 200 and the semiconductor layers 52 and 54. However, it should be understood that the mask layer 500, or photoresist 500, may comprise any suitable number of layers and materials. In some embodiments, a tri-layer photoresist 500 may be formed. In some embodiments, the tetra-layer photoresist 500 includes a plurality of masking layers which may be blanket deposited sequentially using, for example, spin-on processes. In other embodiments, one or more of the plurality of masking layers may be deposited using a process such as CVD, ALD, or the like. As illustrated in FIG. 21A, the tetra-layer photoresist 500 includes a first photoresist layer 500A, a first middle layer 500B, a second middle layer 500C, and a bottom layer 500D. However, any suitable processes and any suitable combination of processes may be used to deposit the layers of the tetra-layer photoresist 500. Any suitable thickness may be used for the tetra-layer photoresist 500.

As further illustrated in FIG. 21A, the tetra-layer photoresist 500 includes the bottom layer 500D that is formed over the sacrificial film 200. Because the sacrificial film 200 fills the gaps between the semiconductor layers 52 and 54, the bottom layer 500D may not be formed between the semiconductor layers 52 and 54, which may be useful for efficiency by increasing the etching process window during a subsequent removal of the bottom layer 500D (see below, FIGS. 22A and 25A). The bottom layer 500D may be formed of a polymer in some embodiments. The bottom layer 500D may be a bottom anti-reflective coating (BARC) layer. In some embodiments, the bottom layer 500D is formed from a material comprising, for example, $C_xH_yO_z$, using a spin-on process. However, any suitable materials and any suitable process may be used to form the bottom layer 500D. The bottom layer 500D may be deposited to any suitable thickness.

The tetra-layer photoresist 500 further comprises the second middle layer 500C that is formed over the bottom layer 500D. The second middle layer 500C may be formed from a material such as $Si_xH_yC_zO_w$, silicon, or a metal oxide using one or more deposition processes such as, spin-on, CVD, ALD, or the like. However, any suitable materials and processes may be used to form the second middle layer 500C. In some embodiments, a material composition of the second middle layer 500C may be determined to provide a high etch selectivity with respect to some layers such as the bottom layer 500D and/or the sacrificial film 200 or other layers which may provide etch stop capabilities with respect to patterning the second middle layer 500C. The second middle layer 500C may include more than one layer and may include more than one material. Any suitable thickness of the second middle layer 500C may be used.

The tetra-layer photoresist 500D further comprises the first middle layer 500B that is formed over the second middle layer 500C. The first middle layer 500B may be formed using one or more deposition processes such as, spin-on, CVD, ALD, or the like. However, any suitable process may be used to form the first middle layer 500B. In some embodiments, a material composition of the first middle layer 500B may be determined to provide a high etch selectivity with respect to other layers such as the bottom layer 500D, the second middle layer 500C or other layers (e.g., photo resist materials) which may provide etch stop capabilities with respect to patterning the first middle layer 500B. The first middle layer 500B may comprise an inorganic material, which may be a nitride (such as silicon nitride), an oxynitride (such as silicon oxynitride), an oxide (such as silicon oxide), or the like. However, any suitable material may be used to form the first middle layer 500B. Furthermore, the first middle layer 500B may include more than one layer and may include more than one material. Any suitable thickness of the first middle layer 500B may be used.

The tetra-layer photoresist 500 further includes the first photoresist layer 500A over the first middle layer 500B. The first photoresist layer 500A may be formed of a photoresist (e.g., a photosensitive material), which includes organic materials, and may be a positive photosensitive material or a negative photosensitive material. The first photoresist layer 500A may be formed using one or more deposition processes such as a spin-on process, or the like. However, any suitable process may be used to form the first photoresist layer 500A. Any suitable thickness of the first photoresist layer 500A may be used.

FIGS. 22A and 22B illustrate a patterning of the photoresist 500 (e.g., using a photolithographic masking and etching process). Once deposited, the photoresist layer 500 may be patterned to expose the portion of the sacrificial film 200 over the semiconductor layers 54, e.g. in the n-type region 50N, while continuing to mask the semiconductor layers 52, e.g. in the p-type region 50P. However, any suitable regions may be exposed and/or left masked. Because the sacrificial film 200 fills the gaps between the semiconductor layers 54, the patterning of the photoresist layer 500 may be easier to perform as the photoresist 500 may not have infiltrated the gaps between the semiconductor layers 54. In some embodiments, the photoresist layer 500 may be patterned to expose the portion of the sacrificial film 200 over the semiconductor layers 52, e.g. in the p-type region 50P, while continuing to mask the semiconductor layers 54, e.g. in the n-type region 50N. However, any suitable regions may be exposed and/or left masked.

FIGS. 23A and 23B illustrate a removal of the sacrificial film 200 over the semiconductor layers 54 while the semiconductor layers 52 are masked. The sacrificial film 200 may be removed by any suitable process, such as an etching process. The efficiency of the removal may be improved by the presence of spaces such as air gaps 350 and/or voids 450 between the semiconductor layers 54 by, e.g., increasing the etch chemical contact area. This may increase the etching process window by 50%. With this increase in the etching process window, over-etching that could damage the main device structure such as, e.g., the gate dielectric 100 or the semiconductor layers 54 may be avoided. In some embodiments, the sacrificial film 200 is removed with an etching process comprising dilute HF for a duration in a range of about 10 seconds to about 60 seconds. In some embodiments, the sacrificial film 200 over the semiconductor layers 52 is removed while the semiconductor layers 54 are masked.

FIGS. 24A and 24B illustrate a recession of the portion of the first gate electrode layer 102A over the semiconductor layers 54 while the semiconductor layers 52 are masked. In some embodiments, the thickness of the first gate electrode layer 102A is reduced so that a subsequently formed work function tuning layer over the semiconductor layers 54 may have a different thickness than a subsequently formed work function tuning layer over the semiconductor layers 52, which may be useful e.g. when the semiconductor layers 54 and the semiconductor layers 52 are used for forming n-type nano-FETs and p-type nano-FETs, respectively. However, the disclosed process may be used to establish layers of different thicknesses in different regions for any suitable purpose. The first gate electrode layer 102A may be recessed by a suitable process such as an etch comprising dilute HF, $H_2SO_4$, the like, or a combination thereof. In some embodiments, the portion of the first gate electrode layer 102A over the semiconductor layers 54 is removed. In some embodiments, the portion of the first gate electrode layer 102A over the semiconductor layers 52 is recessed or removed while the semiconductor layers 54 are masked.

Figure 25A:
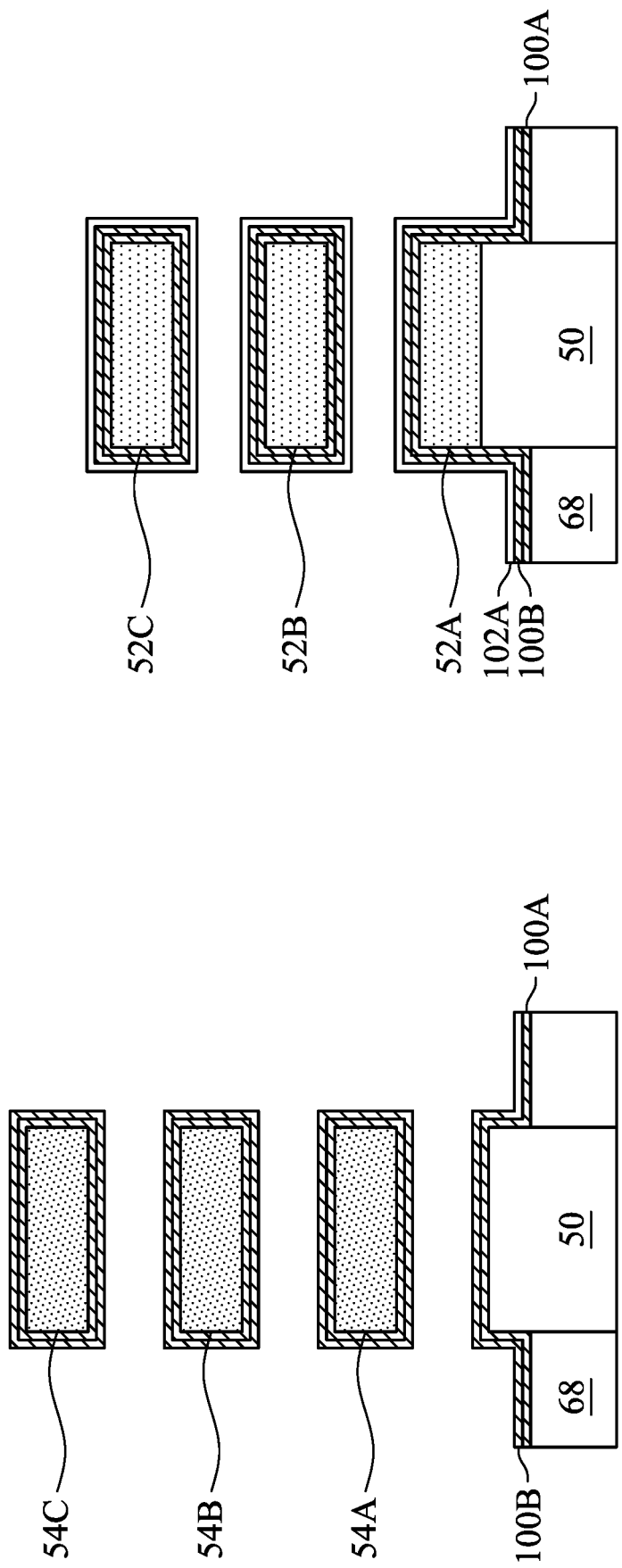

FIGS. 25A and 25B illustrate a removal of the photoresist 500 and the sacrificial film 200 over the semiconductor layers 52. The photoresist 500 and the sacrificial film 200 may be removed so that subsequent layers of the gate electrode 102 may be formed over the semiconductor layers 52 and 54 (see below, FIGS. 26A-27D). The photoresist 500 may be removed by any suitable process, such as e.g. an ashing. The sacrificial film 200 may be removed by a process substantially similar as described above in reference to FIGS. 23A-23B. The efficiency of the removal may be improved by the presence of spaces such as air gaps 350 and/or voids 450 between the semiconductor layers 52 which may, e.g., increase the etch chemical contact area. This may increase the etching process window by 50% and may avoid over-etching that could damage the main device structure such as, e.g., the gate dielectric 100 or the semiconductor layers 52. In some embodiments, remnants of the sacrificial film 200 remain on or diffused in the first gate electrode layer 102A. In some embodiments, the sacrificial film 200 comprises $Al_2O_3$ and remnants of the $Al_2O_3$ remain in the first gate electrode layer 102A with a density in a range of about 2 g/cm$^3$ to about 4 g/cm$^3$.

FIGS. 26A and 26B illustrate the formation of a second gate electrode layer 102B, such as a liner layer or work function tuning layer, over the semiconductor layers 52 and 54. Because of the recession or removal of the portion of the first gate electrode layer 102A over the semiconductor layers 54 (see above, FIGS. 24A and 24B), the work function tuning layers over the semiconductor layers 52 and 54 may have different thicknesses and/or compositions. This may allow the work functions of the gate electrodes over the semiconductor layers 52 and 54 to be tuned with respect to different underlying semiconductor materials, e.g. Si and SiGe, or with respect to being used to form different devices, e.g. NMOS and PMOS devices. For an NMOS device, the work function may be adjusted to close to the conduction band of silicon or SiGe, and for a PMOS device, the work function may be adjusted to close to the valence band of silicon or SiGe, to increase the performance of the transistors.

In some embodiments, the second gate electrode layer 102B comprises TiN, GaN, La, the like, and/or a combination thereof. The second gate electrode layer 102B may be formed through deposition, such as a conformal deposition method such as ALD, CVD, PVD, or the like. The thickness of the first gate electrode layer 102A may be in a range of about 20 nm to about 500 nm. In some embodiments, the process illustrated above in FIGS. 18A through 26B is repeated for multiple cycles, which may enable the formation of gate electrode layers of different thicknesses, e.g. work function tuning layers, over the semiconductor layers 52 and 54.

Figure 27A:
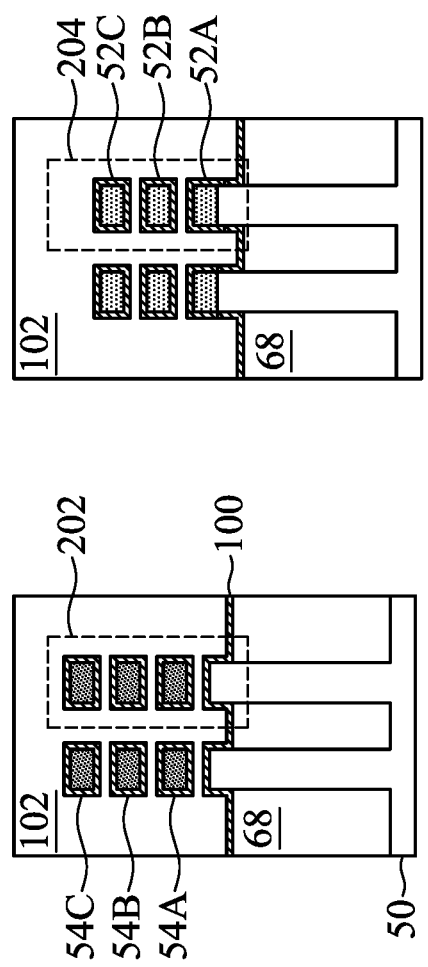
Figure 27B:
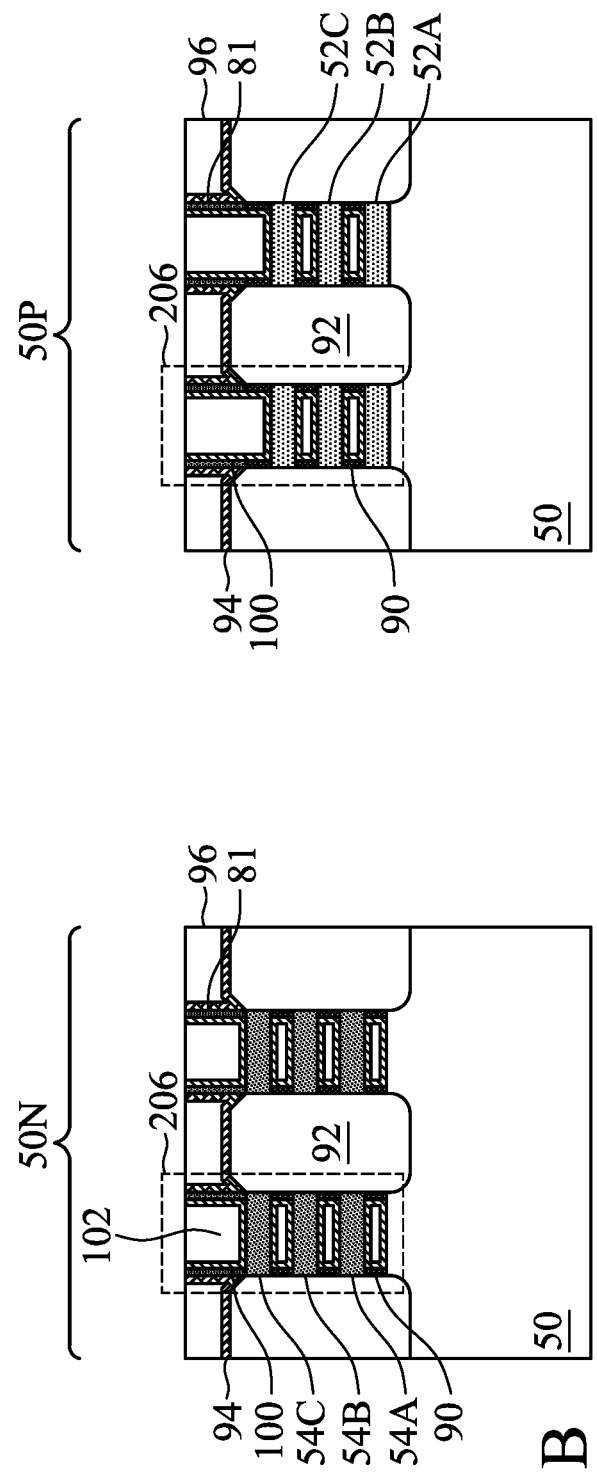

FIGS. 27A, 27B, 27C, and 27D illustrate the formation of a gate electrode fill material 102C, also referred to as a fill material 102C, over the first and/or second gate electrode layers 102A and 102B, forming gate electrodes 102. FIG. 27C illustrates detailed views of regions 202 and 204 of FIG. 27A, and FIG. 27D illustrates detailed views of regions 206 and 208 of FIG. 27B. The gate electrode fill material 102C is deposited over the gate dielectric layers 100 and previously formed gate electrode layers such as 102A and 102B, respectively, filling the remaining portions of the second recesses 98 and forming gate electrodes 102. The gate electrode fill material 102 may comprise a metal-containing material such as titanium nitride, titanium oxide, tantalum nitride, tantalum carbide, cobalt, ruthenium, aluminum, tungsten, the like, combinations thereof, or multi-layers thereof. Any combination of the layers which make up the gate electrodes 102 may be deposited in the n-type region 50N between adjacent ones of the second semiconductor layers 54 and between the second semiconductor layer 54A and the substrate 50, and may be deposited in the p-type region 50P between adjacent ones of the first semiconductor layers 52 and between the first semiconductor layer 52A and the substrate 50. Various layers and/or fill materials of the gate electrode fill material 102 may be formed separately in each region, such as e.g. the n-type regions 50N and p-type regions 50P. Various masking steps, e.g. the steps described above with respect to FIGS. 19A through 24B, may be used to mask and expose the appropriate regions when using distinct processes to form the various layers and/or fill materials of the gate electrode fill material 102 separately in each region.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 28C:
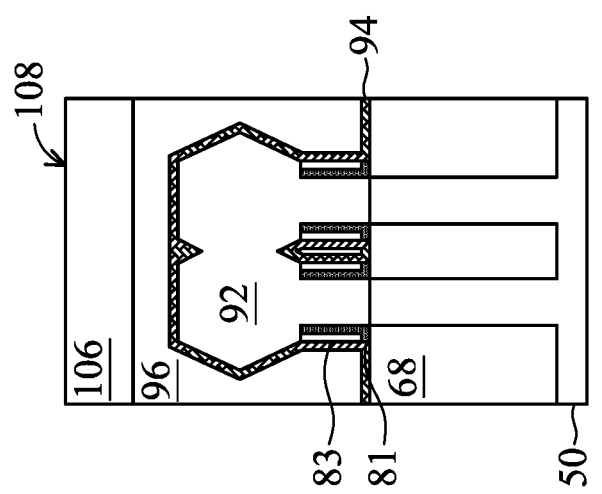

In FIGS. 28A-28C, a second ILD 106 is deposited over the first ILD 96. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like. In accordance with some embodiments, before the formation of the second ILD 106, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the contacts 112, discussed below with respect to FIGS. 30A and 30B) penetrate through the gate mask 104 to contact the top surface of the recessed gate electrodes 102.

Figure 29C:
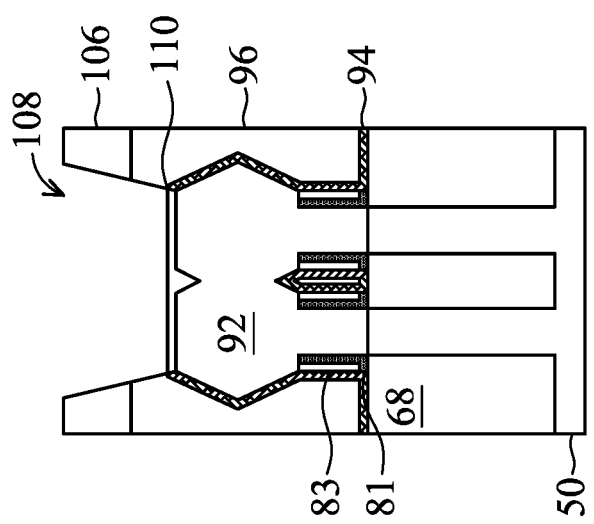

In FIGS. 29A-29C, the second ILD 106, the first ILD 96, the CESL 94, and the gate mask 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process and may then be etched through the CESL 94 using a second etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92, and a bottom of the third recesses 108 may be level with (e.g., at a same level, or having a same distance from the substrate), or lower than (e.g., closer to the substrate) the epitaxial source/drain regions 92.

After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 30C:
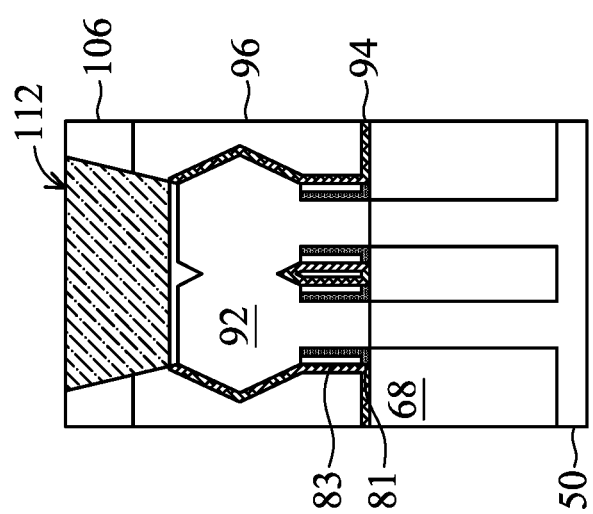

Next, in FIGS. 30A-30C, contacts 112 (may also be referred to as contact plugs) are formed in the third recesses 108. The contacts 112 may comprise one or more layers, such as barrier layers, diffusion layers, and fill materials. For example, in some embodiments, the contacts 112 include a barrier layer and a conductive material, and is electrically coupled to the underlying conductive feature (e.g., gate structure 102 and/or silicide region 110 in the illustrated embodiment). The contacts 112 that are electrically coupled to the gate structure 102 may be referred to as gate contacts, and the contacts 112 that are electrically coupled to the silicide regions 110 may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Embodiments may achieve advantages. For example, embodiments such as those discussed above provide a gap filling technique, such as an atomic layer deposition (ALD) process, for a sacrificial film, and may reduce over-etching that may occur during removal processes for the sacrificial film that may cause unexpected and undesired damage of the main structure of devices. A deposition process, such as an ALD process, provides a gap filling technique by forming a sacrificial film within which are formed interior spaces, such as e.g. air gaps or voids. The etching process window and etching rate for removal of the sacrificial film may be increased by the interior air gaps or voids increasing the etch chemical contact area while retaining the gap filling properties of the sacrificial film. Self-formation of air gaps may be triggered by application of a thermal process, and/or self-formation of interior voids may be triggered by precursor purge control. Embodiments disclosed above may be incorporated into semiconductor process flows with little or no impact to integration flow.

In accordance with an embodiment, a method of manufacturing a semiconductor device includes: forming a multi-layer stack in a channel region, the multi-layer stack including alternating layers of a first plurality of layers and a second plurality of layers, the first plurality of layers including a first semiconductor material, the second plurality of layers including a second semiconductor material; removing the second plurality of layers from the multi-layer stack, the remaining first plurality of layers including a first semiconductor layer of the first semiconductor material and a second semiconductor layer of the first semiconductor material; forming a sacrificial film over the first semiconductor layer and the second semiconductor layer, the sacrificial film filling an area between the first semiconductor layer and the second semiconductor layer; forming a space in the sacrificial film between the first semiconductor layer and the second semiconductor layer; removing the sacrificial film; and forming a gate stack over the channel region. In an embodiment, forming the space includes forming an air gap with a thermal treatment. In an embodiment, the thermal treatment is performed at a temperature in a range of 400° C. to 800° C. In an embodiment, forming the space includes forming a plurality of voids by performing an $H_2O$ purge of precursors of the sacrificial film. In an embodiment, the sacrificial film includes $Al_2O_3$. In an embodiment, the sacrificial film is formed by an atomic layer deposition (ALD) process performed at a temperature less than about 350° C. In an embodiment, the method further includes forming a work function tuning layer over the first semiconductor layer and the second semiconductor layer after removing the sacrificial film. In an embodiment, the channel region is part of a gate-all-around transistor.

In accordance with another embodiment, a method of manufacturing a semiconductor device includes: forming a first multi-layer stack in a first area over a substrate and a second multi-layer stack in a second area over the substrate, the first multi-layer stack including respective layers of second semiconductor layers, the second multi-layer stack including respective layers of first semiconductor layers; forming and removing a sacrificial film; and forming respective gate electrodes over the first multi-layer stack and the second multi-layer stack. The forming and removing the sacrificial film includes: depositing the sacrificial film over the first multi-layer stack and the second multi-layer stack, wherein the sacrificial film fills first gaps between respective second semiconductor layers of the first multi-layer stack and fills second gaps between respective second semiconductor layers of the first multi-layer stack; forming a first plurality of spaces in the sacrificial film between respective second semiconductor layers of the first multi-layer stack and forming a second plurality of spaces between respective first semiconductor layers of the second multi-layer stack; forming a mask layer over the sacrificial film; patterning and removing the mask layer in the first area; removing the sacrificial film over the first multi-layer stack; removing the mask layer in the second area; and removing the sacrificial film over the second multi-layer stack. In an embodiment, each space of the first plurality of spaces and the second plurality of spaces includes a respective air gap. In an embodiment, each space of the first plurality of spaces and the second plurality of spaces includes a respective plurality of voids. In an embodiment, forming the respective gate electrodes further includes: forming a first layer over respective second semiconductor layers of the first multi-layer stack and respective first semiconductor layers of the second multi-layer stack; removing the portion of the first layer over respective second semiconductor layers of the first multi-layer stack; and forming a second layer over respective second semiconductor layers of the first multi-layer stack and respective first semiconductor layers of the second multi-layer stack. In an embodiment, the forming the first layer is performed before the depositing the sacrificial film, the removing the portion of the first layer over the first multi-layer stack is performed after the removing the sacrificial film over the first multi-layer stack, and the forming the second layer is performed after the removing the sacrificial film over the second multi-layer stack. In an embodiment, the first layer includes a first work function tuning layer and the second layer includes a second work function tuning layer. In an embodiment, the method further includes performing multiple cycles of the forming and removing the sacrificial film. In an embodiment, the method further includes forming a first work function tuning layer over respective second semiconductor layers of the first multi-layer stack to a first thickness and forming a second work function tuning layer over respective first semiconductor layers of the second multi-layer stack to a second thickness, the second thickness being greater than the first thickness. In an embodiment, the depositing the sacrificial film includes an atomic layer deposition process. In an embodiment, the sacrificial film consists essentially of $Al_2O_3$.

In accordance with yet another embodiment, a method of manufacturing a semiconductor device includes forming a stack of semiconductor layers in a channel region; forming a gate dielectric around respective semiconductor layers of the stack of semiconductor layers; depositing a sacrificial layer over the stack of semiconductor layers, the sacrificial layer including $Al_2O_3$; forming air gaps in the sacrificial layer between the respective semiconductor layers of the stack of semiconductor layers; removing the sacrificial layer; and forming a work function tuning layer around the gate dielectric, the work function tuning layer including La or TiN, the work function tuning layer having remnants of $Al_2O_3$ from the sacrificial layer. In an embodiment, the $Al_2O_3$ in the work function tuning layer has a density in a range of 2 $g/cm^3$ to 4 $g/cm^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a multi-layer stack in a channel region, the multi-layer stack comprising alternating layers of a first plurality of layers and a second plurality of layers, the first plurality of layers comprising a first semiconductor material, the second plurality of layers comprising a second semiconductor material;
   removing the second plurality of layers from the multi-layer stack, the remaining first plurality of layers comprising a first semiconductor layer of the first semiconductor material and a second semiconductor layer of the first semiconductor material;
   forming a sacrificial film over the first semiconductor layer and the second semiconductor layer, the sacrificial film filling an area between the first semiconductor layer and the second semiconductor layer;
   forming a space in the sacrificial film between the first semiconductor layer and the second semiconductor layer;
   removing the sacrificial film; and
   forming a gate stack over the channel region.

2. The method of claim 1, wherein forming the space comprises forming an air gap with a thermal treatment.

3. The method of claim 2, wherein the thermal treatment is performed at a temperature in a range of 400° C. to 800° C.

4. The method of claim 1, wherein forming the space comprises forming a plurality of voids by performing an $H_2O$ purge of precursors of the sacrificial film.

5. The method of claim 1, wherein the sacrificial film comprises $Al_2O_3$.

6. The method of claim 1, wherein the sacrificial film is formed by an atomic layer deposition (ALD) process performed at a temperature less than about 350° C.

7. The method of claim 1 further comprising forming a work function tuning layer over the first semiconductor layer and the second semiconductor layer after removing the sacrificial film.

8. The method of claim 1, wherein the channel region is part of a gate-all-around transistor.

9. A method of manufacturing a semiconductor device, the method comprising:
   forming a first multi-layer stack in a first area over a substrate and a second multi-layer stack in a second area over the substrate, the first multi-layer stack comprising respective layers of second semiconductor layers, the second multi-layer stack comprising respective layers of first semiconductor layers;
   forming and removing a sacrificial film, wherein the forming and removing the sacrificial film comprises:
      depositing the sacrificial film over the first multi-layer stack and the second multi-layer stack, wherein the sacrificial film fills first gaps between respective second semiconductor layers of the first multi-layer stack and fills second gaps between respective second semiconductor layers of the first multi-layer stack;
      forming a first plurality of spaces in the sacrificial film between respective second semiconductor layers of the first multi-layer stack and forming a second plurality of spaces between respective first semiconductor layers of the second multi-layer stack;
      forming a mask layer over the sacrificial film;
      patterning and removing the mask layer in the first area;
      removing the sacrificial film over the first multi-layer stack;
      removing the mask layer in the second area; and
      removing the sacrificial film over the second multi-layer stack; and
   forming respective gate electrodes over the first multi-layer stack and the second multi-layer stack.

10. The method of claim 9, wherein each space of the first plurality of spaces and the second plurality of spaces comprises a respective air gap.

11. The method of claim 9, wherein each space of the first plurality of spaces and the second plurality of spaces comprises a respective plurality of voids.

12. The method of claim 9, wherein forming the respective gate electrodes further comprises:

forming a first layer over respective second semiconductor layers of the first multi-layer stack and respective first semiconductor layers of the second multi-layer stack;

removing the portion of the first layer over respective second semiconductor layers of the first multi-layer stack; and forming a second layer over respective second semiconductor layers of the first multi-layer stack and respective first semiconductor layers of the second multi-layer stack.

13. The method of claim 12, wherein the forming the first layer is performed before the depositing the sacrificial film, the removing the portion of the first layer over the first multi-layer stack is performed after the removing the sacrificial film over the first multi-layer stack, and the forming the second layer is performed after the removing the sacrificial film over the second multi-layer stack.

14. The method of claim 12, wherein the first layer comprises a first work function tuning layer and the second layer comprises a second work function tuning layer.

15. The method of claim 9 further comprising performing multiple cycles of the forming and removing the sacrificial film.

16. The method of claim 15 further comprising forming a first work function tuning layer over respective second semiconductor layers of the first multi-layer stack to a first thickness and forming a second work function tuning layer over respective first semiconductor layers of the second multi-layer stack to a second thickness, the second thickness being greater than the first thickness.

17. The method of claim 9, wherein the depositing the sacrificial film comprises an atomic layer deposition process.

18. The method of claim 9, wherein the sacrificial film consists essentially of $Al_2O_3$.

19. A method of manufacturing a semiconductor device, the method comprising:

forming a stack of semiconductor layers in a channel region;

forming a gate dielectric around respective semiconductor layers of the stack of semiconductor layers;

depositing a sacrificial layer over the stack of semiconductor layers, the sacrificial layer comprising $Al_2O_3$;

forming air gaps in the sacrificial layer between the respective semiconductor layers of the stack of semiconductor layers;

removing the sacrificial layer; and forming a work function tuning layer around the gate dielectric, the work function tuning layer comprising La or TiN, the work function tuning layer having remnants of $Al_2O_3$ from the sacrificial layer.

20. The method of claim 19, wherein the $Al_2O_3$ in the work function tuning layer has a density in a range of 2 $g/cm^3$ to 4 $g/cm^3$.

* * * * *

UNITED STATES PATENT AND TRADEMARK OFFICE
CERTIFICATE OF CORRECTION

PATENT NO. : 11,145,746 B2
APPLICATION NO. : 16/906546
DATED : October 12, 2021
INVENTOR(S) : Wen-Ju Chen et al.

Page 1 of 1

It is certified that error appears in the above-identified patent and that said Letters Patent is hereby corrected as shown below:

On the Title Page

Item (73), Assignee; delete "Taiwan Semiconductor Manufacturing Co.y, Ltd." and insert --Taiwan Semiconductor Manufacturing Co., Ltd.--.

Signed and Sealed this
Sixteenth Day of August, 2022

Katherine Kelly Vidal
*Director of the United States Patent and Trademark Office*